United States Patent
Park et al.

(10) Patent No.: US 6,806,937 B2
(45) Date of Patent: Oct. 19, 2004

(54) THIN FILM TRANSISTOR ARRAY PANEL

(75) Inventors: Woon-Yong Park, Kyungki-do (KR); Jong-Soo Yoon, Choongcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/314,254

(22) Filed: Dec. 9, 2002

(65) Prior Publication Data

US 2003/0133067 A1 Jul. 17, 2003

Related U.S. Application Data

(63) Continuation of application No. 09/910,808, filed on Jul. 24, 2001, now Pat. No. 6,611,309, and a division of application No. 09/474,070, filed on Dec. 29, 1999, now Pat. No. 6,287,899.

(30) Foreign Application Priority Data

Dec. 31, 1998 (KR) ............................................. 98-63759
Feb. 27, 1999 (KR) ............................................. 99-6602
Nov. 11, 1999 (KR) ............................................. 99-50048

(51) Int. Cl.[7] .......................................... G02F 1/1345
(52) U.S. Cl. ..................................................... 349/149
(58) Field of Search ................................. 349/141, 149, 349/152

(56) References Cited

U.S. PATENT DOCUMENTS

| | | | |
|---|---|---|---|
| 5,627,088 A | 5/1997 | Fukaya et al. | |
| 5,686,326 A | 11/1997 | Kitahara et al. | |
| 5,828,433 A | * 10/1998 | Shin | ........................... 349/147 |
| 5,852,285 A | 12/1998 | Kato et al. | |
| 5,930,607 A | 7/1999 | Satou | |
| 6,022,753 A | 2/2000 | Park et al. | |
| 6,025,216 A | 2/2000 | Ha | |
| 6,177,970 B1 | 1/2001 | Kim | |
| 6,208,399 B1 | * 3/2001 | Ohta et al. | ................... 349/139 |
| 6,215,541 B1 | 4/2001 | Song et al. | |
| 6,400,436 B1 | * 6/2002 | Komatsu | ..................... 349/141 |

FOREIGN PATENT DOCUMENTS

WO    Wo 9847044 A1  * 10/1998    ........... G02F/1/136

* cited by examiner

*Primary Examiner*—Kenneth Parker
(74) *Attorney, Agent, or Firm*—McGuireWoods LLP

(57) ABSTRACT

The present invention relates to the formation, on a substrate having a display area and a peripheral area, of a gate wire including a plurality of gate lines and gate electrodes in a display area and gate pads in the peripheral area, and of a common wire, including a common signal line and a plurality of common electrodes in the display area. The substrate is fabricated by using less number of steps of photo masks. A photo mask having multiple thickness is used for a photolithography step with less number of masks.

11 Claims, 65 Drawing Sheets

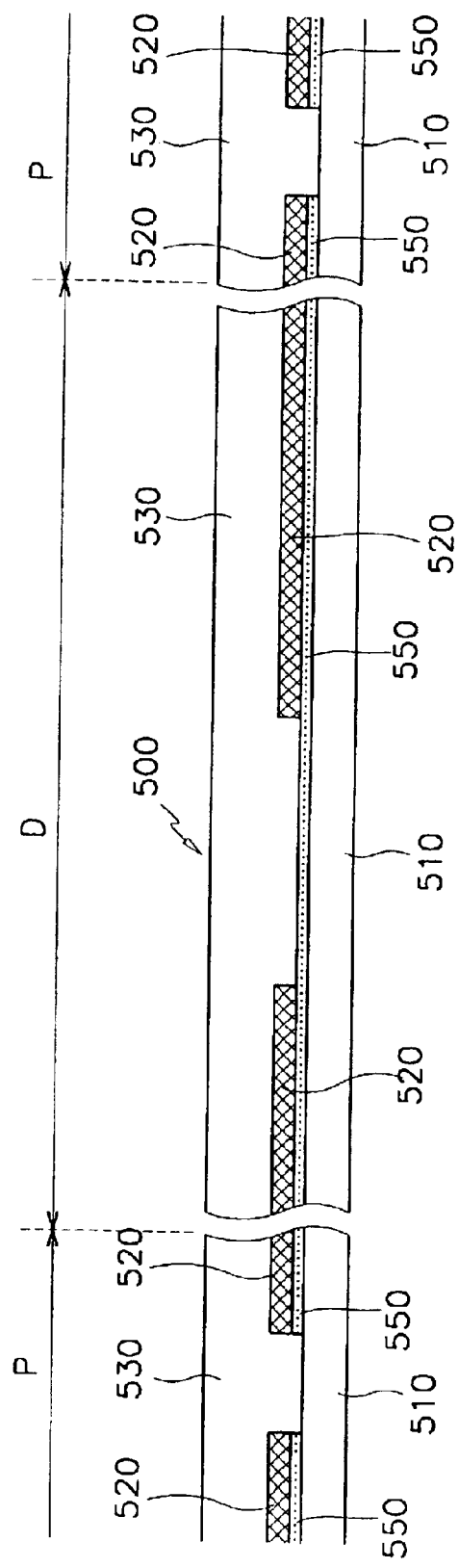

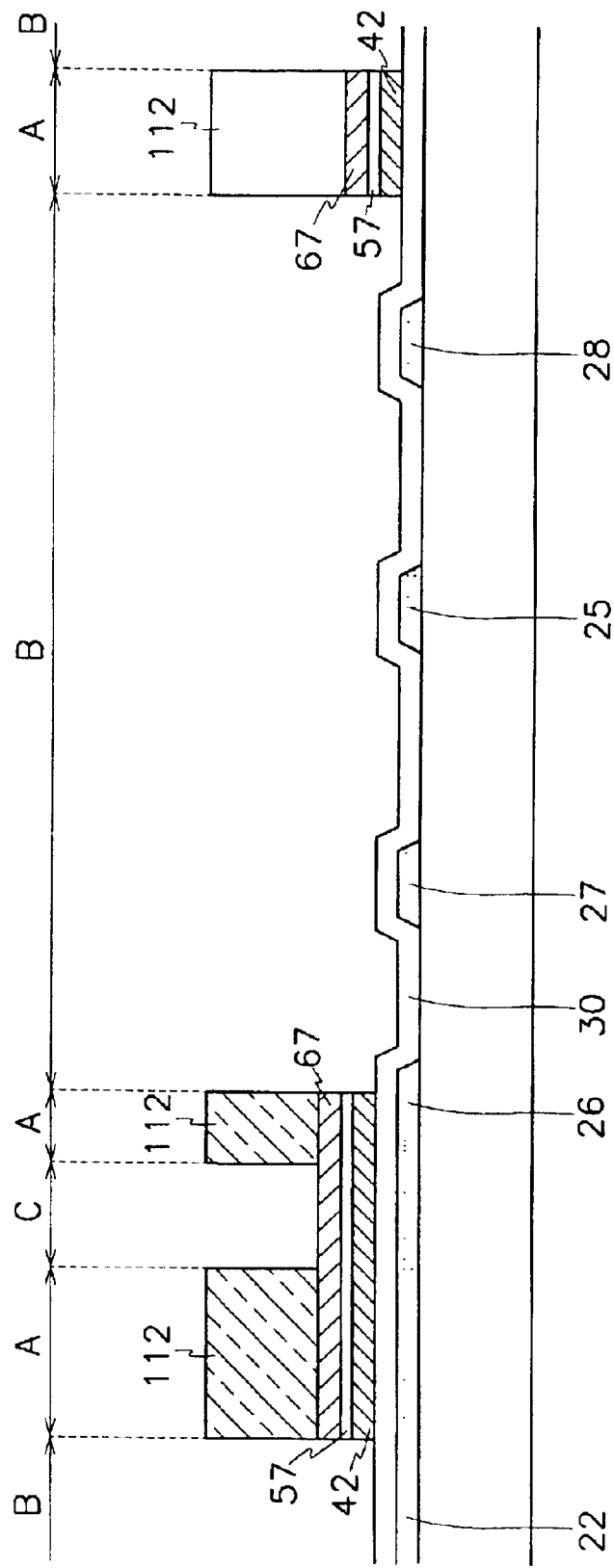

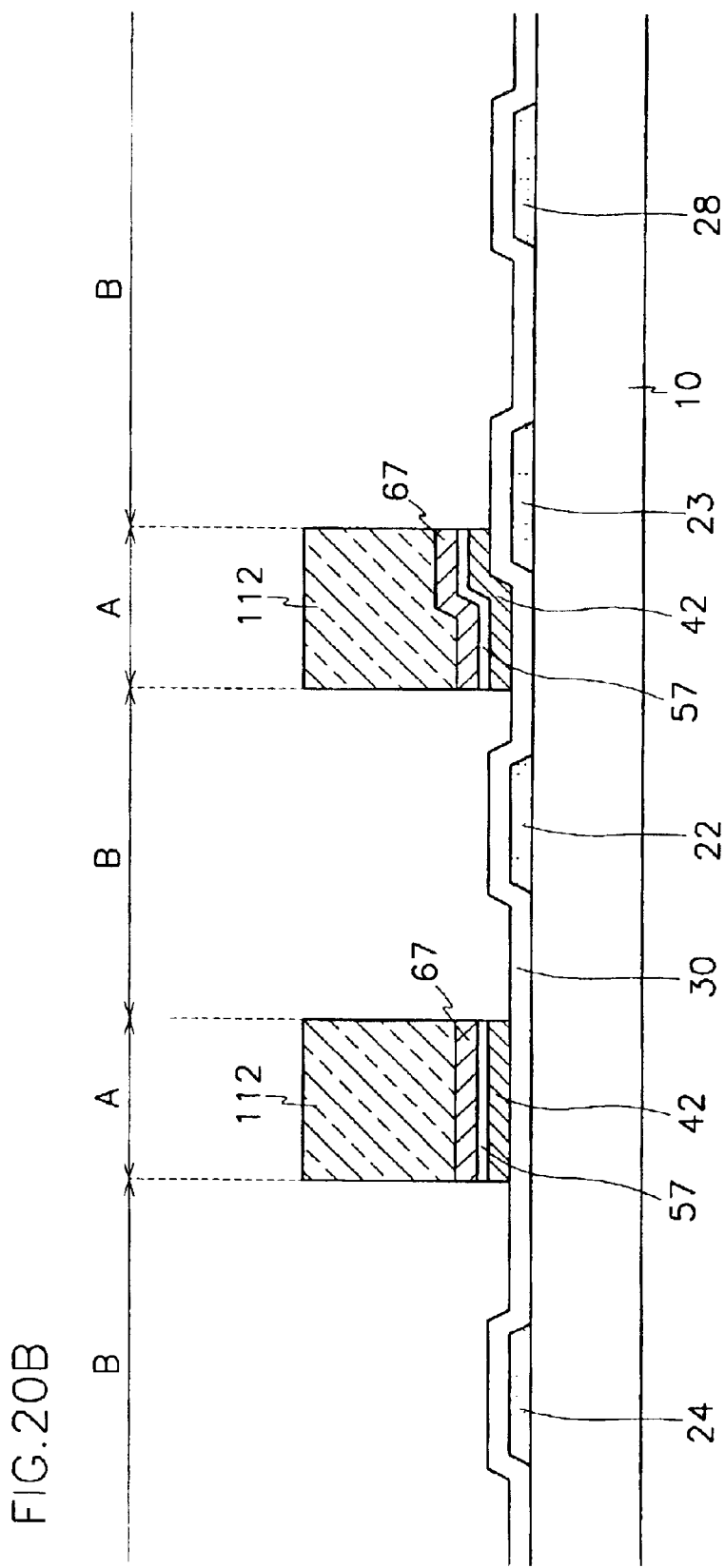

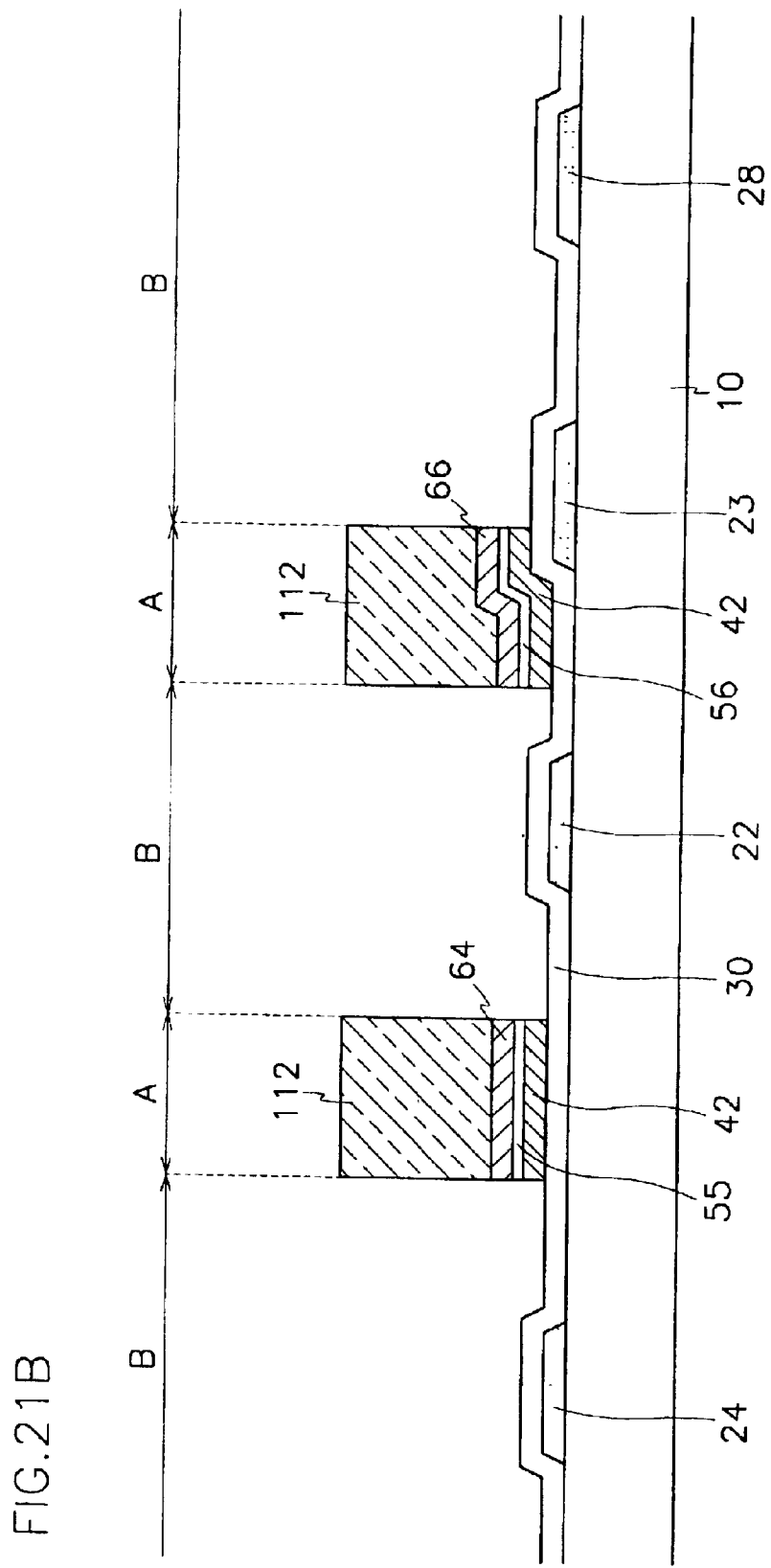

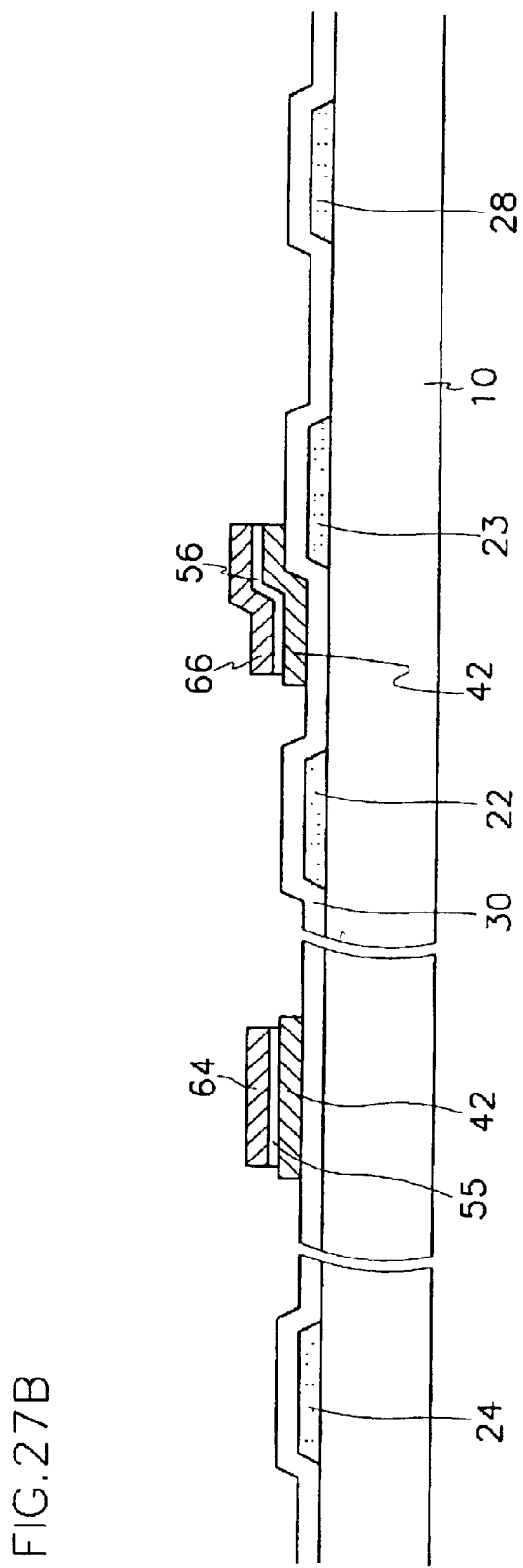

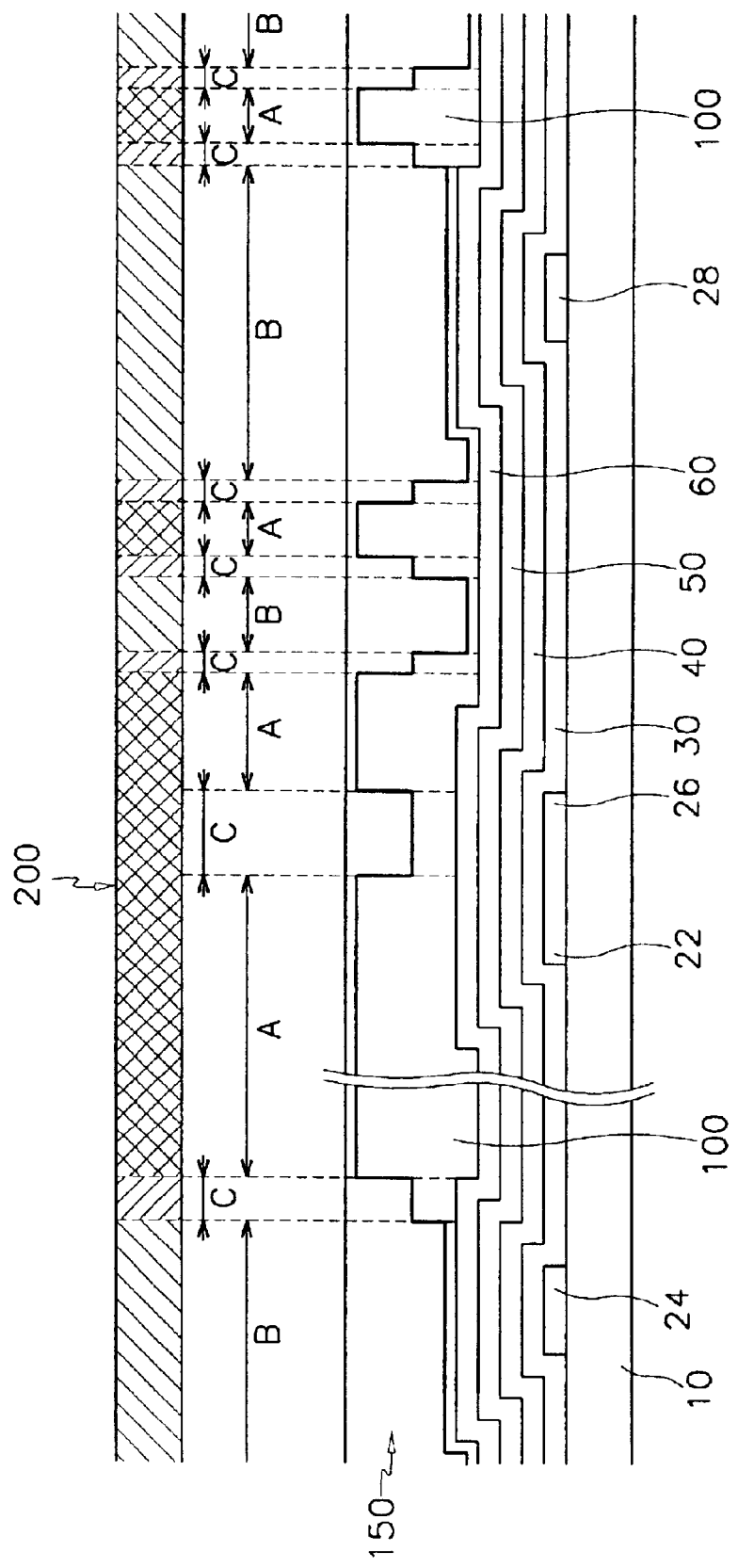

THIN FILM TRANSISTOR ARRAY PANEL

This application is a continuation of U.S. application Ser. No. 09/910,808 filed on Jul. 24, 2001, which will be issued as U.S. Pat. No. 6,611,309, and is a divisional of U.S. application Ser. No. 09/474,070 filed on Dec. 29, 1999, which became U.S. Pat. No. 6,287,899.

BACKGROUND OF THE INVENTION (a) Field of the Invention

The present invention relates to thin film transistor (TFT) panel for a liquid crystal display (LCD) and a method for manufacturing the same.

(b) Description of the Related Art

An LCD is one of the most popular flat panel displays (FPD). The LCD has two panels having two kinds of electrodes for generating electric fields and a liquid crystal layer interposed there between. The transmittance of incident light is controlled by the intensity of the electric field applied to the liquid crystal layer.

The field-generating electrodes may be formed at each of the panels, or at only one of the panels. A panel with at least one kind of electrode has switching elements, such as thin film transistors.

In general, a TFT array panel of an LCD includes a plurality of pixel electrodes and TFTs controlling the signals supplied to the pixel electrodes. The TFT array panel is manufactured by photolithography using a plurality of photomasks, and it undergoes five or six photolithography steps before it is completed. The high costs and lengthy time required for the photolithography process makes it desirable to reduce the number of the photolithography steps.

Several manufacturing methods of LCDs using only four photolithography steps have been suggested, such as that in Korean Patent Application No. 1995-189 ('189). However, as an LCD actually requires wires for transmitting electric signals to the TFTs and wire pads for receiving external signals, the full process to complete a TFT array panel requires the step of forming such pads. Unfortunately, '189 does not disclose how to form such pads.

Another conventional method of manufacturing a TFT array panel using only four photolithography steps is disclosed in "A TFT Manufactured by 4 Masks Process with New Photolithography (Chang-wook Han et al., Proceedings of The 18th International Display Research Conference Asia Display 98, pp. 1109–1112, 1998. 9.28–10.1).

Furthermore, a storage capacitor for sustaining the voltage applied to a pixel is generally provided in the TFT array panel, and the storage capacitor includes a storage electrode and a portion of a pixel electrode as well as a passivation layer interposed there between. The storage electrode is made of the same layer as a gate wire, and a portion of the pixel electrode is formed on the passivation layer. The storage electrode is covered with a gate insulating layer, a semiconductor layer, and a passivation layer, with most of the pixel electrode being formed directly on the substrate in Han et al. Therefore, the pixel electrode should be stepped up over the triple layers of the gate insulating layer, the semiconductor layer, and the passivation layer in order to overlap the storage electrode. This may result in a disconnection of the pixel electrode in the vicinity of a high step-up area.

As shown in '189, conventional photolithography processes uses a photoresist (PR) layer. The conventional photoresist layer is exposed to light through a photomask and thereby divided into two sections, that is, the part exposed to the light and the other part that is not so exposed. The development of the photoresist layer forms the PR pattern having a uniform thickness once the PR layer exposed to the light has been completely removed. Accordingly, the etched thickness of the layers under the PR pattern is also uniform. However, Han et al. uses a photomask having a grid, which lowers the amount of light reaching the portion of a positive PR layer thereunder in order to form a PR pattern having some portions thinner than other portions. The different thicknesses of the PR pattern produces the different etching depths of the underlying layers.

However, the method of Han et al. has a problem in forming the grid throughout a wide region. Furthermore, it is hard to make the etching depth uniform under the grid region, even when the grid is formed throughout a wide region.

U.S. Pat. Nos. 4,231,811, 5,618,643, and 4,415,262 and Japanese patent publication No. 61-181130, etc., which disclose similar methods as do Han et al. also have the same problem.

SUMMARY OF THE INVENTION

It is therefore an object of the present invention to simplify the manufacturing method of a TFT array panel for an LCD, thereby reducing the manufacturing cost and increasing the productivity.

It is another object of the present invention to etch thin films to different uniform depths depending on position at the same time.

These and other objects are provided, according to the present invention, by forming a contact hole for a gate pad along with at least one other layer, or a data wire and a semiconductor pattern, using a photoresist pattern as the etch mask, which is formed by a single photolithography step, having different thickness depending on position.

At this time, the semiconductor pattern may be extended out from the data wire.

In the manufacturing method of a thin film transistor array panel for a liquid crystal display of the present invention, a gate wire including a plurality of gate lines, gate electrodes, and gate pads, and a common wire including common signal line and common electrodes, are formed on a substrate having a display area and a peripheral area. The gate lines, and the gate electrodes and the common wire are mainly located in the display area and the gate pads are mainly located in the peripheral area. A gate insulating layer pattern covering portions of the gate wire and the substrate in the display area and exposing at least a part of each gate pad is formed thereon. A semiconductor pattern is formed on the gate insulating layer pattern, and an ohmic contact layer pattern is formed on the semiconductor pattern. Then, a data wire including a plurality of data lines, source electrodes, and drain electrodes mainly located in the display area and a plurality of data pads mainly located in the peripheral area are formed on the ohmic contact layer pattern. Next, a passivation layer pattern is formed, and a pixel wire including a plurality of pixel electrodes and pixel signal lines and which are connected to the drain electrodes is formed. Here, the gate insulating layer pattern is formed along with the semiconductor pattern and the passivation layer pattern through a single photolithography process using a photoresist pattern having a thickness that varies depending on position.

Here, it is desirable that the photoresist pattern has a first portion located over the gate pads, a second portion that is thicker than the first portion and located in the display area, and a third portion that is thicker than the second portion.

The photoresist pattern is formed on the passivation layer. The gate insulating layer pattern, the semiconductor layer pattern, and the passivation layer pattern are formed by etching a passivation layer and a semiconductor layer under the first portion of the photoresist pattern, and the second portion of the photoresist pattern at the same time. Next, the second portion of the photoresist pattern, in order to expose the passivation layer thereunder, is removed by an ashing process, and the gate insulating layer and the passivation layer are etched by using the photoresist pattern as an etch mask to expose the gate pads under the first portion of the photoresist pattern and to expose the semiconductor layer under the second portion of the photoresist pattern. Next, a portion of the semiconductor layer under the second portion is removed by using the photoresist pattern as an etch mask.

The data pads may be exposed in the step of etching the portions of the passivation layer and the semiconductor layer, and the data pads are exposed in the step of etching the passivation layer and the gate insulating layer.

The drain electrodes may be exposed in the step of etching the passivation layer, or they may be exposed in the step of etching portions of the passivation layer and the semiconductor layer.

A plurality of redundant gate pads and redundant data pads respectively covering the gate pad and the data pad may be formed in the step of forming the pixel electrode.

The photoresist pattern may be formed by using a photomask having different transmittances. It is desirable that the transmittance of the photomask of the part corresponding to the second portion is 20% to 60% of that of the first portion and the transmittance of the part corresponding to the third portion is less than 3% of that of the first portion.

The photomask has a mask substrate and at least one mask layer, and the difference of transmittance between the first part and the second part is obtained by adjusting the mask layer materials of the first part and the second part, by differentiating the thickness of the mask layer, or by forming slits or a grid pattern smaller than the resolution of the stepper in the mask layer.

The data lines may be exposed in the step of etching the portions of the passivation layer, and a plurality of redundant data lines connected to the data line may be formed in the step of forming the pixel wire.

It is desirable that the photoresist layer is made of a positive photoresist.

In another method for manufacturing a thin film transistor array panel for a liquid crystal display in the present invention, a gate wire including a plurality of gate lines, gate electrodes connected to the gate line, and a common wire including a plurality of common electrodes are formed on an insulating substrate. A gate insulating layer pattern covering the gate wire and the common wire, a semiconductor pattern on the gate insulating layer, and an ohmic contact layer pattern on the semiconductor pattern are formed. A data wire is formed including a plurality of data lines, with source electrodes connected to the data lines, and drain electrodes separate from the source electrode on the ohmic contact layer pattern. A passivation layer pattern covering the data wire except for a part of the drain electrode is formed, and a plurality of pixel electrodes connected to the drain electrodes and generating electric fields with the common electrode is formed. Here, the pixel electrodes are located at different layer from the data wire. The source electrode and the drain electrode are separated by a photolithography process of using a photoresist layer pattern, which includes a first portion located between the source electrode and the drain electrode, a second portion thicker than the first portion, and a third portion thinner than the first portion.

It is desirable that a mask used for forming the photoresist pattern has a first, a second, and a third part, with the transmittance of the third part being higher than that of the first and the second parts, the transmittance of the first part being higher than that of the second part, and with the photoresist pattern being made of positive photoresist, and with the mask being aligned such that the first, the second, and the third parts respectively face the first, the second, and the third portions of the photoresist pattern in an exposing step.

Here, the first part partially may transmit light, the second part may be substantially opaque, and the third part may be substantially transparent.

At this time, it is desirable that the first parts of the mask include a partially transparent layer, and the first part of the mask include a pattern smaller than the resolution of the exposure device used in the exposing step.

The first portion may be formed by reflow.

It is desirable that the thickness of the first portion is less than half of the thickness of the second portion, the thickness of the second portion is 1 $\mu$m to 2 $\mu$m, and the thickness of the first portion is in the range of 2,000 Å to 5,000 Å.

The data wire, the ohmic contact layer pattern, and the semiconductor pattern may be formed in the same photolithography process.

To form the gate insulating layer, the semiconductor pattern, the ohmic contact layer pattern, and the data wire, the gate insulating layer, a semiconductor layer, an ohmic contact layer, and a conductor layer are formed, and a photoresist layer is coated on the conductor layer. The photoresist layer is exposed to light through a mask and developed to form the photoresist pattern such that the second portion lies on the data wire due to the development the photoresist layer. The data wire, the ohmic contact layer pattern, and the semiconductor pattern respectively made of the conductor layer, the ohmic contact layer, and the semiconductor layer, are formed by etching a portion of the conductor layer under the third portion, the semiconductor layer and the ohmic contact layer thereunder, the first portion, the conductor layer and the ohmic contact layer under the first portion, and a partial thickness of the second portion, and removing the photoresist pattern.

To form the data wire, the ohmic contact layer pattern, and the semiconductor pattern, the portion of the conductor layer under the third portion is etched by dry or wet etching to expose the ohmic contact layer. The ohmic contact layer under the third portion, and the semiconductor layer thereunder, and the first portion are then etched to obtain the completed semiconductor pattern along with exposing the gate insulating layer under the third portion. Next, the first portion is removed to expose the conductor layer under the first portion, and the conductor layer under the first portion and the ohmic contact layer thereunder are removed to obtain the completed data wire and the completed ohmic contact layer pattern.

The first portion may be formed on the part corresponding to the edge portion of the data wire.

The passivation layer pattern has a first contact hole exposing the data line, and a redundant data line connected to the data line through the first contact hole on the passivation layer may be formed on the same layer as the pixel electrodes.

In a thin film transistor array panel for a liquid crystal display, a gate wire, a common wire, and a pixel wire are formed on the insulating substrate. The gate wire includes a plurality of gate lines extending in a first direction, and gate electrodes connected to the gate line, the common wire includes a plurality of common signal lines extending in the same direction as the gate line and a plurality of common electrodes connected to the common signal lines, and the pixel wire includes a plurality of pixel electrodes parallel to the common electrodes. A semiconductor layer made of semiconductor is formed on a gate insulating layer covering the gate wire, the common wire, and the pixel wire. Additionally, a data wire, including a plurality of data lines extending in a second direction crossing the gate line, source electrodes connected to the data lines, and drain electrode separated from the data line and the source electrode and located at the opposite side of the source electrode with respect to the gate electrode, is formed on the semiconductor layer. A passivation layer pattern having a first contact hole exposing the pixel wire and the drain electrode along with the gate insulating layer is formed on the data wire. A redundant conductive layer connecting the drain electrode to the pixel wire through the first contact hole is formed on the passivation layer pattern.

It is desirable that the conductive layer provides storage capacitance by overlapping the common wire, and with the conductive material made of transparent conductive material such as indium-tin-oxide or indium-zinc-oxide.

The passivation layer pattern may have a plurality of second contact holes exposing the data lines, and a redundant data line may be formed, which is made of the same layer as the redundant conductive layer and connected to the data line through the second contact holes.

An ohmic contact layer pattern is further included between the data wire and the semiconductor pattern and doped with impurity, the ohmic contact layer pattern having the same shape as the data wire.

The semiconductor pattern, except for the channel portion of a thin film transistor, may have the same shape as the data wire.

Here, the semiconductor pattern may be extended out from the data wire.

In another method for manufacturing a thin film transistor array panel for a liquid crystal display according to the present invention, a gate wire including a plurality of gate lines, gate electrodes connected to the gate line and a common wire including a plurality of common electrodes are formed on an insulating substrate. A gate insulating layer pattern that covers the gate wire and the common wire is formed, a semiconductor pattern is formed on the gate insulating layer, and an ohmic contact layer pattern is formed on the semiconductor pattern. A data wire including a plurality of data lines, source electrodes connected to the data line, and drain electrodes separate from the source electrode, is formed on the ohmic contact layer pattern. A passivation layer pattern covering the data wire, except for a part of the drain electrode, is formed, and a plurality of pixel electrodes connected to the drain electrodes and generating electric fields with the common electrodes are formed. At this time, the source electrode and the drain electrode are separated by a photolithography process using a photoresist layer pattern, which includes a first portion located between the source electrode and the drain electrode and least at the periphery portion of the pixel electrodes, a second portion thicker than the first portion, and a third portion thinner than the first portion.

It is desirable that the semiconductor pattern at least extends out from the pixel electrodes, and the photoresist pattern may have a double-layered structure made of a lower layer and an upper layer having different photosensitivity.

In another thin film transistor array panel for a liquid crystal display of the present invention, a gate wire and a common wire are formed on an insulating substrate. The gate wire includes a plurality of gate lines extending in a first direction and gate electrodes connected to the gate line, and the common wire includes a plurality of common signal lines extending to the same direction as the gate line and a plurality of common electrodes connected to the common signal lines. A gate insulating layer covering the gate wire and the common wire is formed, and a semiconductor layer is formed on the gate insulating layer and overlaps the gate electrode. A data wire and a pixel wire are formed on the semiconductor layer. The data wire includes a plurality of data lines extending in a second direction crossing the gate line, source electrodes connected to the data lines, and drain electrode separated from the data line and the source electrode and located at the opposite side of the source electrode with respect to the gate electrode, and the pixel wire that includes a plurality of pixel electrodes parallel to the common electrodes. At this time, at least the semiconductor pattern under the pixel electrodes is extended out from the pixel electrodes.

It is desirable that the width of the semiconductor pattern extended from out the pixel electrodes is more than 0.5 $\mu$m.

The gate wire further includes a gate pad which is connected to and receives a scanning signal from an external circuit, and the data wire further includes a data pad which is connected to and receives a data signal from an external circuit. A passivation layer having contact holes respectively exposing the gate pad and the data pad along with the gate insulating layer may also be included.

The pixel wire further may include a pixel signal line connecting the pixel electrodes and the drain electrode and extending in the first direction.

In another thin film transistor array panel for a liquid crystal display of the present invention, a gate wire including a plurality of gate lines extending in a first direction, and gate electrodes connected to the gate line, and a common wire including a plurality of common signal lines extending in the same direction as the gate line and a plurality of common electrodes connected to the common signal lines are formed on an insulating substrate. A gate insulating layer covering the gate wire and the common wire is formed, and a semiconductor layer is formed on the gate insulating layer and made of semiconductor. A data wire including a plurality of data lines extending in a second direction crossing the gate line, source electrodes connected to the data lines, and drain electrode separated from the data line and the source electrode and located at the opposite side of the source electrode with respect to the gate electrode, is formed on the semiconductor layer. A passivation layer pattern having a first opening exposing the drain electrode is formed on the data wire. A pixel wire, including a plurality of pixel electrodes parallel to the common electrodes and a pixel signal line connecting the pixel electrodes and the drain electrode, is formed on the passivation layer.

It is desirable that the pixel wire provides storage capacitance by overlapping the common wire.

The passivation layer pattern may have a plurality of second contact holes exposing the data lines, and a redundant data line may also be formed, which are made of the same layer as the pixel wire and connected to the data line through the second contact holes.

BRIEF DESCRIPTION OF THE DRAWINGS

FIGS. 9A and 9B, FIGS. 10A and 10B and FIG. 11 are respectively the cross-sectional views of photomasks used in the manufacturing step of FIGS. 8A to 8C.

FIGS. 19A, 20A, and 21A, and 19B, 20B, and 21B are cross-sectional views taken along the lines XVIIIB–XVIIIB' and XVIIIC–XVIIIC' in FIG. 18A, respectively, in the next manufacturing steps following that which is represented in FIGS. 18A and 18B.

FIGS. 27A and 27B are cross-sectional views in the next manufacturing steps following those that are represented in FIGS. 26B and 26C.

FIGS. 30B and 31B are the cross-sectional views taken along the lines XXXB–XXXB' and XXXIB–XXXIB' in FIGS. 30A and 31A, respectively.

DETAILED DESCRIPTION OF THE PREFERRED EMBODIMENTS

Figure 1:
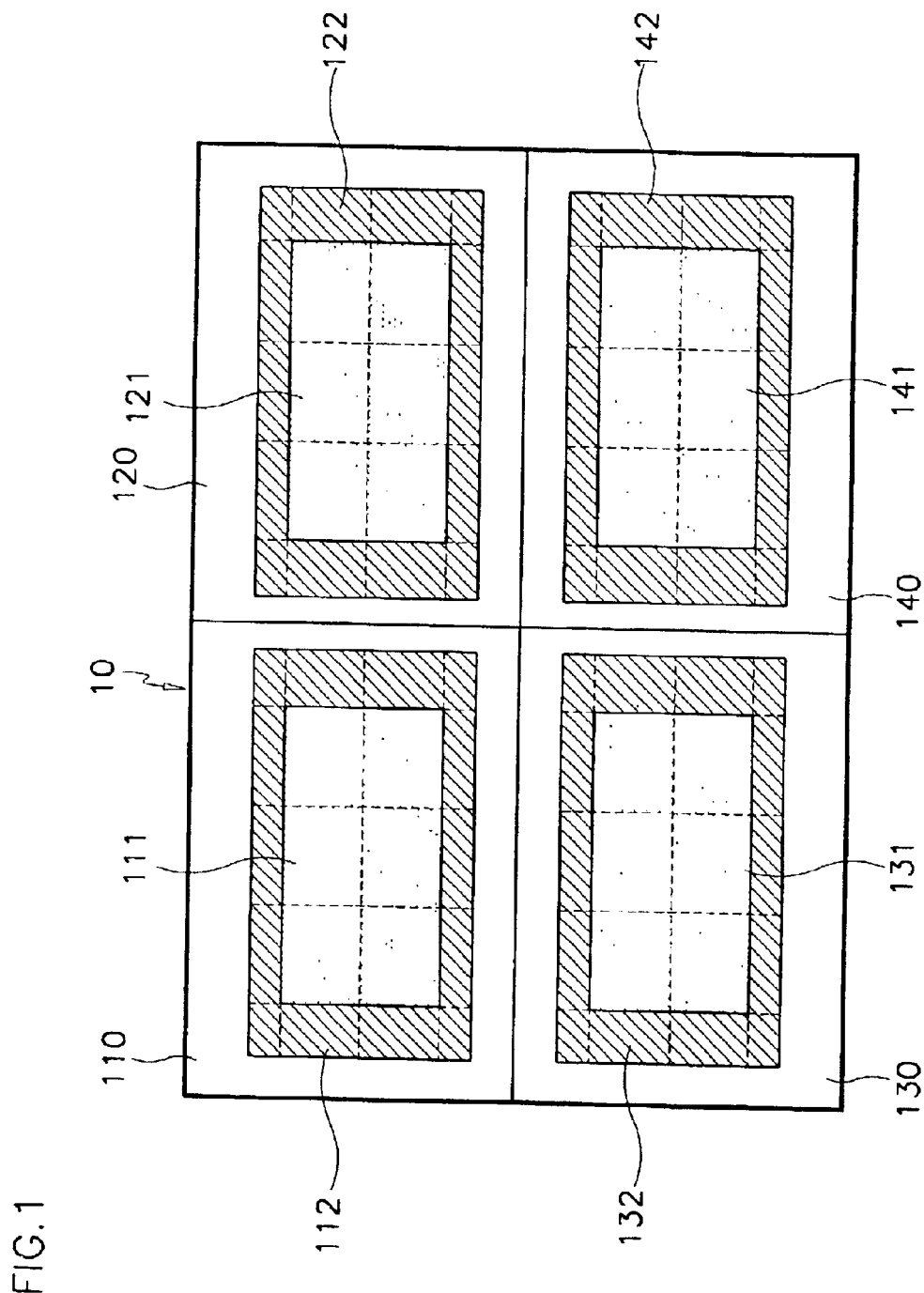
FIG. 1 is a schematic diagram of a substrate including four TFT array panels for LCDs according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numbers refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

In the first embodiments of present invention, at least one layer or a plurality of layers are patterned at one time to form contact holes exposing gate pads. At this time, the gate insulating layer of the display area is left while the gate insulating layer in gate pad area is removed.

A structure of a TFT array panel according to an embodiment of the present invention will now be described with reference to FIGS. 1 to 5.

As shown in FIG. 1, a plurality of panel areas is formed on an insulating plate 10. For example, as shown in FIG. 1, four panel areas 110, 120, 130, and 140 are formed on a glass plate 10. When the panels are TFT array panels, the panel areas 110, 120, 130, and 140 include display areas 111, 121, 131, and 141 having a plurality of pixels and peripheral areas 112, 122, 132, and 142, respectively. TFTs, wires, and pixel electrodes are repeatedly arranged in the matrices in the display areas 111, 121, 131, and 141, and pads to be connected to external circuits and electrostatic discharge protection circuits are provided in the peripheral areas 112, 122, 132, and 142.

In general, the elements in the panel areas 110, 120, 130, and 140 are formed by photolithography using a stepper, a particular kind of exposure device. When using a stepper, the display areas 111, 121, 131, and 141 and the peripheral areas 112, 122, 132, and 142 are divided into several sections, and a PR layer coated on the thin films on the plate 10 is exposed to light, section by section, through one or more masks. Then, the PR layer is developed to form a PR pattern, and the thin films under the PR pattern are etched to form thin film patterns. A complete LCD panel is obtained by repeating the above described patterning step.

However, when not using the stepper, the PR layer coated on thin films on the plate 10 may be exposed just one time, and an LCD panel may be formed on the insulating plate 10.

Figure 2:
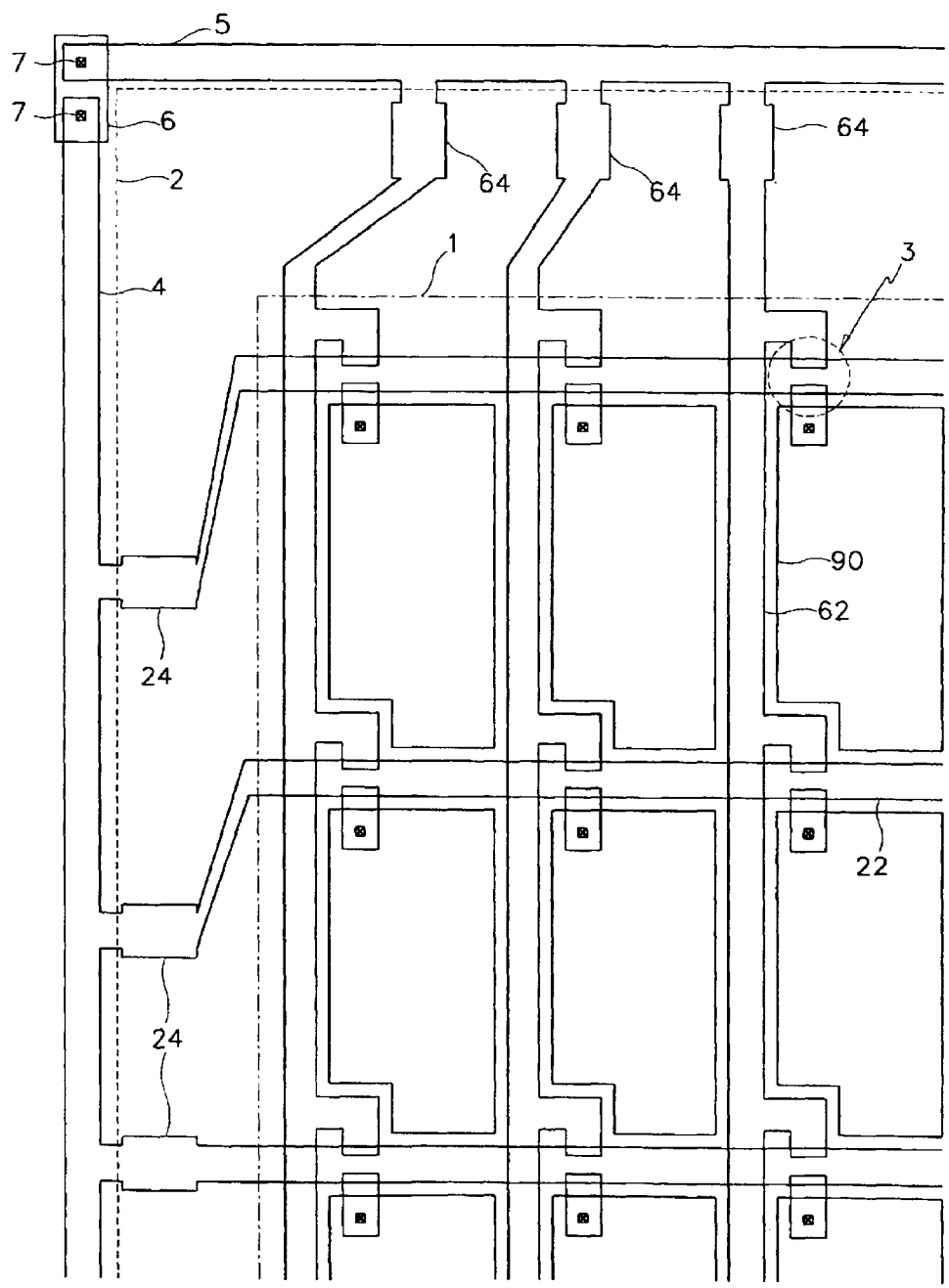
FIG. 2 is a layout view schematically showing a TFT array panel for an LCD according to an embodiment of the present invention.

FIG. 2 is a layout view of a TFT array panel area shown in FIG. 1 according to an embodiment of the present invention.

As shown in FIG. 2, a plurality of TFTs, a plurality of pixel electrodes electrically connected thereto, and a plurality of wires including gate lines 22 and data lines 62 are formed in the display area surrounded by an imaginary dashed line 1. Gate pads 24 and data pads 64 respectively connected to the gate lines 22 and the data lines 62, and a gate shorting bar 4 and a data shorting bar 5 are formed in the peripheral area. The gate shorting bar 4 and the data shorting bar 5 connect all of the gate lines 22 and all of the data lines 62, respectively, and are electrically connected to each other through a connector 6 to make them at the same potential, and thereby protecting the device elements from electrostatic discharge failure. The shorting bars 4 and 5 will be removed by cutting the panel along the dashed cutting line 2. A reference numeral 7 represents contact holes formed in the insulating layers (not shown) interposed between the connector 6 and the shorting bars 4 and 5, and the connector 6 is connected to the shorting bars 4 and 5 through the contact holes 7.

FIG. 2 provides as an example the case when the pixel electrodes are formed in a thin film transistor panel, or rather a concrete embodiment as an example of the formation of the pixel electrodes and common electrodes.

Figure 3:
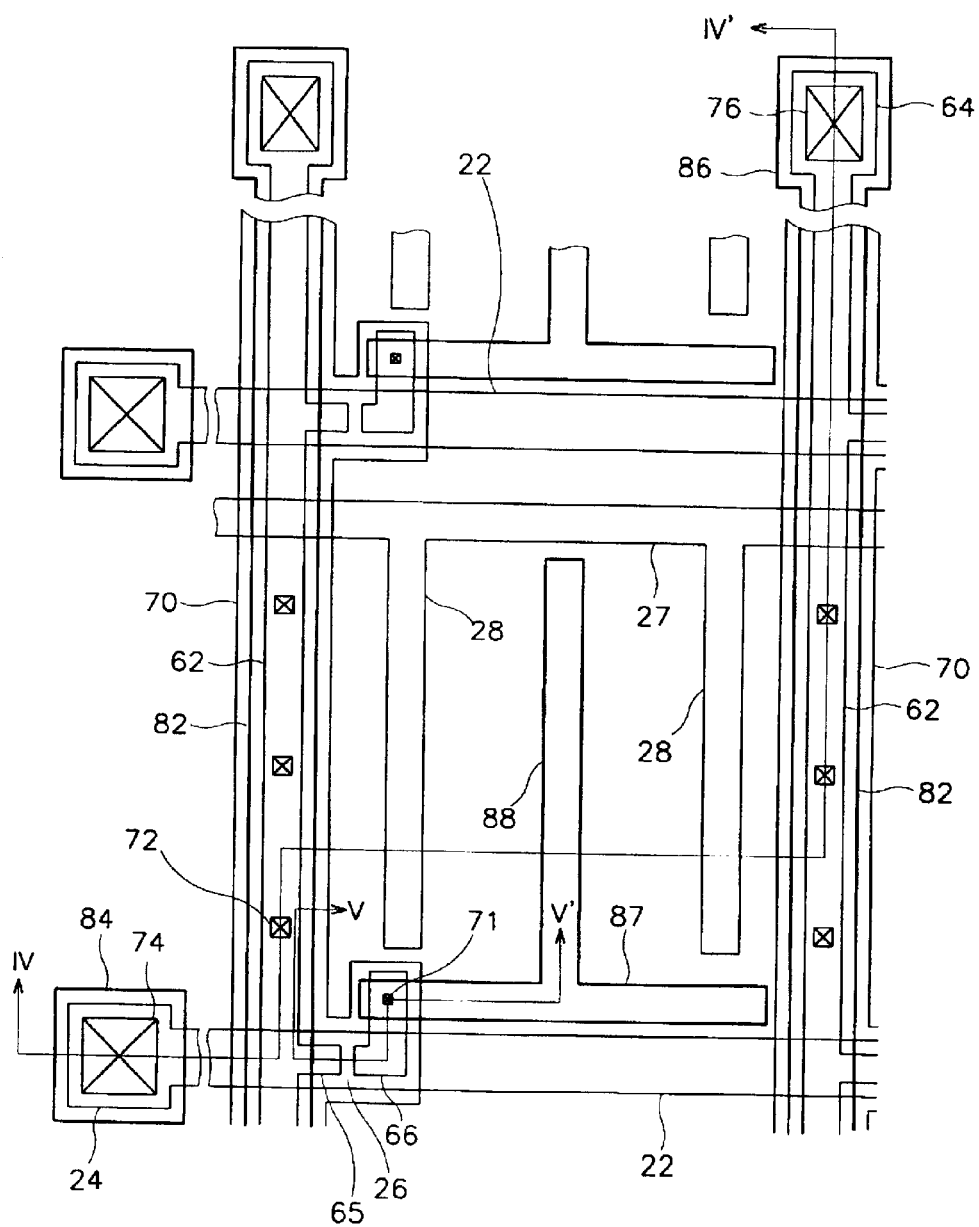
FIG. 3 is a layout view of a TFT array panel for an LCD according to a first embodiment of the present invention, showing an enlarged view of a pixel and pads in FIG. 2.
Figure 4:
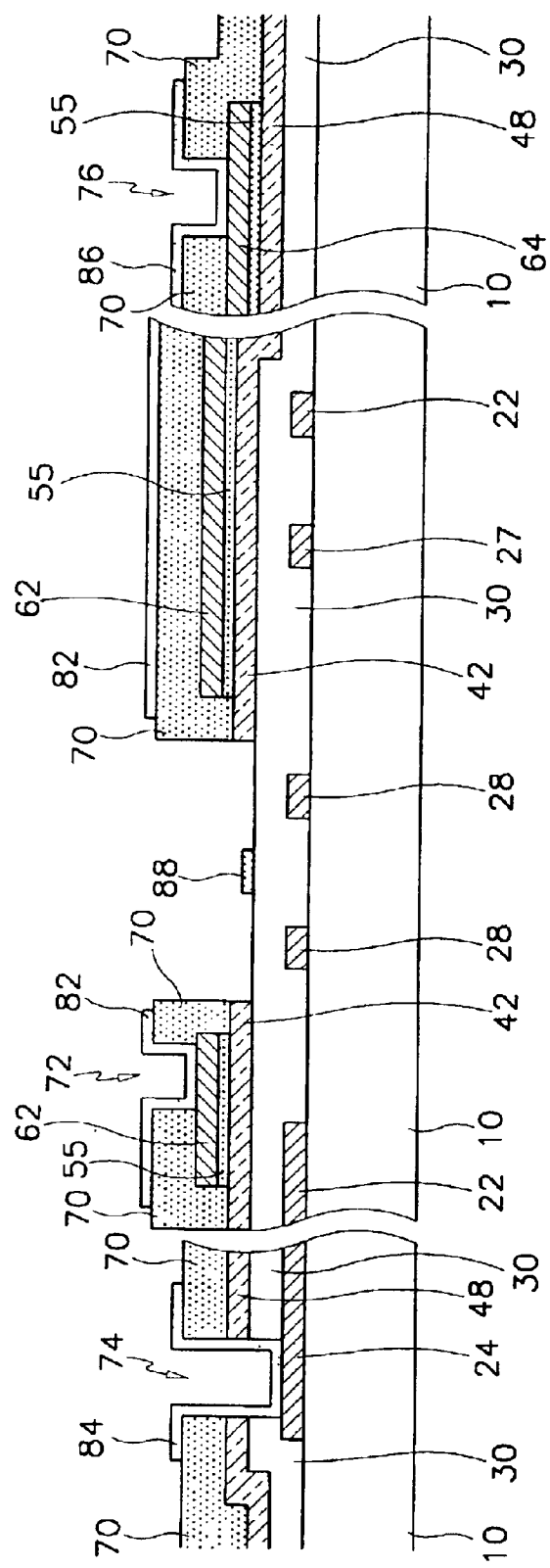
FIGS. 4 and 5 are cross-sectional views of the TFT array panels shown in FIG. 3 taken along the lines IV–IV' and V–V' in FIG. 3, respectively.
Figure 5:
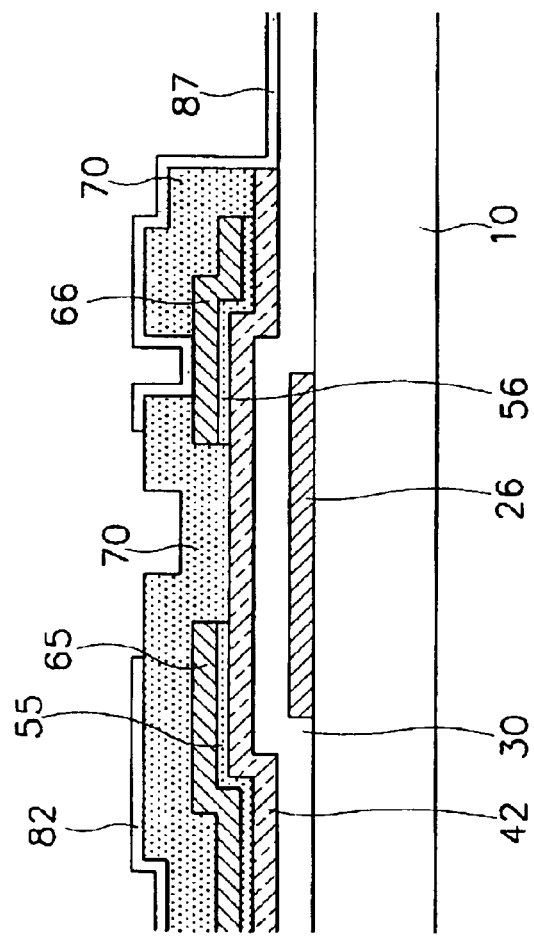

FIGS. 3 to 5 are an enlarged view of a thin film transistor, a pixel electrode, a common electrode, the wires of the display area, and the pads of peripheral area in a TFT array panel according to the first embodiment of the present invention. FIG. 3 is a layout view, and FIGS. 4 and 5 are cross-sectional views taken along the lines IV–IV' and V–V' in FIG. 3.

A gate wire of metal or conductive material such as aluminum (Al) or aluminum alloy, molybdenum (Mo) or molybdenum-tungsten (MoW) alloy, chromium (Cr), or tantalum (Ta) is formed on an insulating substrate 10. The gate wire includes a plurality of gate lines (scanning signal lines) 22 extending in the horizontal direction in FIG. 3, a plurality of gate pads 24 connected to one of the ends of the respective gate lines 22 and transmitting the scanning signals from an external circuit to the gate lines 22, and a plurality of gate electrodes 26 of TFTs, which are branches of the gate lines 22.

A common wire made of the same material as the gate wire is also formed on the insulating substrate 10. The common wire includes a common signal line 27 extending in the horizontal direction in FIG. 3 and parallel to the gate lines 22 and a plurality of common electrodes 28 extending perpendicular to and connecting with the common signal lines 27. A common pad (not shown) connected to one of the ends of the common signal line 27 and transmitting common signals from an external circuit to the common signal lines 22 have the same structure as that of the gate pads 24.

The gate wires 22, 24, and 26, the common wires 27 and 28 may have a multiple-layered structure as well as a single-layered structure. When the gate wires 22, 24, and 26, and the common wires 27 and 28 have a multiple-layered structure, it is preferable that one layer is made of a material having a low resistivity and another layer is made of a material having good contact characteristics with other materials.

A gate insulating layer 30 of material such as silicon-nitride (SiNx) is formed on and covers the gate wires 22, 24, and 26, and the common wires 27 and 28.

Semiconductor patterns 42 and 48 made of a semiconductor such as hydrogenated amorphous silicon are formed on the gate insulating layer 30. Ohmic contact layer patterns 55 and 56 made of amorphous silicon heavily doped with impurities such as phosphorus are formed on the semiconductor patterns 42 and 48.

A data wire made of conductive material such as Mo or MoW, Cr, Al or Al alloy, or Ta is formed on the ohmic contact layer patterns 55 and 56. The data wire has a data line 62 extending in the vertical direction in FIG. 3, a data pad 64 connected to an end of the data line 62 and transmitting image signals from an external circuit to the data line 62, and a source electrode 65 of a TFT that is a branch of the data line 62. The data wire also has a plurality of drain electrodes 66 of the TFTs, which are located opposite to the respective source electrodes with respect to the respective gate electrodes 22 and are separated from other data wire elements 62, 64, and 65.

The data wires 62, 64, 65, and 66 may have a multiple-layered structure like the gate wires 22, 24, and 26. Of course, when the data wire has a multiple-layered structure, it is preferable that one layer is made of a material having a low resistivity and another is made of a material having good contact characteristics with other materials.

The ohmic contact layer patterns 55 and 56 reduce the contact resistance between the semiconductor pattern 42 and the data wires 62, 64, 65, and 66, and have substantially the same layout as the data wires 62, 64, 65, and 66. In other words, the first ohmic contact layer portions 55 under the data wire elements 62, 64, and 65 have substantially the same shape as those of the data wire elements 62, 64, and 65, and the second ohmic contact layer portions 56 under the drain electrodes 66 have substantially the same shape as those of the drain electrodes 66.

The semiconductor pattern 42 has a similar layout to that of the data wires 62, 64, 65, and 66 and the ohmic contact layer patterns 55 and 56 except for the channels of the thin film transistors. In detail, the channel of the semiconductor pattern 42 has a different shape from the remaining portions of the data wires 62, 64, and 65 and the ohmic contact layer patterns 55 and 56. The data wire elements 62, 64, and 65, especially the source electrode 65 and the drain electrode 66, are separated from each other on the channel of the thin film transistor, and the portions 55 and 56 of the ohmic contact layer pattern thereunder are also separated from each other, although the semiconductor portion 42 is not divided into two pieces so that it can make a channel of the thin film transistor. At the same time, semiconductor pattern portions 48 extends to the peripheral area.

The data wire elements 62, 64, and 65, the drain electrode 66, and the semiconductor pattern 42 are covered with a passivation layer 70. The passivation layer 70 has contact holes 71, 72, and 76 respectively exposing the drain electrodes 66, the data line 62, and the data pads 64, and contact hole 74 exposing the gate pads 24 together with the gate insulating layer 30 and the semiconductor pattern 48. The gate lines 22 are not covered with the passivation layer 70 except for the portions under the data line 62. The passivation layer 70 may be made of an insulating material such as SiNx or acrylic organic material, and provides a cover that at least protects the channels of the TFTs.

A pixel wire is formed on the portions of the gate insulating layer 30 surrounded by the gate lines 22 and the data lines 62. The pixel wire includes a pixel signal line 87 parallel to the common signal line 27 and a plurality of pixel electrodes 88 connected to the pixel signal line 87 and parallel to the common electrode 28. The pixel wires 87 and 88 are electrically and physically connected to the drain electrode 66 through the contact hole 71, and receive the image signals from the drain electrode 66 to generate electric fields along with the common wires 27 and 28.

Here, the pixel wires 87 and 88, and the common wires 27 and 28 may be extended to overlapped each other to make a storage capacitor, and hence generating storage capacitance.

A plurality of redundant data lines 82 are formed overlapping the data line 62 and are connected to the data line 62 through the contact hole 72. A plurality of redundant gate pads 84 and a plurality of redundant data pads 86 connected to the redundant data lines 82 are respectively formed on the gate pads 24 and the data pads 64 and are connected to them through the contact holes 74 and 76. Since these redundant pads 84 and 86 protect the pads 24 and 64 and only complement the contacts between the external circuitry and the pads 24 and 64, they are optional.

A manufacturing method of a TFT array panel according to an embodiment of the present invention will now be described with reference to FIGS. 6A to 12B as well as to FIGS. 3 to 5.

Figure 6A:
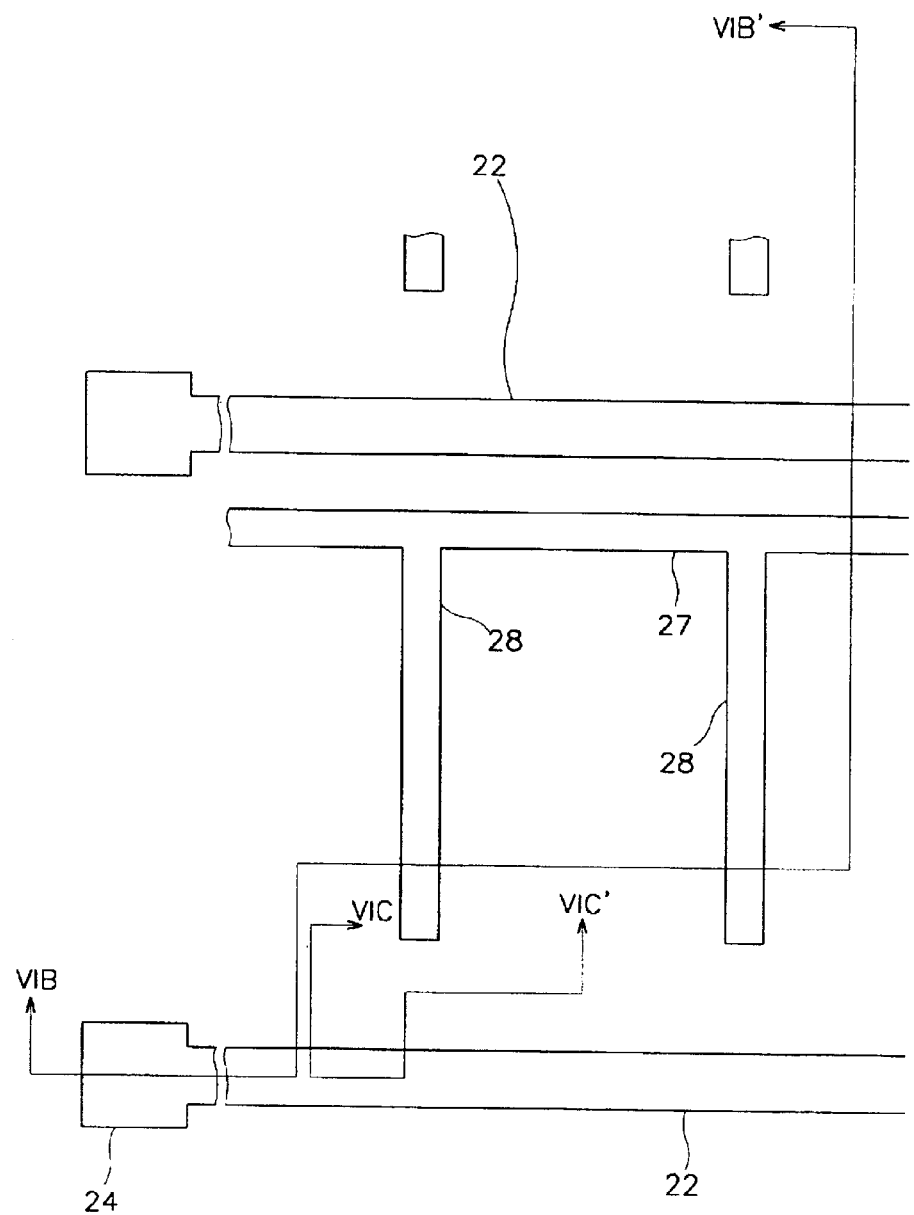
FIG. 6A is a layout view of a TFT array panel in a manufacturing step of a manufacturing method of the LCD shown in FIGS. 3, 4, and 5 according to an embodiment of the present invention.
Figure 6B:
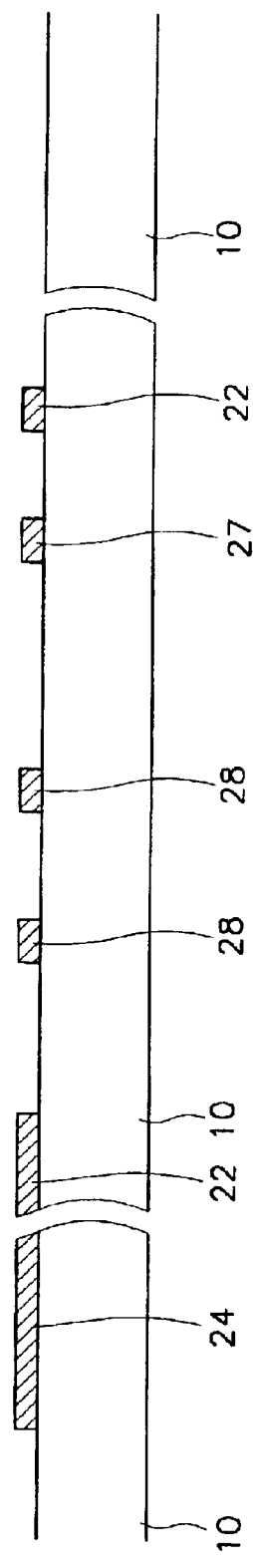
FIGS. 6B and 6C are respectively the cross-sectional views taken along the line VIB–VIB' and VIC–VIC' of FIG. 6A.
Figure 6C:
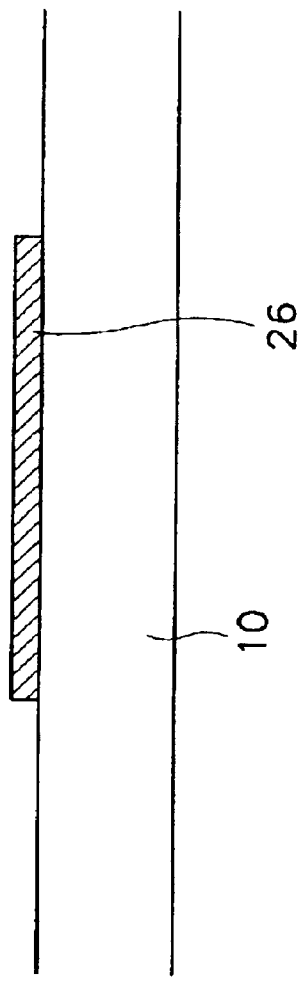

First, as shown in FIGS. 6A to 6C, a conductor layer of metal with the thickness of 1,000 Å to 3,000 Å is deposited on a substrate 10 by sputtering, and a gate wire, including a plurality of gate lines 22, gate pads 24, and gate electrodes 26, and a common wire including a common signal line 27 and a plurality of common electrodes 28 are formed by dry or wet etching using a first photolithography step.

Figure 7A:
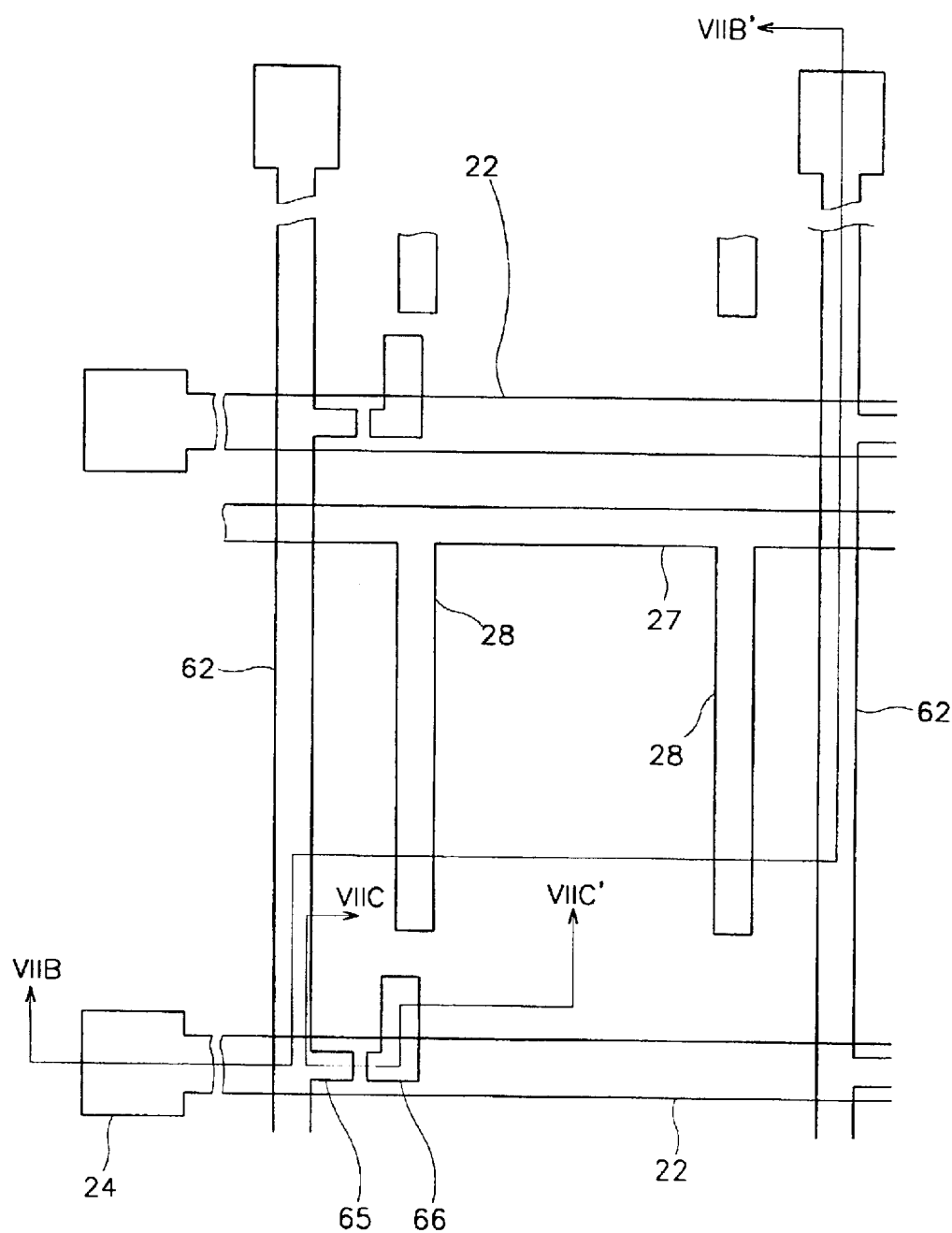
FIG. 7A is a layout view of a TFT array panel in the next manufacturing step following that which is represented in FIGS. 6A to 6C.
Figure 7B:
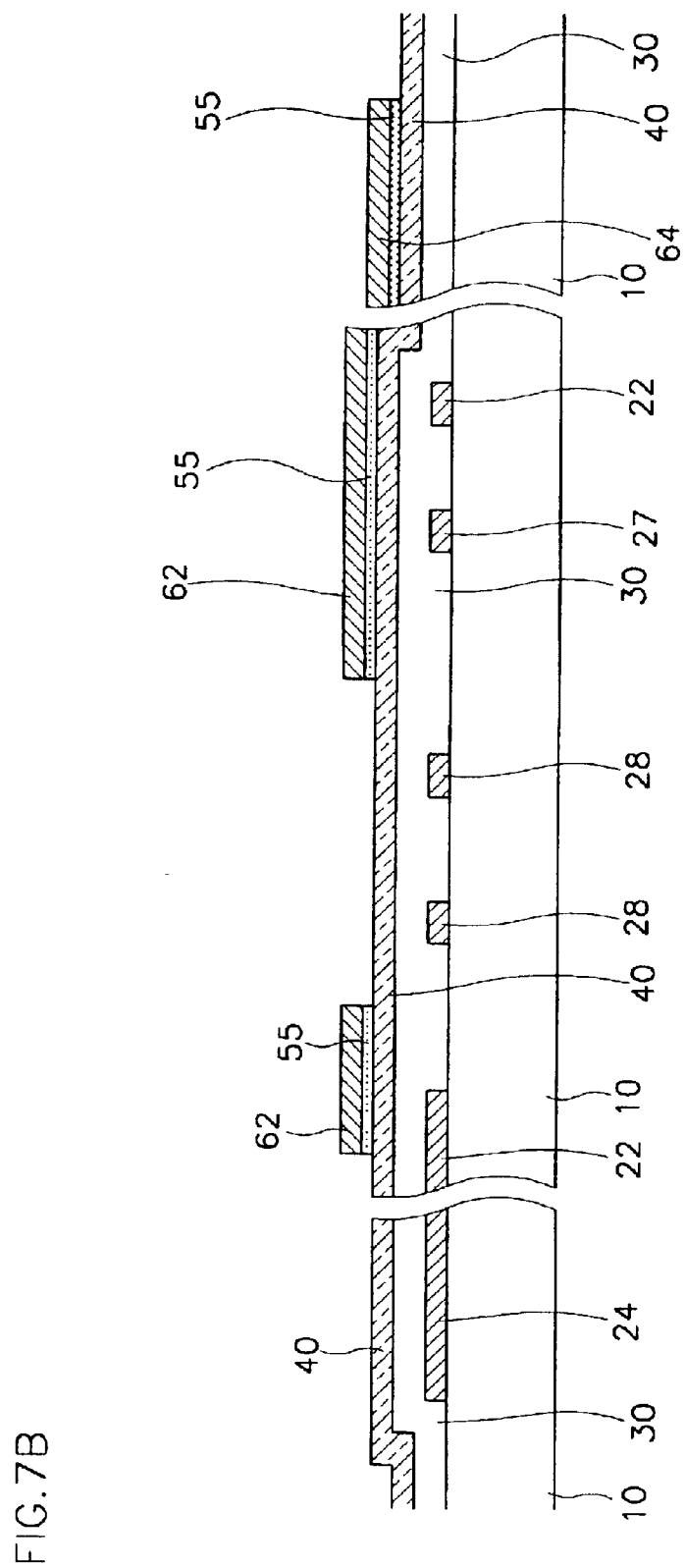
FIGS. 7B and 7C are respectively the cross-sectional views taken along the line VIIB–VIIB' and VIIC–VIIC' of FIG. 7A.
Figure 7C:
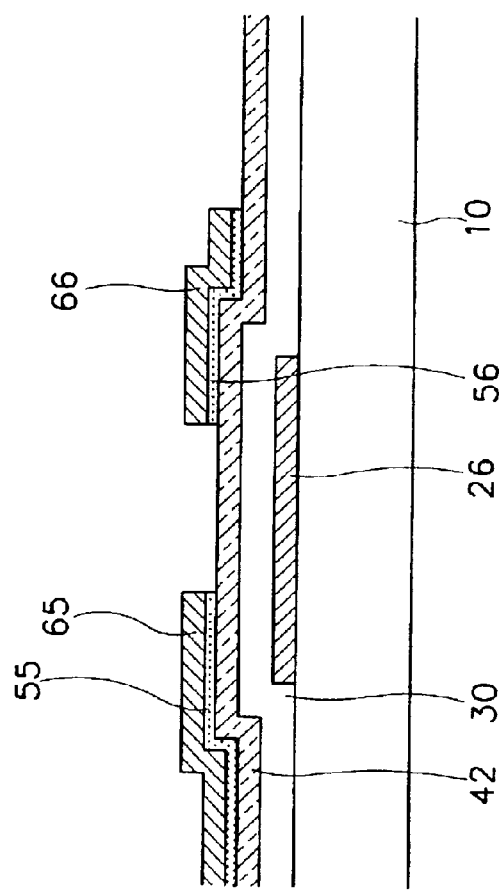

Next, as shown in FIGS. 7A to 7C, a gate insulating layer 30, a semiconductor layer 40, and an ohmic contact layer 50 with the respective thickness of 1,500 Å to 5,000 Å, 500 Å to 1,500 Å, and 300 Å to 600 Å are sequentially deposited by such a method as chemical vapor deposition (CVD). Then, a conductor layer 60 of metal with the thickness of 1,500 Å to 3,000 Å is deposited by such a method as sputtering. The conductor layer 60 and the ohmic contact layer 50 thereunder are patterned to form data wire elements, including data lines 62, data pads 64, and source electrodes 65, first portions 55 of the ohmic contact layer thereunder, and drain electrodes 66 and second portions 56 of the ohmic contact layer thereunder by a second photolithography step.

Figure 8A:
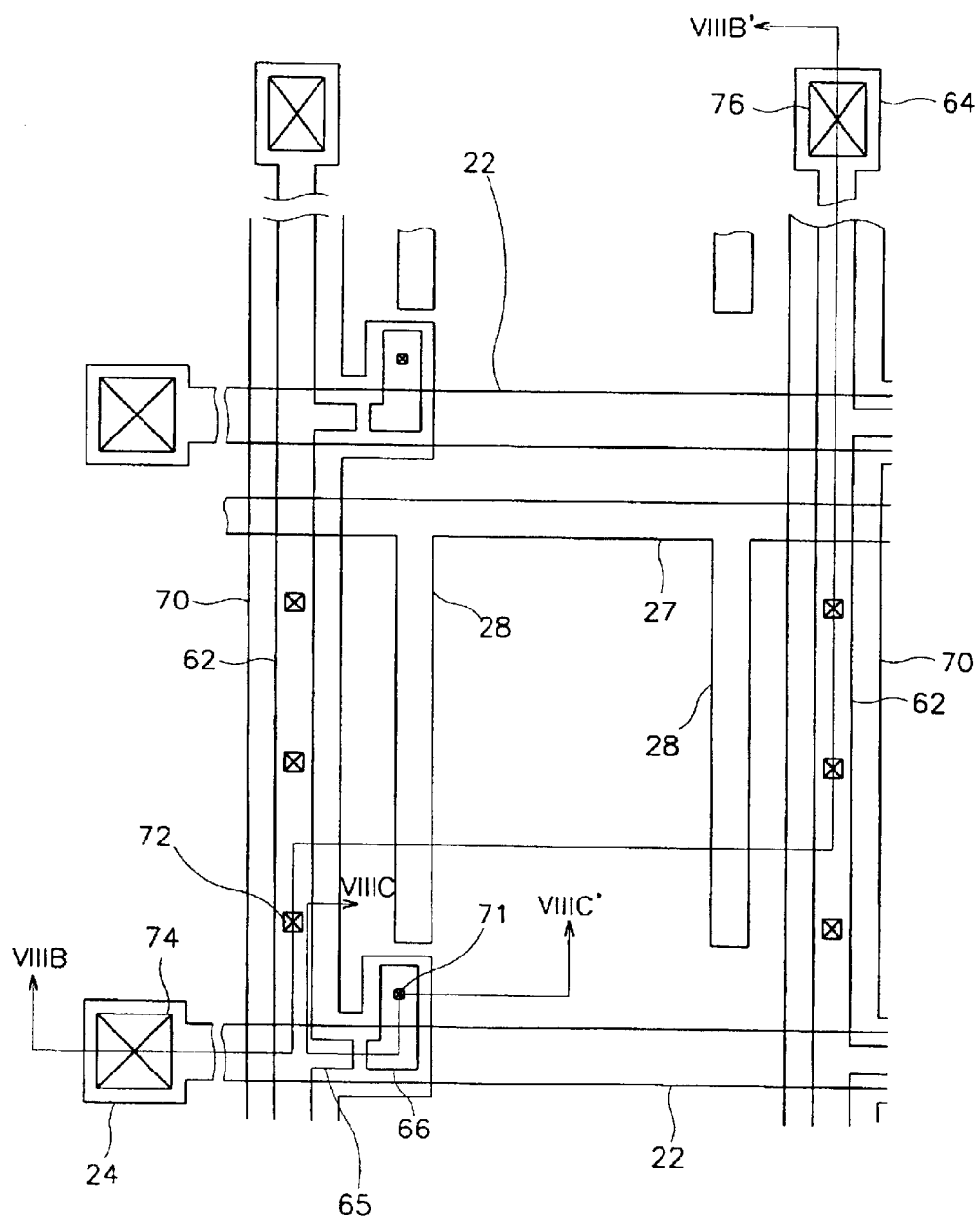
FIG. 8A is a layout view of a TFT array panel in the next manufacturing step following that which is represented in FIGS. 7A to 7C.
Figure 12A:
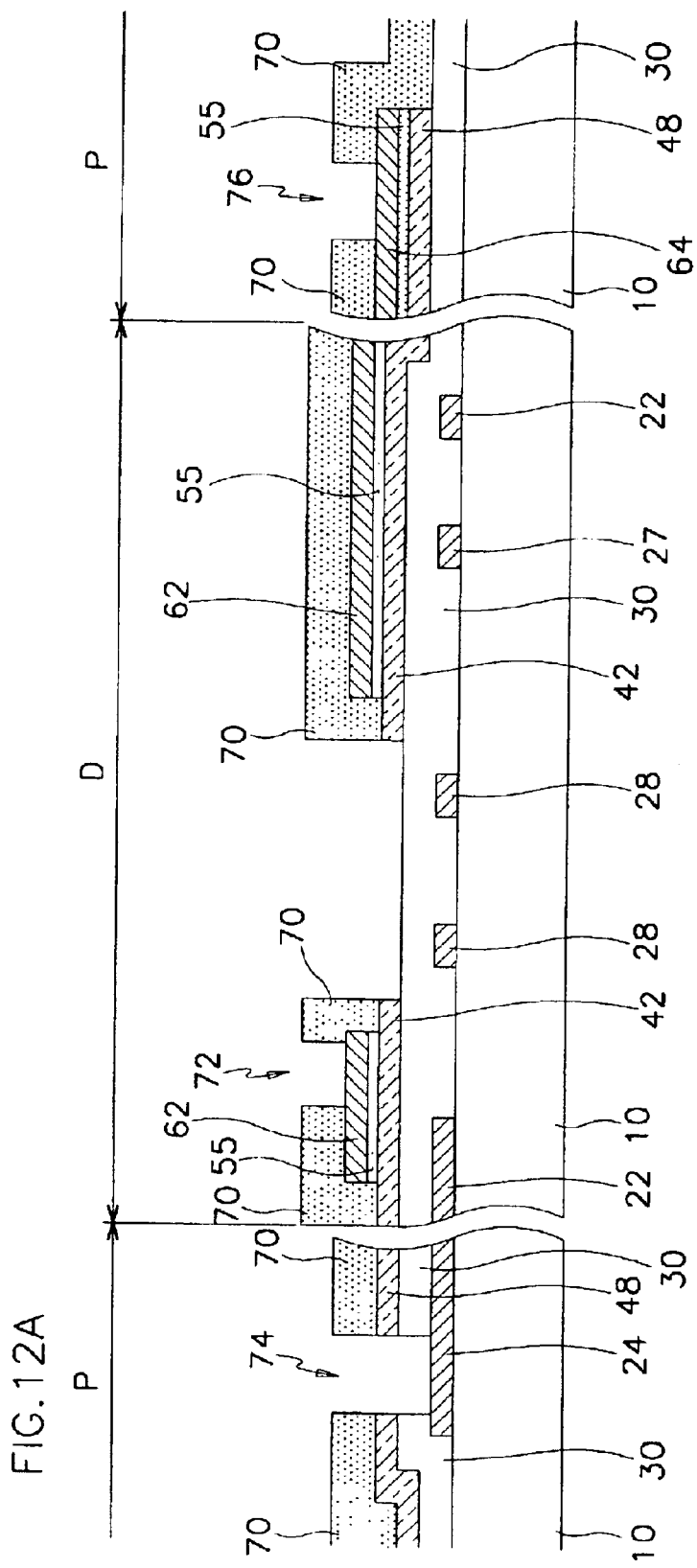
FIGS. 12A and 12B are respectively the cross-sectional views taken along the line VIIIB–VIIIB' and VIIIC–VIIIC' of FIG. 8A in the next manufacturing step following that which is represented in FIGS. 8B and 8C.
Figure 12B:
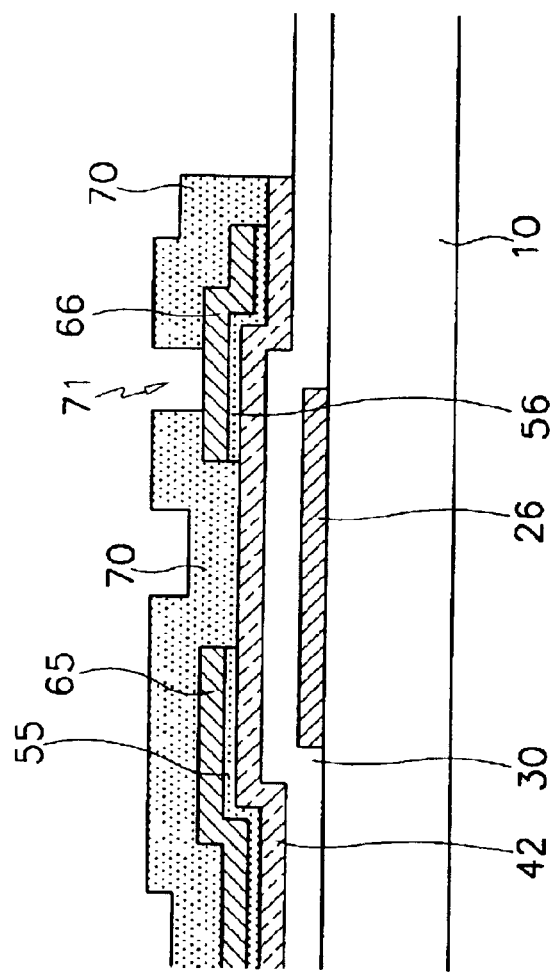

As shown in FIGS. 8A, 12A and 12B, a passivation layer 70 of with a thickness over 3,000 Å is deposited by CVD of SiNx or spin coating an organic insulator. Then, the passivation layer 70, the semiconductor layer 40, and the gate insulating layer 30 are patterned to form their patterns having contact holes 71, 72, 74, and 76 by a third photolithography step. At this time, the portions of the passivation layer 70, the semiconductor layer 40, and the gate insulating layer 30 in the peripheral area P are removed (with the portions of the passivation layer 70 on the data pads 64 also being removed). However, in the display area D, only the portions of the passivation layer 70 and the semiconductor layer 40 are removed (with the portions of the passivation layer 70 on the drain electrodes 66 and the data lines 62 also being removed) to form a semiconductor pattern having TFT channels. For this purpose, a PR pattern is formed to have thickness that varies depending on the location, and the layers under the PR pattern are dry etched by using the PR pattern as an etch mask. This will be described with reference to FIGS. 8B to 12B.

Figure 8B:
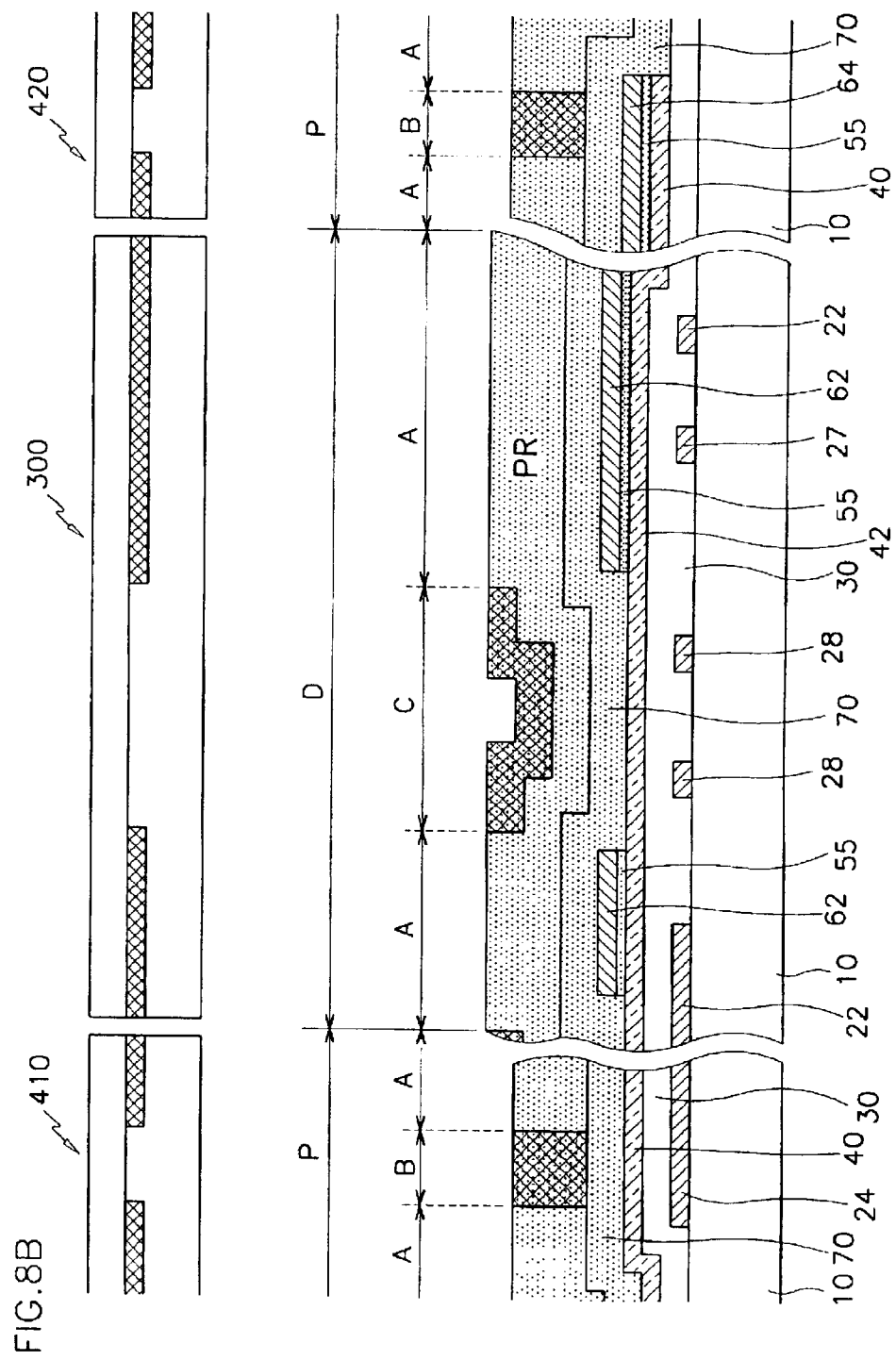
FIGS. 8B and 8C are respectively the cross-sectional views taken along the line VIIIB–VIIIB' and VIIIC–VIIIC' of FIG. 8A.
Figure 8C:
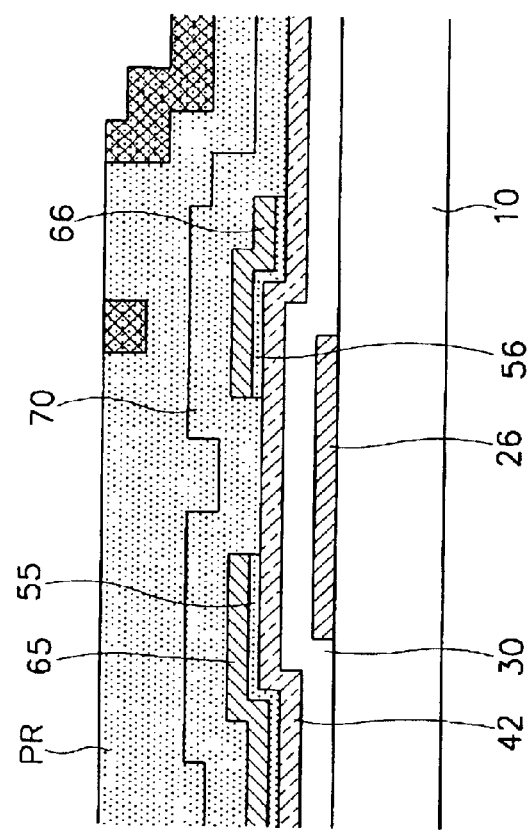

At first, a positive PR layer is coated to a thickness of 5,000 Å to 30,000 Å on the passivation layer 70 and exposed to light through a mask or masks 300, 410, and 420. The PR layer of the display area D, as shown in FIGS. 8B and 8C, is different from that of the peripheral area P. Polymers in regions C and the PR layer in the display area D are exposed to the light and decomposed to a certain depth, but remaining intact beyond that depth. However, polymers in regions B of the PR layer in the peripheral area P are exposed to the light and wholly decomposed from the surface to the bottom. The portions of the passivation layer 70 in the regions C and B are subject to being removed.

For this purpose, a mask portion 300 for the display area D may have structures different from mask portions 410 and 420 for the peripheral area P. Three such examples will be described with reference to FIGS. 9A to 11.

The first and second examples use two separate photomask pieces for the display area D and the peripheral area P.

Figure 9A:
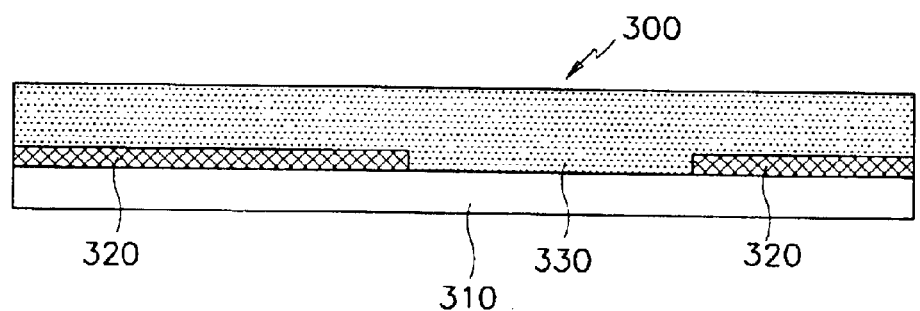
Figure 9B:
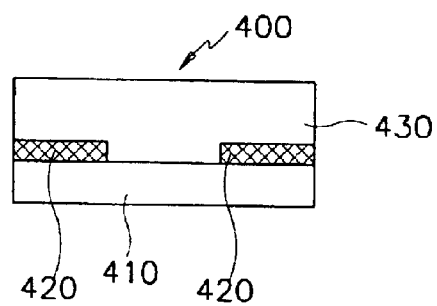

First, as shown in FIGS. 9A and 9B, masks 300 and 400 include mask substrates 310 and 410, opaque pattern layers 320 and 420 of such material as Cr thereon, and pellicles 330 and 430 covering the opaque pattern layer 320 and 420 and the exposed portions of the substrates 310 and 410, respectively. The light transmittance of the pellicle 330 of the mask 300 for the display area D is lower than that of the mask 400 for the peripheral area P. It is preferable that the light transmittance of the pellicle 330 is 10% to 80% of that of the pellicle 430, more preferably 20% to 60%.

Figure 10A:
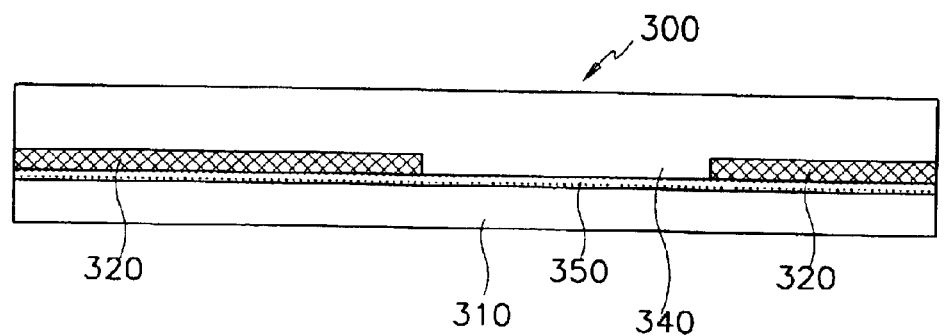
Figure 10B:
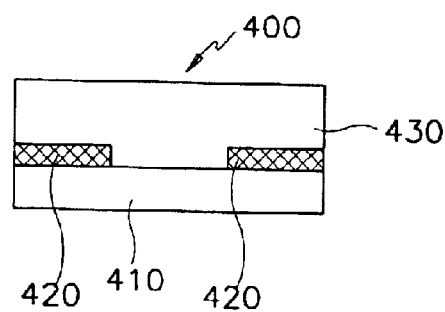

Next, as shown in FIGS. 10A and 10B, a Cr layer 350 with a thickness of 100 Å to 300 Å is formed on a mask substrate 310 of a mask 300 for the display area D to reduce light transmittance, while there is no Cr layer in a mask 400 for the peripheral area P. The light transmittance of a pellicle 340 of the mask 300 may be equal to that of a pellicle 430 of the mask 400.

A mixed structure of the above two examples may also be used.

The above two examples can utilize a divide-and-exposure method using a stepper, since the mask 300 for the display area D and the mask 400 for the peripheral area P are made of separate pieces. At the same time, the thickness of the PR layer may be controlled by adjusting the exposure time.

However, the display area D and the peripheral area P may be exposed to light through a single mask. A structure of such a mask will be described with reference to FIG. 11.

As shown in FIG. 11, a transmittance controlling layer 550 is formed on a substrate 510 for a photomask 500, and a pattern layer 520 is formed on the transmittance controlling layer 510. The transmittance controlling layer 550 is provided not only under the pattern layer 520 but also in the entire display area D, while only under the pattern layer 520 in the peripheral area P.

As a result, at least two patterns with different thicknesses, one having that of the transmittance controlling layer 510 and the other having that of the double layer of the pattern layer 520 and the transmittance controlling layer 510, are formed on the substrate 510.

A transmittance controlling layer may be provided in the area for the peripheral area P. At this time, the transmittance of the transmittance controlling layer for the peripheral area P should be higher than that for the display area D.

To manufacture a photomask 500 having the transmittance controlling layer 550, the transmittance controlling layer 550 and a pattern layer 520 that has an etch ratio different from the transmittance controlling layer 550 are sequentially deposited on the substrate 500. A PR layer (not shown) is coated on the pattern layer 520, and is exposed to light and developed. Then the pattern layer 520 is etched by using the PR layer as an etch mask. After removing the remaining PR layer, a new PR layer pattern (not shown) exposing portions of the transmittance controlling layer 550 that corresponds to contact holes of the peripheral area P is formed. Then, the transmittance controlling layer 550 is etched to complete the photomask 500.

The transmittance may be changed in another way depending on position by using a mask that has slits or a grid pattern smaller than the resolution of the exposure equipment.

However, portions of the PR layer over the metal patterns such as the gate wires 22, 24, and 26, the common wires 27 and 28, and the data wires 62, 64, 65, and 66 having a high reflectivity may be exposed to more light than other portions. To prevent this problem, a layer to block the reflected light by the metal patterns may be provided or a colored PR may be used.

The PR layer shown in FIGS. 8B and 8C is exposed to light by the above described method, and developed to form a PR pattern shown in FIGS. 12A and 12B. More concretely, there is no PR remaining over a portion of the gate pad 24 and a portion of the data pad 64. The thick portion of the PR pattern in the region A are located in the peripheral area P except for the gate pad 24 and the data pad 64. In the display area D, the thick portions are located over the data wire elements 62, 64, and 65, the drain electrode 66, and the portion of the semiconductor layer 40 between the data wire parts 62, 64, and 65 and the drain electrode 66. The thin portion of the PR pattern in the region C is located over portions of the drain electrode 66 and the data lines 62, as well as in the remaining portions of the display area D. The portion of PR pattern on the drain electrode 66 may be entirely removed. Furthermore, the thin portion of the PR pattern may also be located on the data pad 64 of the peripheral area P.

At this time, it is preferable that the thickness of the thin portions be ¼ to ½ of the initial thickness, in other words 350 Å to 10,000 Å, and more preferably 1,000 Å to 6,000 Å. For example, when the initial thickness of the PR layer is 16,000 Å to 24,000 Å, the thin portion may have thickness of 3,000 Å to 7,000 Å by setting the transmittance for the display area D to 30%. However, since the thickness of the PR pattern should be determined by the dry etch conditions, then the transmittance of the pellicles, the thickness of the Cr layer, the transmittance of the transmittance controlling layer, the exposure time, etc. should be controlled depending on the etch conditions.

The thin portion of the PR pattern may be formed by reflow after a normal exposure and a normal development process.

Then, the PR pattern and the underlayers, i.e., the passivation layer 70, the semiconductor layer 40, and the gate insulating layer 30 are dry etched.

At this time, as described above, the portions of the PR pattern in the region A should remain, and the portions of the passivation layer 70, the semiconductor layer 40, and the gate insulating layer 30 in the region B should be removed. The portions of the passivation layer 70 and the semiconductor layer 40 in the region C should be removed, while the portions of the gate insulating layer 30 in the region C should remain. In addition, only the portions of the passivation layer 70 on the drain electrodes 66 in the region C are removed.

For this purpose, it is preferable to use a dry etch that may etch out the PR pattern along with the underlayers. As shown in FIGS. 12A and 12B, the three layers in region B, i.e., the passivation layer 70, the semiconductor layer 40, and the gate insulating layer 30, and the three layers in region C, i.e., the thin portions of the PR pattern, the passivation layer 70, and the semiconductor layer 40, may all be etched at the same time by dry etching.

However, since the portions of the conductor layer 60 that will form a drain electrode 66 and the portions of the data lines 62 in the display area D, as well as the peripheral area P data pads should not be removed, the etch condition should be set to selectivity etch the conductor pattern 60. The thick portions of the PR pattern in the region A are also etched away to a certain depth.

The above embodiment removes the passivation layer 70 and the semiconductor layer 40, along with the gate insulating layer 30, to form the contact holes 71 and 72 and the semiconductor pattern 42 and 48 in the display area D, and removes the passivation layer 70, the semiconductor layer 40, and the gate insulating layer 30 to form contact holes 74 and 76 with only one photolithography step.

Next, the remaining PR pattern of the region A is removed. Then, as shown in FIGS. 3 to 5, an ITO layer with a thickness of 400 Å to 500 Å is deposited and etched to form redundant data lines 82, redundant gate pads 84, redundant data pads 86, a pixel signal line 87, and a pixel electrode 88 by using a fourth photolithography step.

In this embodiment, the gate insulating layer pattern 30 having the contact holes 74 exposing the gate pads 24 is formed along with the passivation layer pattern 70 and the semiconductor layer patterns 42 and 48 by a single photolithography step. However, the gate insulating layer pattern 30 may be patterned along with at least one of any of the group of layers for the semiconductor pattern, the ohmic contact layer pattern, the data wire, the passivation layer pattern, and the pixel electrodes. In particular, the present invention is useful for patterning a thin film or films using dry etching.

The second and third embodiments of this present invention simplify the manufacturing process together with formation of semiconductor patterns and data wiring when separating the source and drain electrodes in the making of the same layer by means of formation of a thin photoresist layer pattern between the two electrodes.

The structure of a thin film transistor array panel for a liquid crystal display according to the second embodiment of the present invention will be described with reference to FIGS. 13 to 15.

Figure 13:
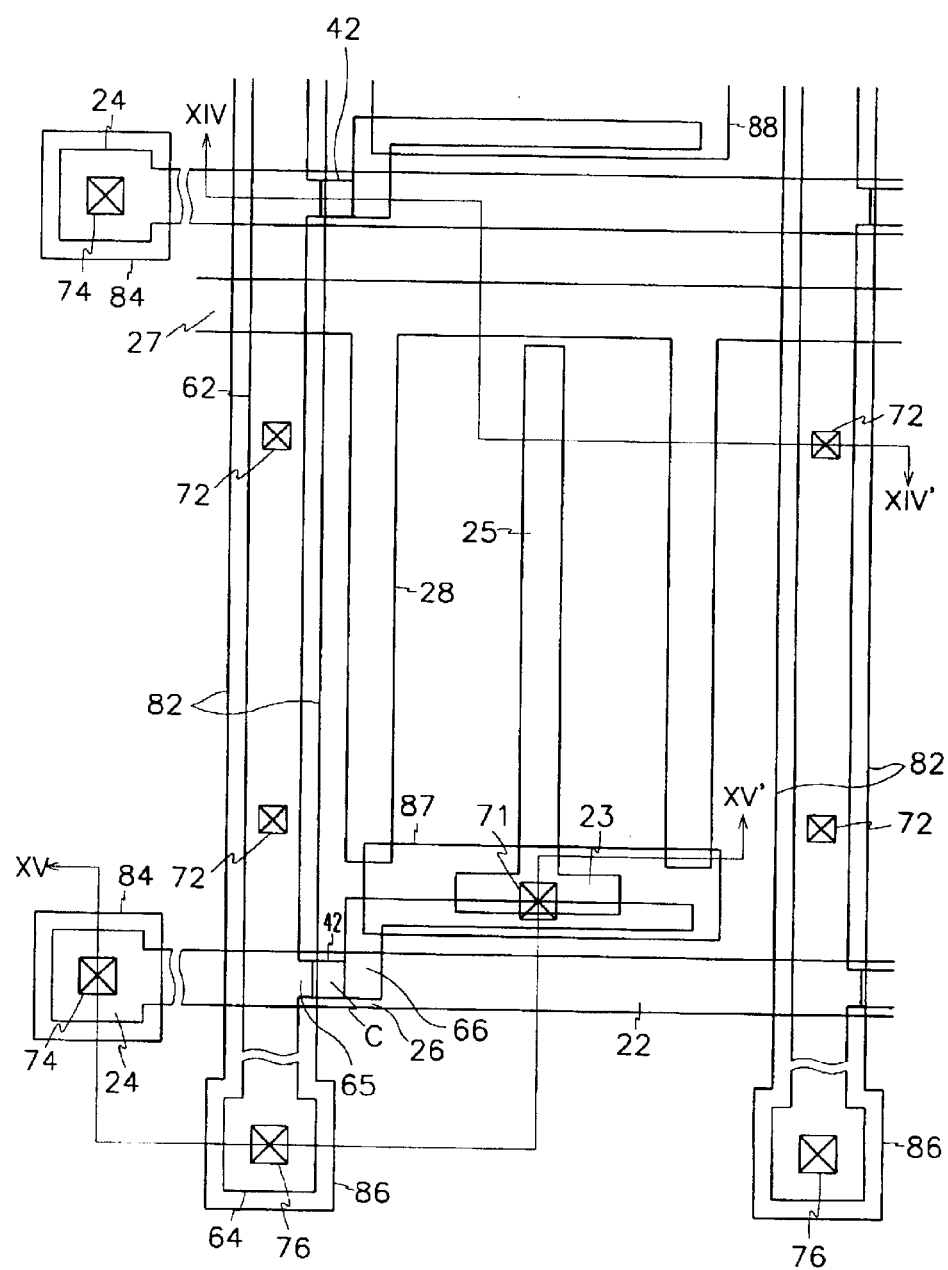
FIG. 13 is a layout view of a TFT array panel for an LCD according to a second embodiment of the present invention.
Figure 14:
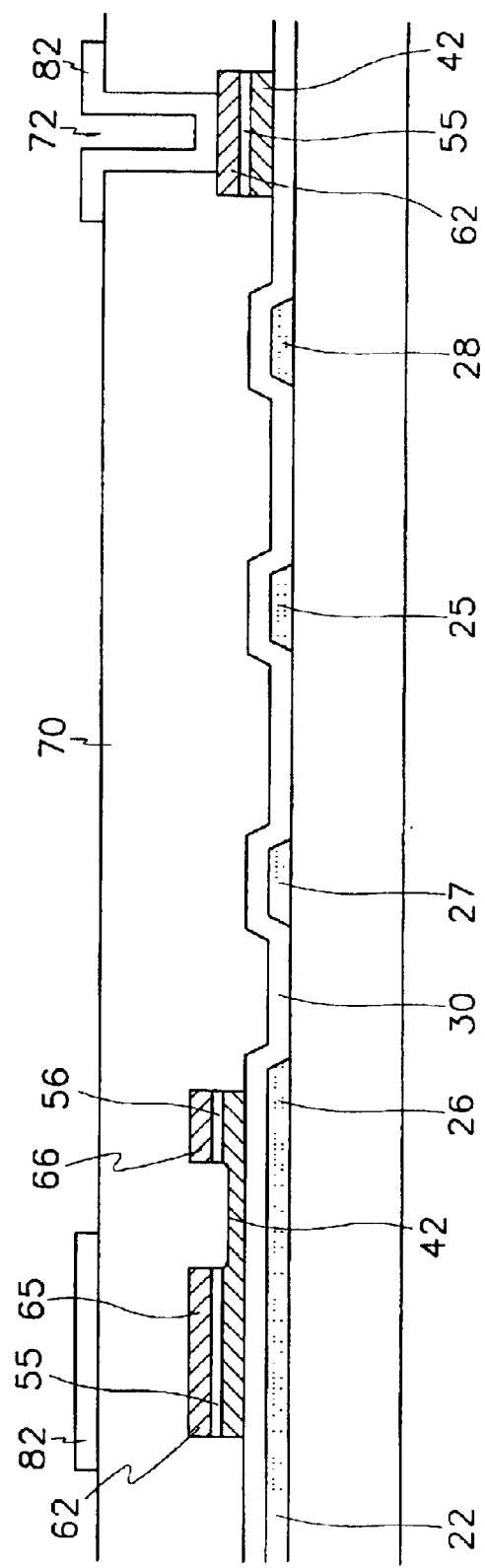
FIGS. 14 and 15 are cross-sectional views taken along the lines XIV–XIV' and XV–XV' in FIG. 13, respectively.
Figure 15:
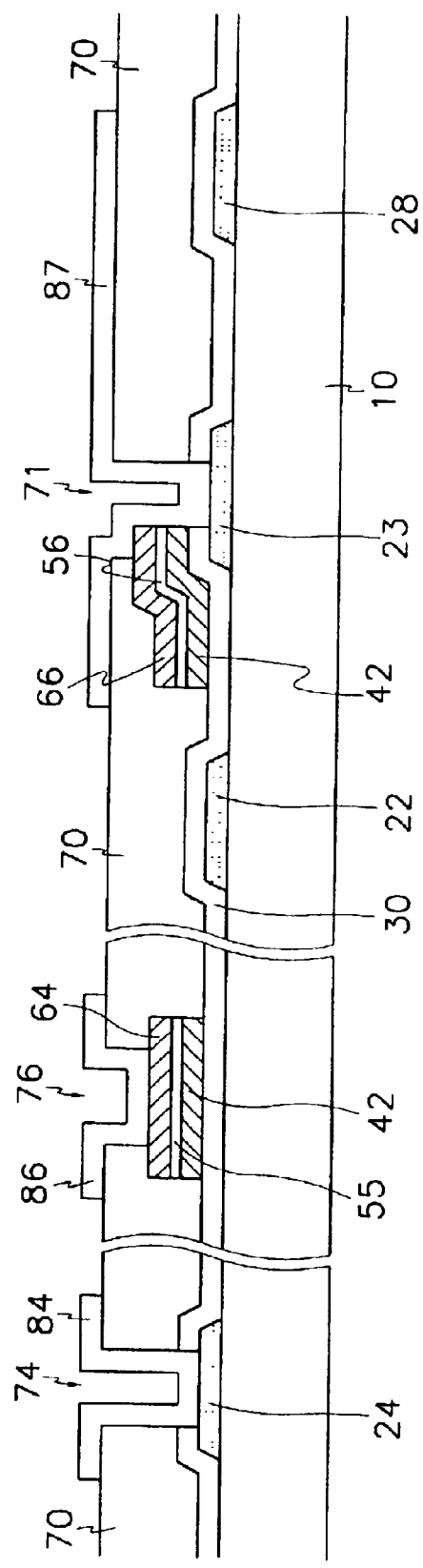

FIG. 13 is a layout view of a thin film transistor array panel for a liquid crystal display according to the second embodiment of the present invention, and FIGS. 14 and 15 are the cross-sectional views taken along lines XIV–XIV' and XV–XV' of FIG. 13.

Gate wires including a gate line 22, a gate pad 24, and a gate electrode 26, a common wire including a common signal line 27 and a plurality of common electrodes 28, and a pixel wire are formed on an insulating substrate 10. The pixel wire includes a pixel electrode 25 receiving the image signals and which is parallel to the common electrodes 28, and a pixel signal line 23 (a pixel electrode connection portion) connected to a drain electrode 66 (to be described later) and which transmits the image signals.

The gate wires 22, 24, and 26, the common wires 27 and 28, and the pixel wires 23 and 25 may have a multiple-layered structure as well as a single-layered structure. When forming a multiple-layered structure, it is preferable that one layer is made of a material having low resistivity and another layer is made of a material having good contact properties with other materials. A reason for this is that pad material having good contact properties with other materials and wire material having low resistivity may be used to formed a re-enforce pad portion, which is used for external connections. In the case of using ITO as a pad material, wire material such as Cr, Mo, Ti, and Ta may be used. Double layers of Cr/Al (or Al alloy) and Al/Mo are examples of such.

A gate insulating layer 30 of silicon-nitride (SiNx) covers the gate wire parts 22, 24, and 26, the common wires 27 and 28, and the pixel wires 23 and 25.

A semiconductor pattern 42 is formed on the gate insulating layer 30, and ohmic contact layer patterns 55 and 56 are formed on the semiconductor pattern 42.

Data wires 62, 64, 65, and 66 are formed on the ohmic contact layer patterns 55 and 56. Here, the drain electrode is extended over the pixel connection portion 23.

The semiconductor pattern 42, except for the channel part C of the thin film transistor, has the same layout as the corresponding data wire parts 62, 64, 65, and 66 and the corresponding ohmic contact layer patterns 55 and 56.

A passivation layer 70 is formed on the data wire parts 62, 64, 65, and 66. The passivation layer 70 has contact holes 72, 76, and 74 respectively exposing the data line 62, the data pad 64, and the gate pad 24 along with the gate insulating layer 30, and contact hole 71 exposing the drain electrode 66 and the pixel signal line 23 together along with the gate insulating layer 30.

A redundant data wire electrically connected to the data wire is formed on the passivation layer 70. The redundant data wire includes a plurality of redundant data line parts 82 and 86 connected to the data lines 62 and 64 through the contact holes 72 and 76, and a redundant pixel signal line 87 connected to the drain electrode 66 and the pixel signal line 23 through the contact hole 71. Here, the redundant pixel signal 87 is made to overlap the common electrode 28 to form a storage capacitor, although the drain electrode 66 alone can be used to maintain capacitance. In order to guarantee that there is enough capacitance, a variety of modifications of the common electrode 28, the drain electrode 66, or the redundant pixel signal line 87 can be formed. The redundant data lines 82, 84, 86, and 87 are made of a transparent conductive material such as indium tin oxide (ITO) and indium zinc oxide (IZO).

A manufacturing method of a thin film transistor array panel according to the second embodiment of the present invention will now be described with reference to the FIGS. 16A to 22C and FIGS. 13 to 15.

Figure 16A:
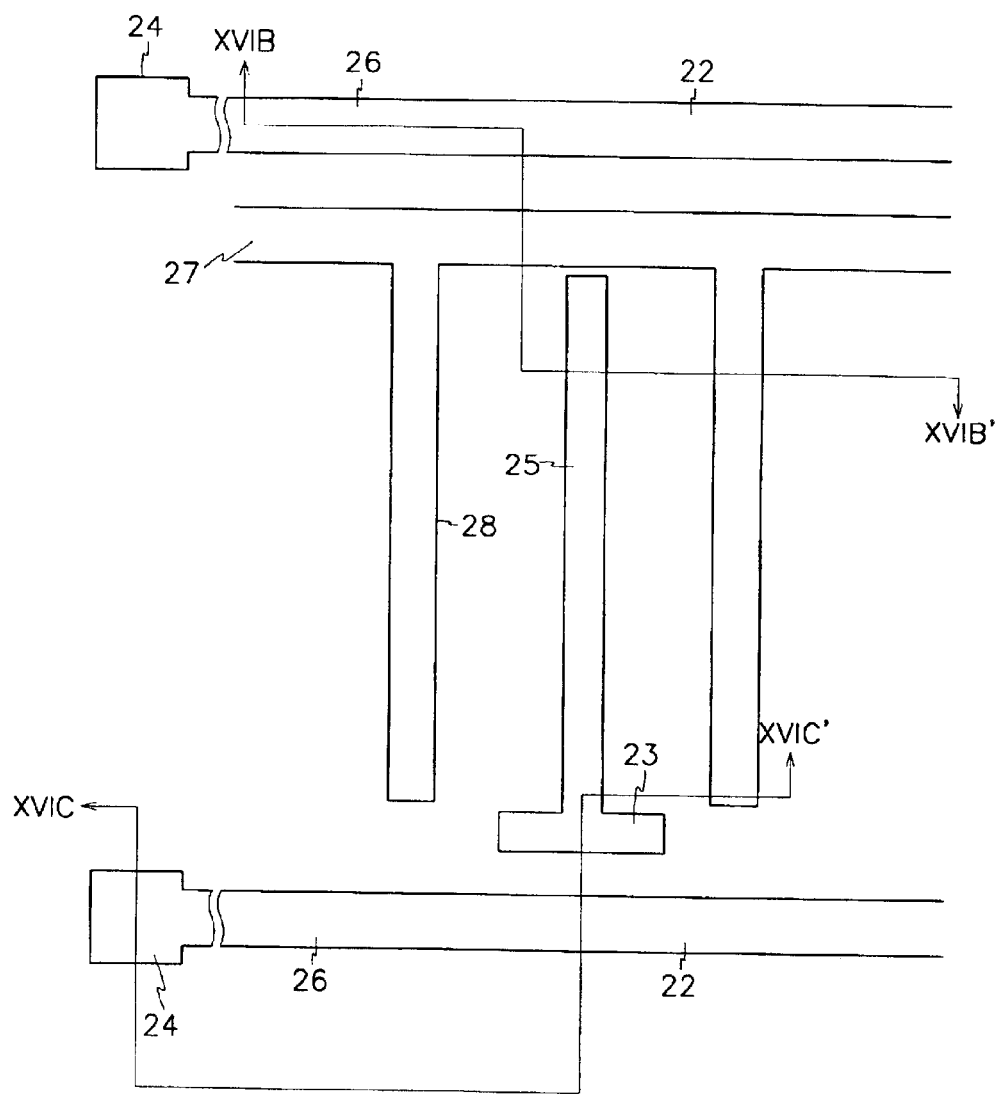
FIG. 16A is a layout view of a TFT array panel in a manufacturing step of the manufacturing method according to the second embodiment of the present invention.
Figure 16B:
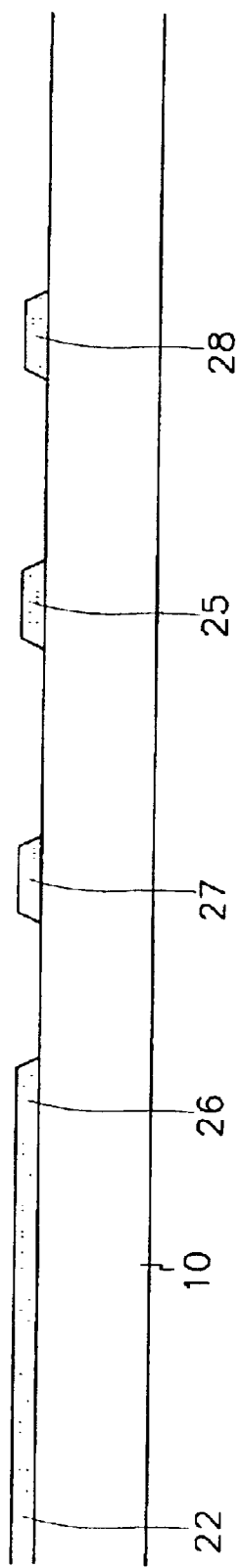
FIGS. 16B and 16C are the cross-sectional views taken along the lines XVIB–XVIB' and XVIC–XVIC' in FIG. 16A, respectively.
Figure 16C:
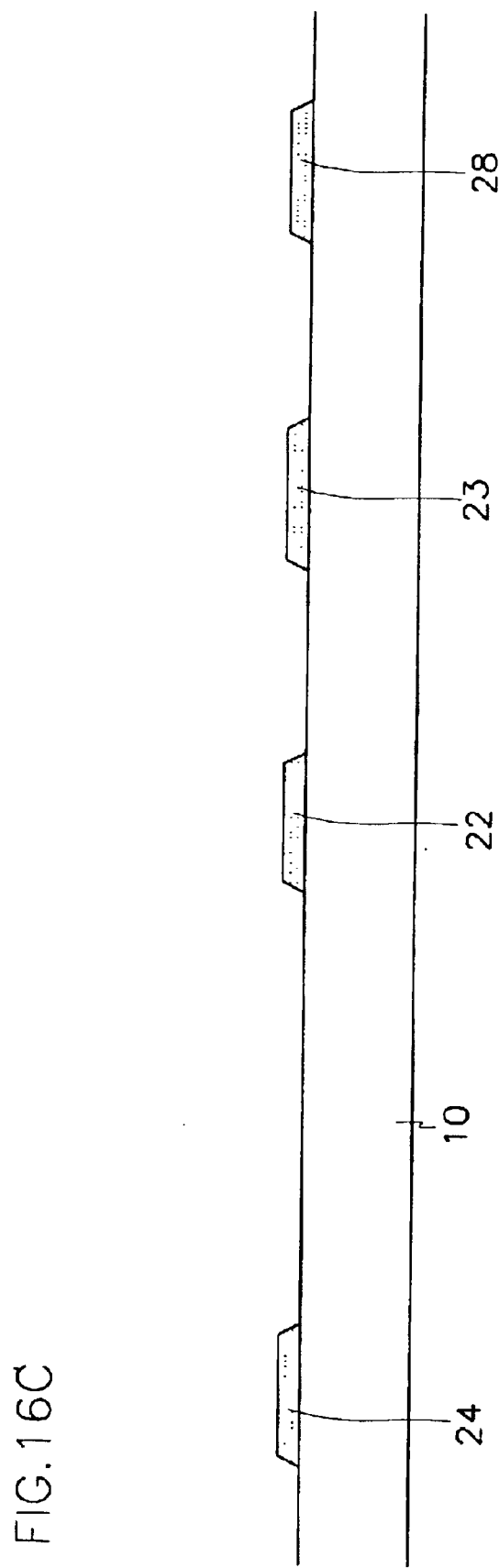

At first, as shown in FIGS. 16A to 16C, a layer of conductor, such as a metal, is deposited on a substrate 10 by such methods as sputtering to a thickness of 1,000 Å to 3,000 Å, and gate wire parts, including a gate line 22, a gate pad 24 and a gate electrode 26, a common wire including a common signal line 27 and common electrodes 28, and a pixel wire including a pixel signal line 23 and a pixel electrode 25, are formed by dry or wet etching using a first mask.

Figure 17A:
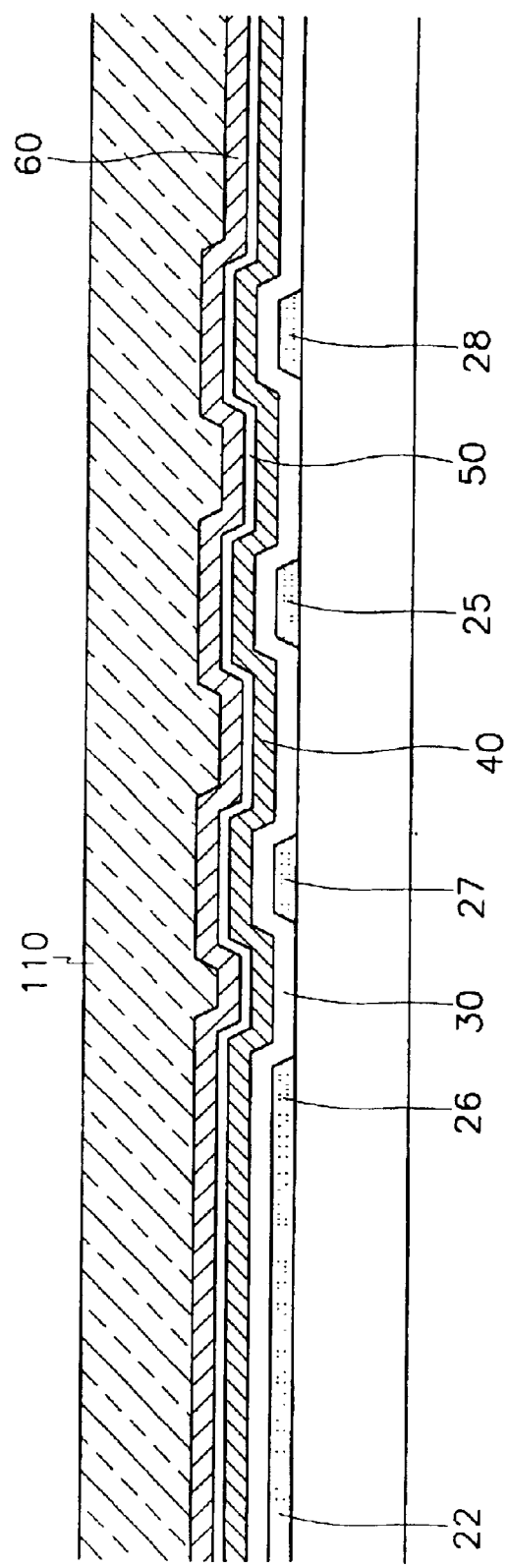
FIGS. 17A and 17B are cross-sectional views taken along the lines XVIB–XVIB' and XVIC–XVIC' in FIG. 16A, respectively, in the next manufacturing steps following that which is represented in FIGS. 16A and 16B.
Figure 17B:
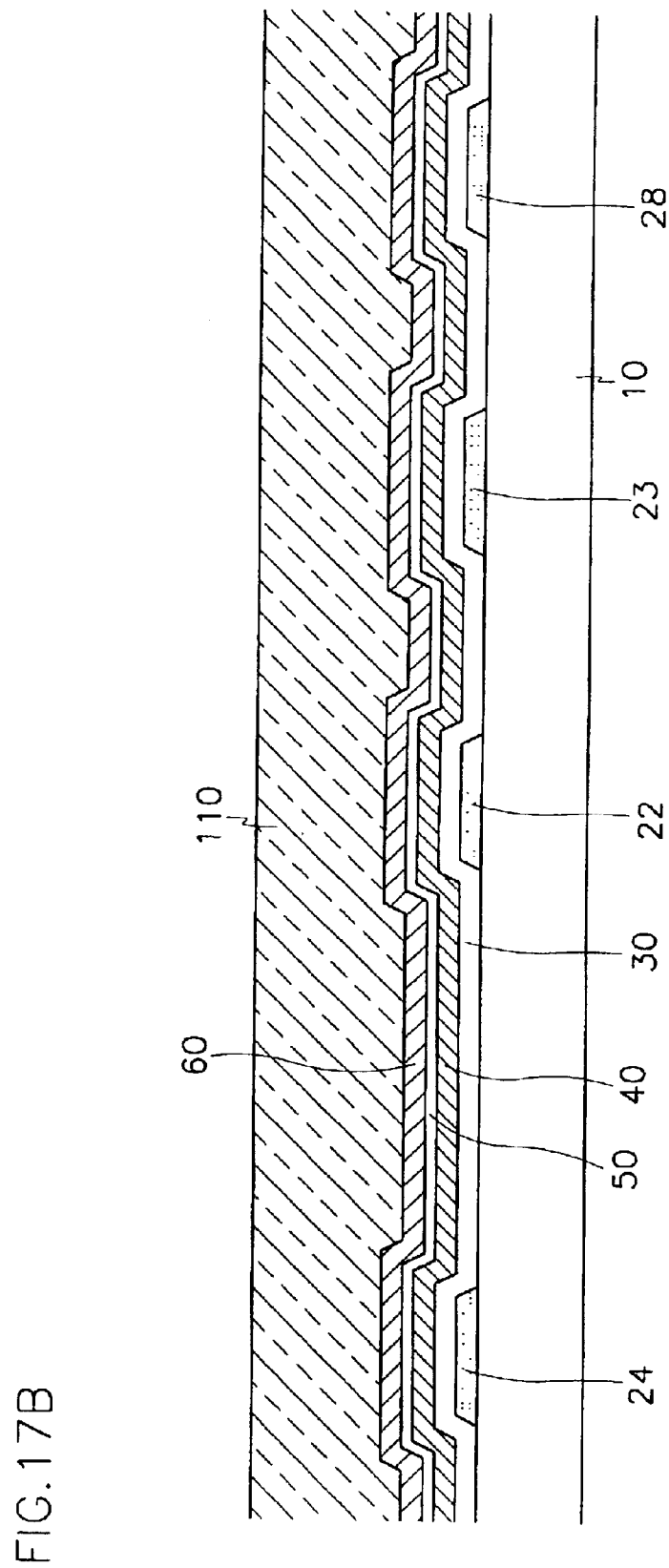

Next, as shown in FIGS. 17A and 17B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering, and a photoresist layer 110 having a thickness of 1 μm to 2 μm is then coated on the conductive layer 60.

Figure 18A:
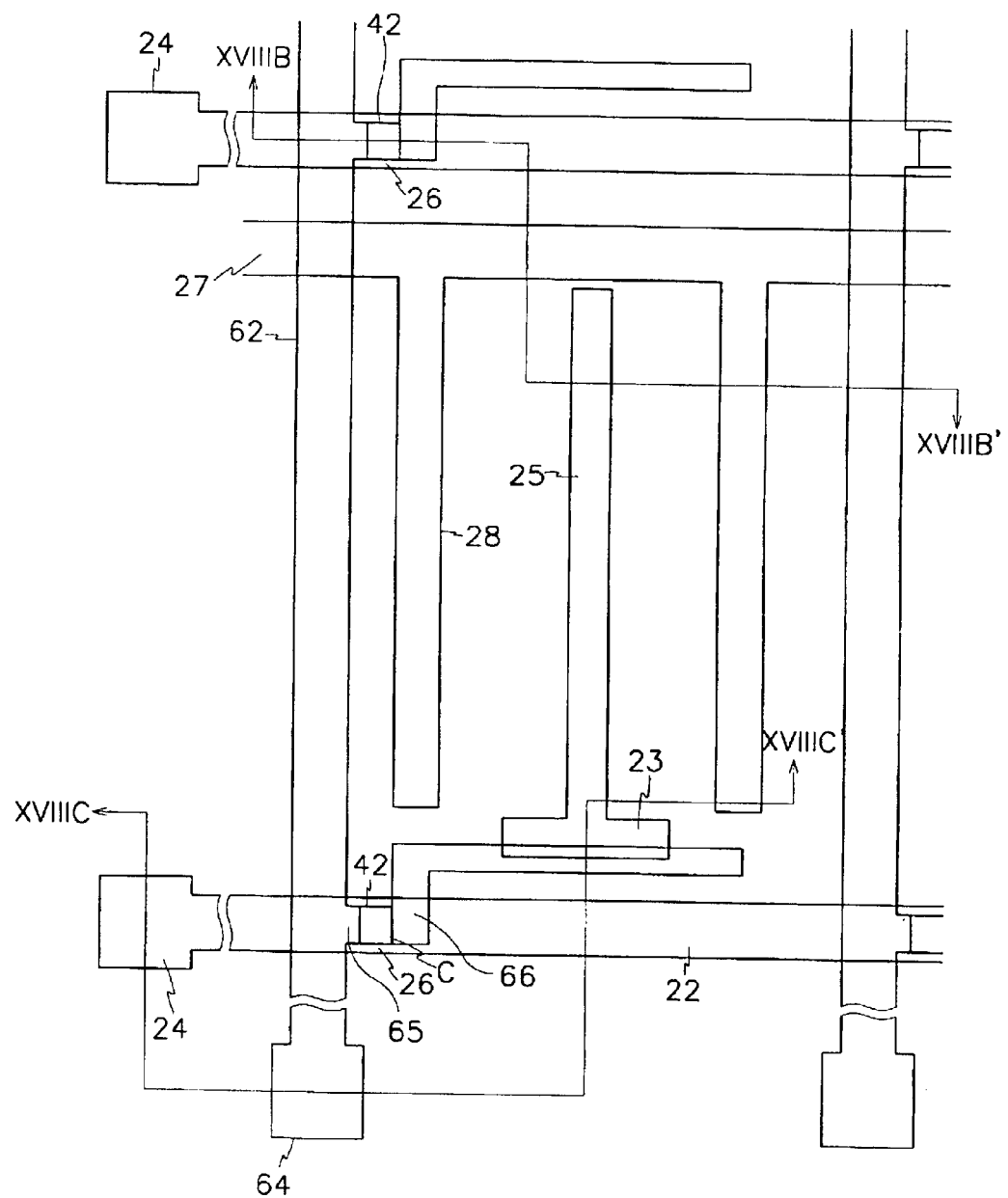
FIG. 18A is a layout view of a TFT array panel in a manufacturing step following that which is represented in FIGS. 17A to 17B.
Figure 18B:
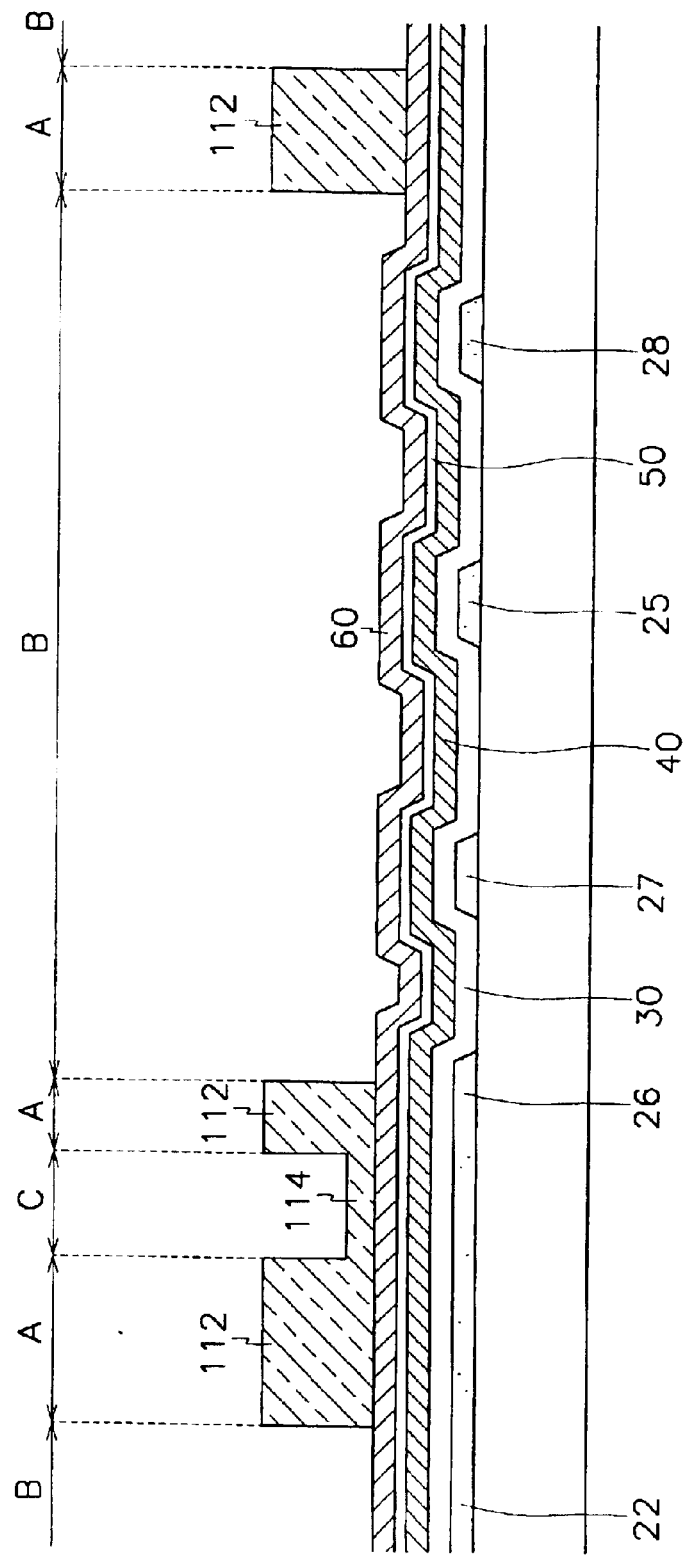
FIGS. 18B and 18C are cross-sectional views taken along the lines XVIIIB–XVIIIB' and XVIIIC–XVIIIC' in FIG. 18A, respectively, in the next manufacturing steps following that which is represented in FIGS. 17A and 17B.
Figure 18C:
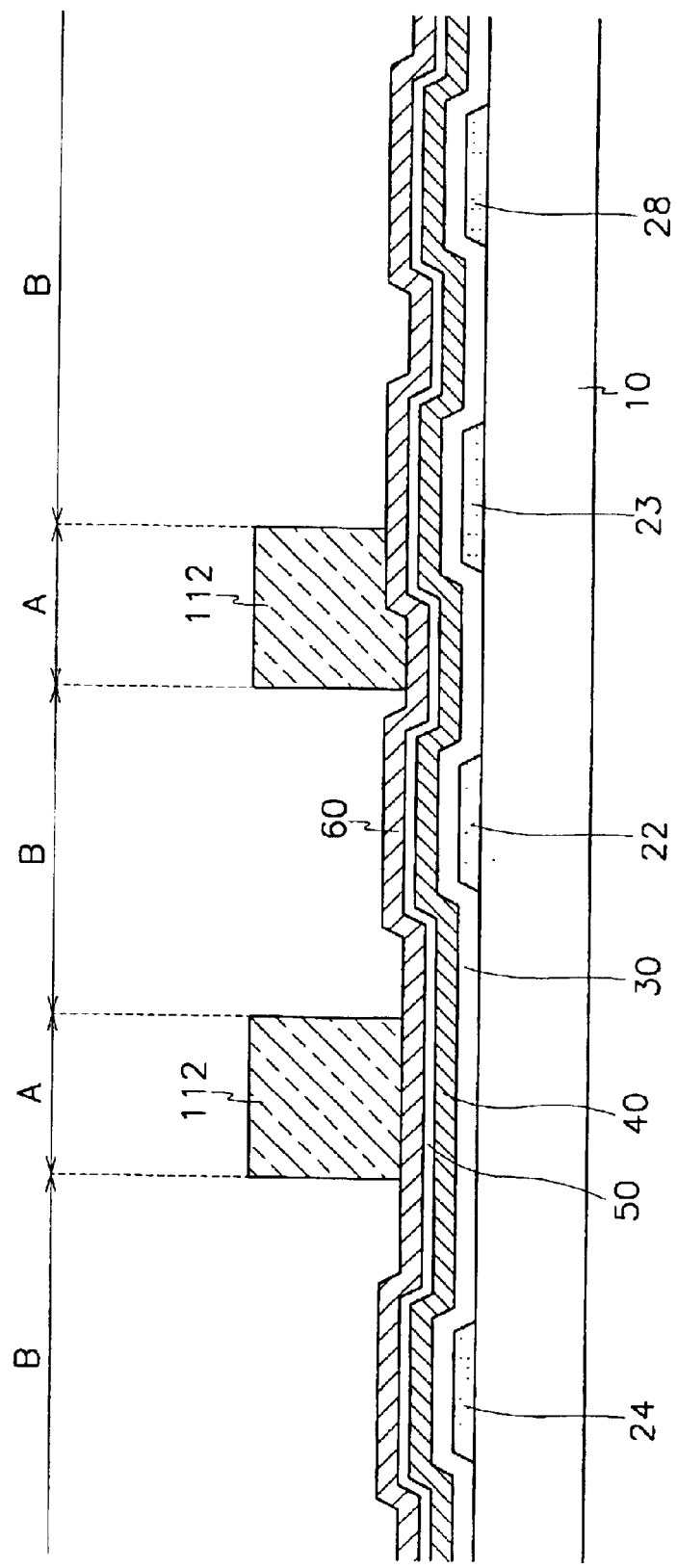

Thereafter, the photoresist layer 110 is exposed to light through a second mask and developed to form photoresist patterns 112 and 114 as shown in FIGS. 18B and 18C. At this time, a first portion 114 of the photoresist pattern located between a source electrode 65 and a drain electrode 66, i.e., a thin film transistor channel part C as shown in FIG. 6C, is thinner than a second portion 112 of photoresist pattern located over the data wire portion A where a data wires 62, 64, 65, and 66 will be formed, and a third portion, the remaining portion of the photoresist pattern located at portion B, is thinner than the first portion. The third portion may have a thickness that will vary according to the etching method. For example, the third portion has substantially zero thickness when using a wet etch, but the third portion may have a non-zero thickness when using a dry etch. At this time, the thickness ratio between the first portion 114 and the second portion 112 depends on the etching process conditions, which will be described later. However, it is preferable that the thickness of the first portion 114 is equal to or less than half of that of the second portion 112. For examples, the thickness of the first portion 114 is in the range of 2,000 Å to 5,000 Å, more preferably in the range of 3,000 Å to 4,000 Å, and the thickness of the second portion 112 is in the range of 1.6 μm to 1.9 μm. If positive photoresist is used, it is preferable that the light transmittance of the second mask be less than 3% for the data wire portions A, and be 20% to 60%, more preferably 30% to 40% for the channel portion C, and more than 90% for the remaining portion B.

There are many methods to vary the thickness of the photoresist layer depending on position, and two methods using positive photoresist will now be described.

The first method is to control the amount of incident light by forming a pattern such as a slit or a lattice which is smaller than the resolution of the exposure device, or by providing a partly-transparent layer on the mask. At this time, to only control the light transmittance, it is desirable that the size of the slit and the opaque portion between the slits are smaller than the resolution of the illumination system. When a partly-transparent layer is used, the thickness of a partly-transparent layer may be adjusted to control amount of exposing light. Alternately, a mask including films having different transmittances may be used. At this time, a material such as Cr, MgO, MoSi, and a-Si may be used.

When the photoresist layer is exposed to light by using a mask having a slit or lattice type partly-transparent layer, the polymers of the photoresist layer are disintegrated, and the degree of disintegration of the polymers is changed if the amount of the light increases. If the exposing step is finished when the polymers which are directly exposed to the light are completely disintegrated, the polymers of the photoresist layer portion which are exposed through the slits pattern are not completely disintegrated because the amount of incident light is less than that of the directly exposed portion. However, if the exposure time is too long, all the polymers of the photoresist layer are completely disintegrated. Therefore, this should be avoided. At this time, it is preferable that the thickness of the photoresist layer is in the range of 1.6 $\mu$m to 2 $\mu$m thicker than normal so as to control the thickness of the photoresist layer after development. Subsequently, when the photoresist layer is developed, the portion of the photoresist layer with polymers that were not disintegrated will have a thickness that is almost the same as its original condition, the portion irradiated with light from the slit pattern or the lattice of the party-transmissive layer will have a medium thickness left, and the part completely disintegrated by the light will have almost no thickness left at all. Therefore, the above method may be used to form the photoresist patterns 112 and 114 that have different thickness depending their position.

The second method to vary the thickness of the photoresist layer employs reflow. In this case, the photoresist layer is developed by using a normal mask having substantially transparent portions and substantially opaque portions to form a photoresist pattern having portions of zero and nonzero thicknesses. Next, the photoresist pattern is subjected to reflow such that the photoresist flows into the zero thickness portions to form a new photoresist pattern.

Using these methods, the photoresist pattern having different thickness at different positions is obtained.

Next, the photoresist patterns 114 and 112, and the layers thereunder including the conductor layer 60, the ohmic contact layer 50, and the semiconductor layer 40 are next subjected to an etching process. When this is done, a data wire and the layers thereunder at the data wire part A remain, and only the semiconductor layer on the channel part C needs to be left. In addition three layers 60, 50, and 40 in the remaining part B are removed from the gate insulating layer 30.

Figure 19A:
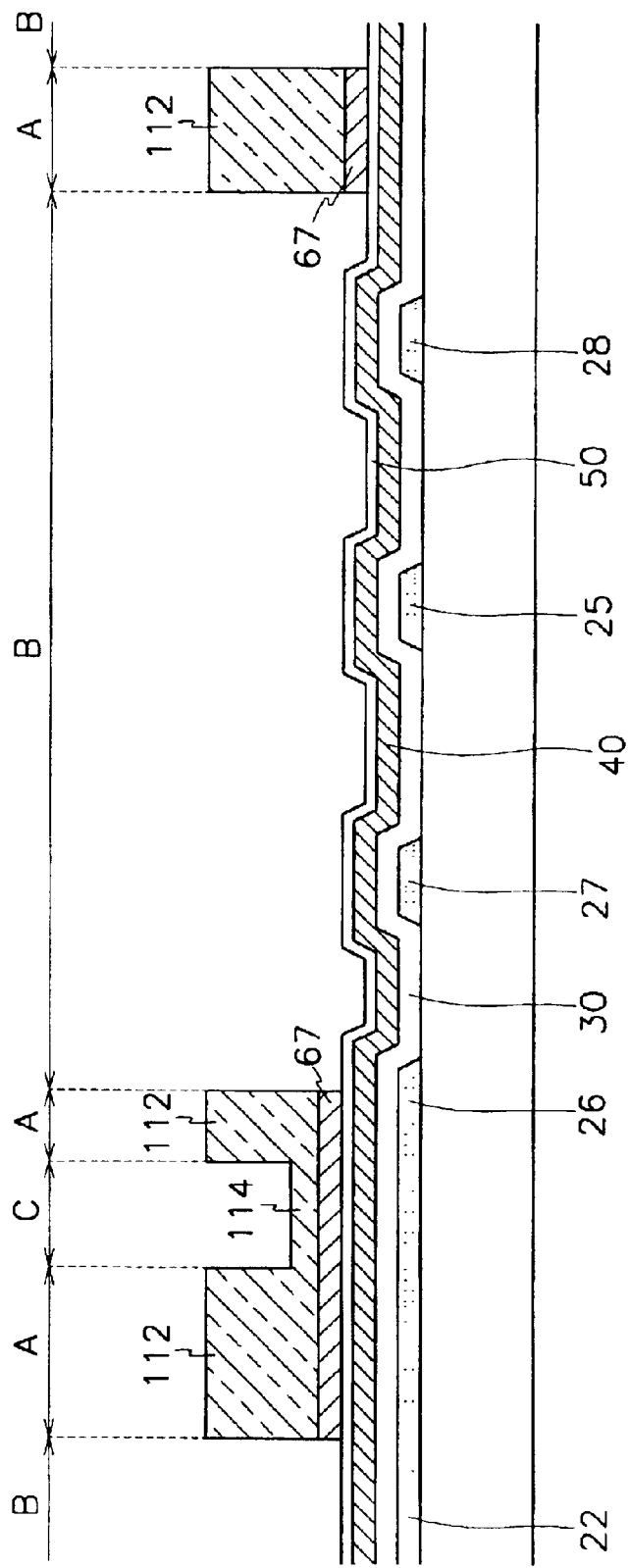
Figure 19B:
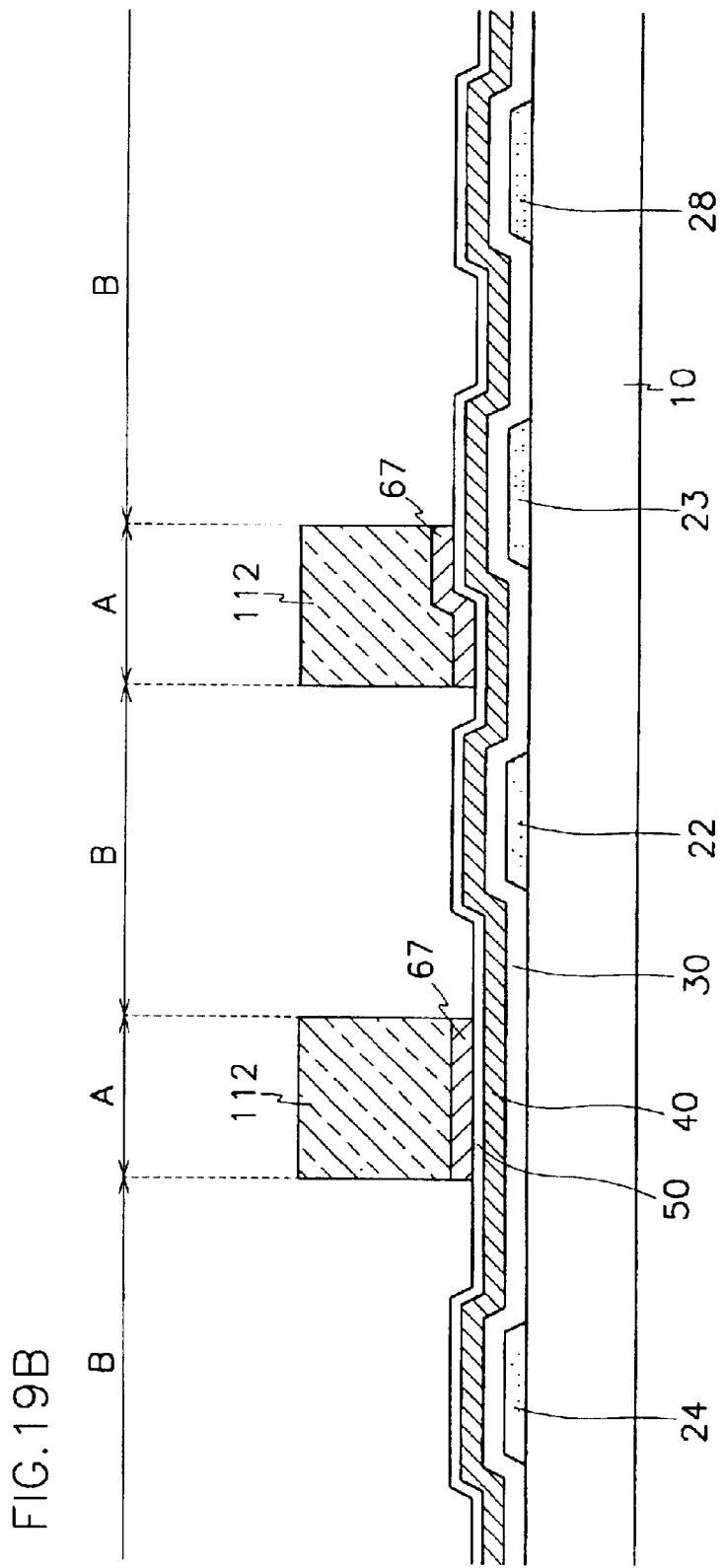

As shown in FIGS. 19A and 19B, the ohmic contact layer 50 of the part B is exposed by removing the conductor layer 60 thereon. At this time, both wet and dry etching can be used, and it is preferable that the etch is performed under a condition such that the conductor layer 60 is etched but the photoresist layers 112 and 114 are not etched. However, since it is hard achieve this in the case of dry etching, the etch may be performed under a condition such that the photoresist patterns 112 and 114 are also etched. In this case, the first portion 114 may be made thicker than in the wet etch case so that the conductor layer 60 is not exposed.

If the conductor layer 60 is made of Mo or MoW alloy, Al or Al alloy, or Ta, both dry or wet etching methods can be used. However, if the conductor layer 60 is made of Cr, wet etching is better because Cr is not easily removed by dry etching. CeNHO$_3$ is available as a wet etchant for etching a Cr conductor layer 60. The mixed gas systems of CF$_4$ and HCl or CF$_4$ and O$_2$ are available for dry etching a Mo or MoW conductor layer 60, and in this case, the etch rate of the latter system on the photoresist layer is similar to that on the conductor layer 60.

Referring to FIGS. 19A and 19B, only the portions of the conductor 67 under the photoresists 112 and 114 at the channel part C and the data wire part B for source/drain electrodes are left as a result, and the remaining portion of the conductor layer 60 at part B is wholly removed to expose the ohmic contact layer 50 thereunder. At this time, the conductor pattern 67 has the same layout as the data wire parts 62, 64, 65, and 66 except that the source electrode 65 and the drain electrode 66 are connected to each other. When dry etching is used, the photoresist layers 112 and 114 are also etched to a certain thickness.

Next, the exposed portions of the ohmic conductor layer 50 at part B and the semiconductor layer 40 thereunder of FIGS. 20A and 20B are removed by dry etching along with the first portion 114 of the photoresist layer. The etching condition may be such that the photoresist patterns 112 and 114, the ohmic contact layer 50, and the semiconductor layer 40 are all etched (the semiconductor layer and the ohmic contact layer have almost the same etch rate), but the gate insulating layer 30 is not etched. It is preferable that the etch rates of the photoresist patterns 112 and 114 and the semiconductor layer 40 are almost the same. This occurs, for example, with the mixed gas systems of SF$_6$ and HCl or SF$_6$, and O$_2$. When the etch rates of the photoresist patterns 112 and 114 and the semiconductor layer 40 are almost the same, the thickness of the first portion 114 may be equal to or less than the sum of the thicknesses of the semiconductor 40 and the ohmic contact layer 50.

Then, as shown in FIGS. 20A and 20B, the conductor pattern 67 is exposed by removing the first portion 114 of the channel part C, and the gate insulating layer 30 is exposed by removing the ohmic contact layer 50 and the semiconductor layer 40 of the part B shown in FIG. 20B. At the same time, the thickness of the second portion 112 over the data wire part A is reduced by etching. Furthermore, the completed semiconductor pattern 42 is obtained at this step. The reference numeral 57 represents the ohmic contact layer pattern under the conductor pattern 67 for the source/drain the electrode.

The remaining photoresist layer on the conductor pattern 67 is then removed by ashing or plasma etching. Plasma gas or microwaves are used in the ashing step, and the compositions mainly used can contain oxygen.

Figure 21A:
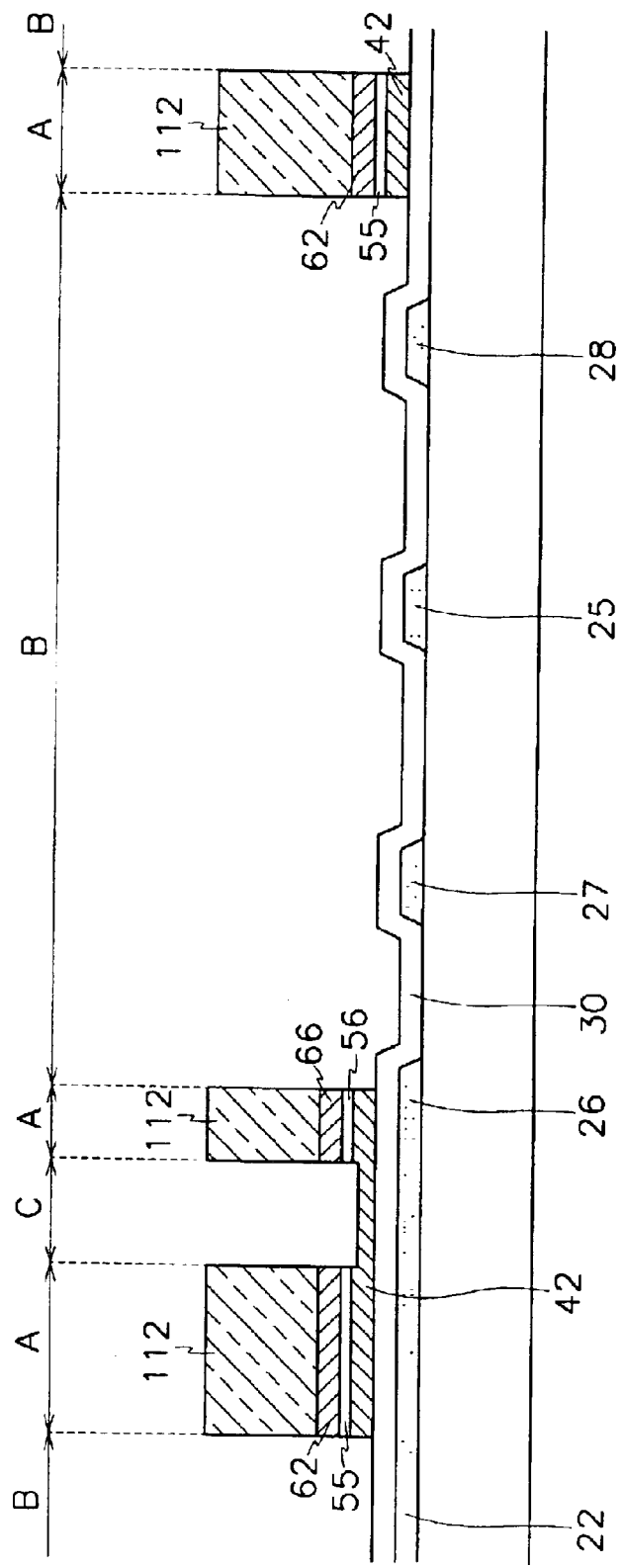

Next, as shown in 21A and 21B, the conductor pattern 67 for source/drain electrodes at the channel part C and the ohmic contact layer pattern 57 for source/drain electrodes of FIG. 20B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. It is preferable in the former case that etch conditions having large etch selectivity between the conductor pattern 67 and the ohmic contact layer pattern 57 are employed. This is because if the etch selectivity is not large enough, it is hard to detect the end point of the etch and to control the thickness of the semiconductor pattern 42 around the channel part C. This can be achieved, for example, by using a mixed gas system of $SF_6$ and $O_2$. In the latter case of doing the wet etch and the dry etch sequentially, the lateral sides of the conductor pattern 67 subjected to wet etch are also etched, but those of the ohmic contact layer pattern 57 which is dry etched are hardly etched at all. Thereby, the profile of these two patterns 67 and 57 makes a step like form. The mixed gas system of $CF_4$ and $O_2$ is an example of an etch gas system for etching the ohmic contact layer pattern 57 and the semiconductor pattern 42. The semiconductor pattern 42 may also be formed to have a uniform thickness by etching with the mixed gas system of $CF_4$ and $O_2$. At this time, as shown in FIG. 21B, the thickness of the semiconductor pattern 42 may be reduced and the second portion 112 of photoresist pattern is also etched to a certain thickness. The etch conditions may also be set not to etch the gate insulating layer 30, and it is preferable to make the photoresist pattern thick enough not to expose the data wire parts 62, 64, 65, and 66.

As a result, the source electrode 65 and the drain electrode 66 are divided, and the completed data wire parts 62, 64, 65, and 66 and the completed contact layer pattern 55 and 56 thereunder are obtained.

Next, the remaining second portion 112 of the photoresist layer on the data wire is removed. However, this removal of the second portion 112 may be performed after the step removing the conductor pattern 67 for source/drain electrodes on the channel part C of FIG. 21B and before the step removing of the ohmic contact layer pattern 57 under the conductor pattern 67.

To summarize, the thin process can be done by either using both wet etching and dry etching in turn, or by using only dry etching.

In the former case, the conductor layer of the part B is first remove by wet etching, and the ohmic contact layer and the semiconductor layer thereunder are removed by dry etching. At this time, the photoresist layer of the part C is consumed to a certain thickness, and the part C may have or may not have any residual photoresist, which substantially depends on the initial thickness of the photoresist layer of the part C. When the part C has residual photoresist, the residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer and the semiconductor layer of the part B are removed by dry etching. As the former case, the part C may have or may not have residual photoresist, and the residual photoresist is removed by ashing when the part C has residual photoresist. Finally, the conductor layer of the part C is dry etched to separate the source and the drain electrodes, and the ohmic contact layer of the part C is removed by using dry etching.

Also, if the data wire is etched, the semiconductor pattern, the contact layer pattern, and the data wire may be completed with one step at the same time. That is to say, it is desirable that the photoresist pattern 114 and the contact layer 50 thereunder of the part C are dry etched, and the portion of the photoresist pattern 112 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process has the advantage of ease of achieving proper etching condition, even though it is more complicated.

Figure 22A:
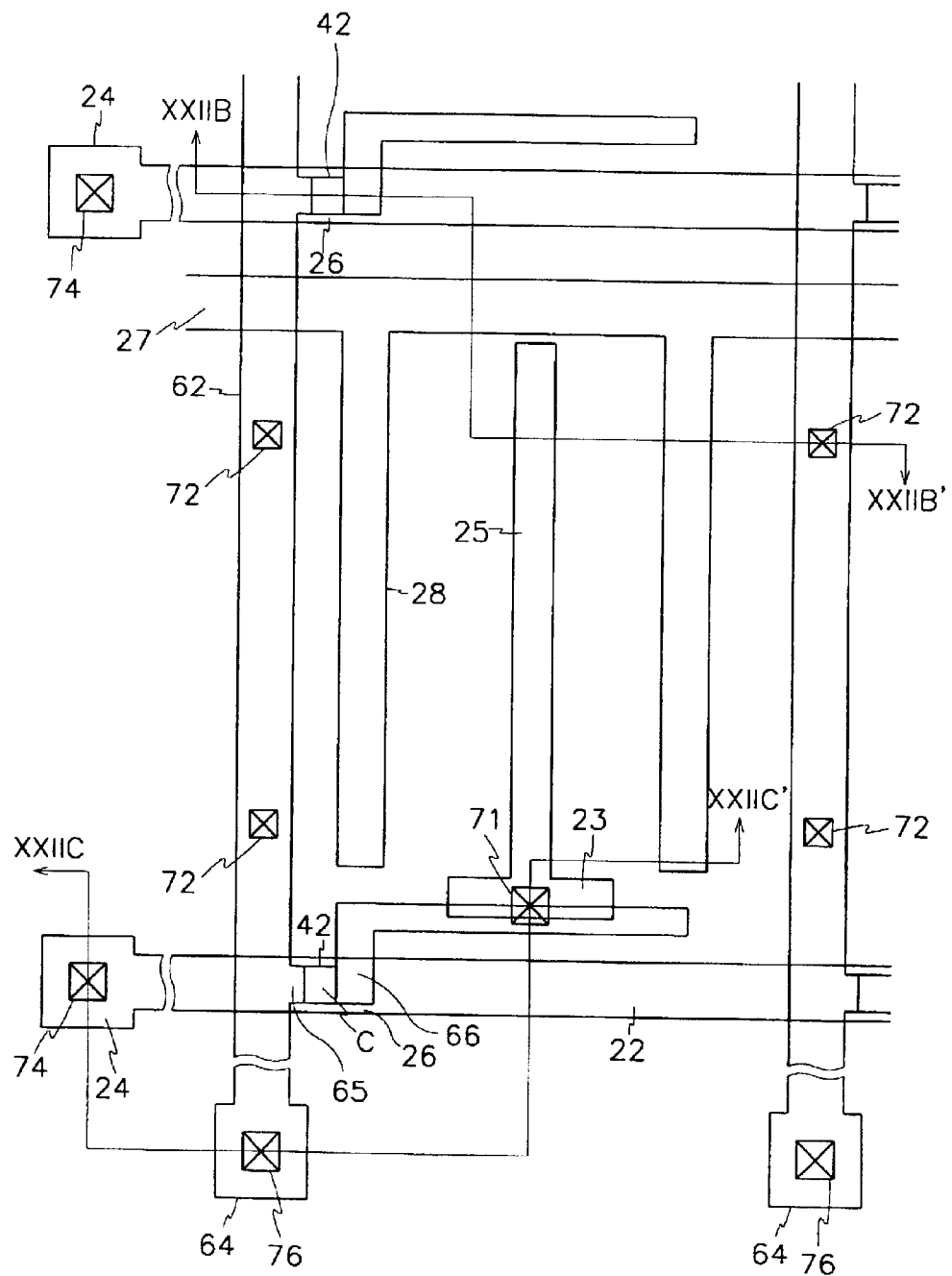
FIG. 22A is a layout view of a TFT array panel in a manufacturing step following that which is represented in FIGS. 21A to 21B.
Figure 22B:
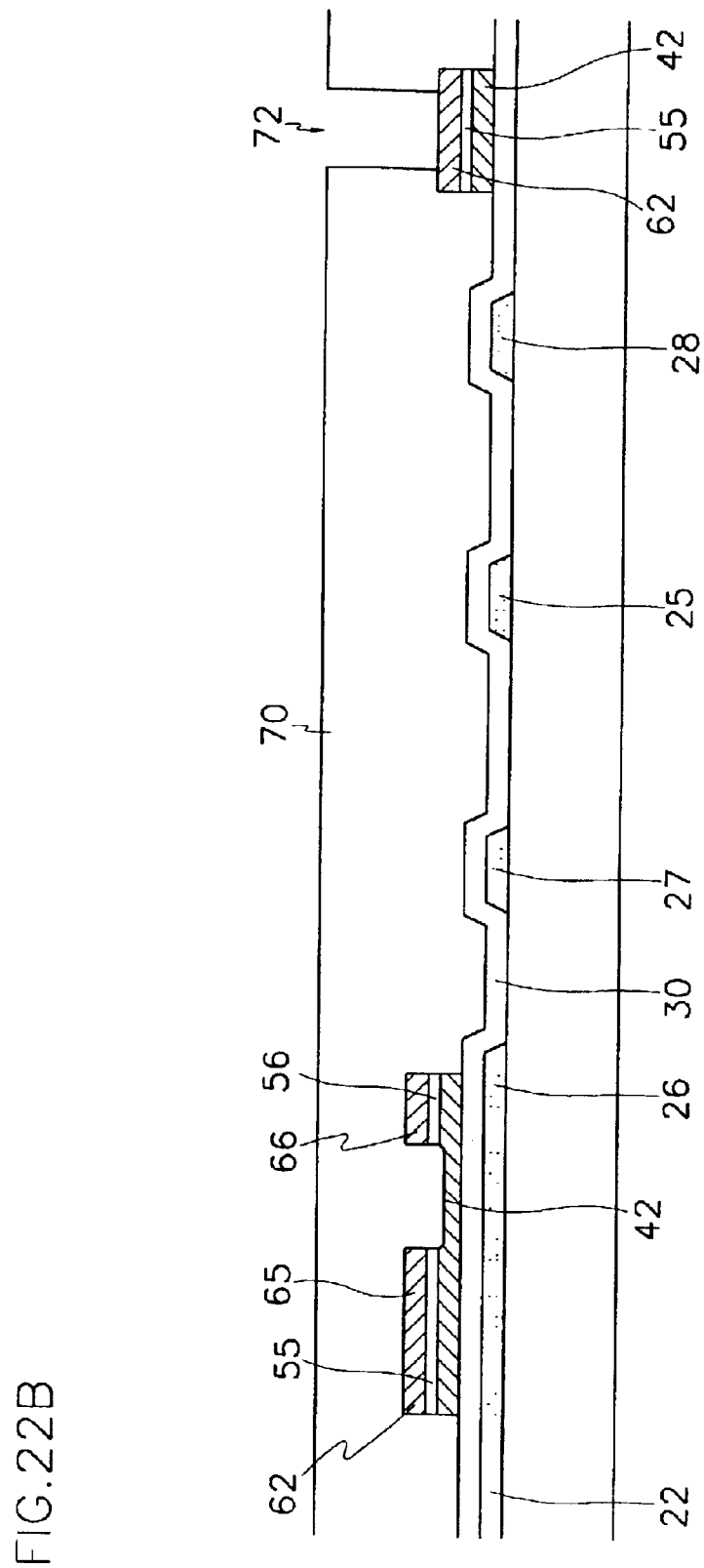
FIGS. 22B and 22C are cross-sectional views taken along the lines XXIIB–XXIIB' and XXIIC–XXIIC' in FIG. 22A, respectively.
Figure 22C:
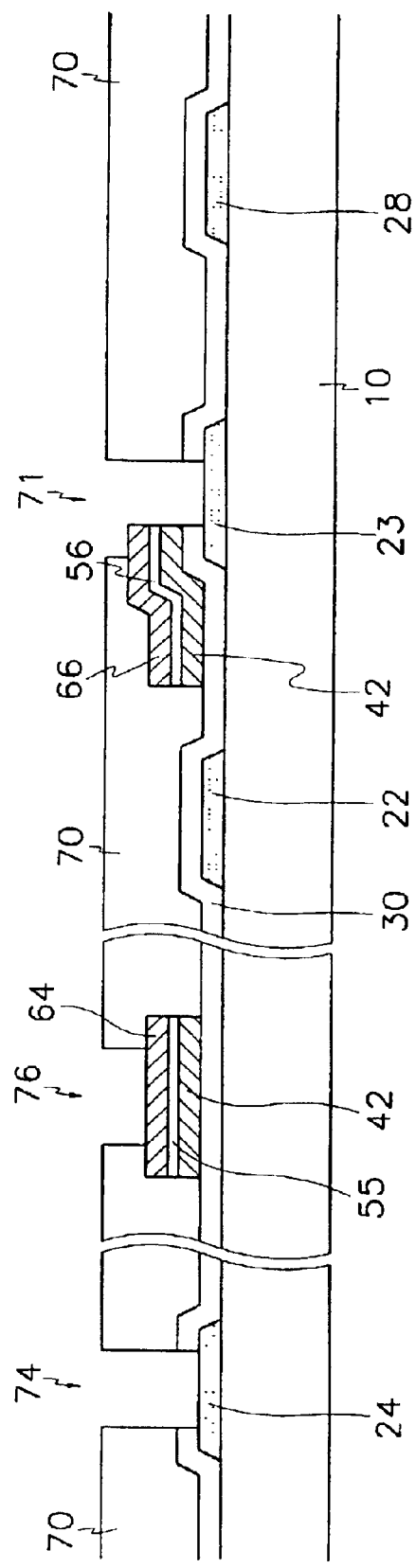

After forming data wire parts 62, 64, 65, and 66 by the above steps, a passivation layer 70 having the thickness of over 2,000 Å, is formed by CVD of SiNx or spin coating of organic insulator, as shown in FIGS. 22A to FIG. 22C. Then, contact holes 71, 72, 74, and 76 respectively exposing the drain electrode 66 and the pixel signal line 23, the data line 62, the gate pad 24, and the data pad 64 are formed by etching the passivation layer 70 along with the gate insulating layer 30 at the same time by using the third mask.

Next, as shown in FIGS. 13 to 15, a transparent or a opaque conductive material is deposited, and etched by using the fourth mask to form redundant data wires 82, 84, and 87, and redundant gate pad 84.

As described above, by forming the data wires 62, 64, 65, and 66, the ohmic contact patterns 55 and 56, and the semiconductor pattern 42 by using one mask, the manufacturing method can be simplified, and data wire opens can be prevented by forming a data wire having a double-layered structure.

In this embodiment, the redundant data wires 82, 84, and 87 are formed after forming the data wires 62, 64, 65, and 66, but the steps of forming the redundant data wires 82, 84, and 87, and the data wires 62, 64, 65 and 66 may be changed.

In the second embodiment, the semiconductor pattern 42 except for the channel part C of the thin film transistor has the same layout as the corresponding data wire parts 62, 64, 65, and 66. However, the semiconductor pattern 42 may be extended out the data wire parts 62, 64, 65, and 66, and will be described referring to drawings.

Figure 23:
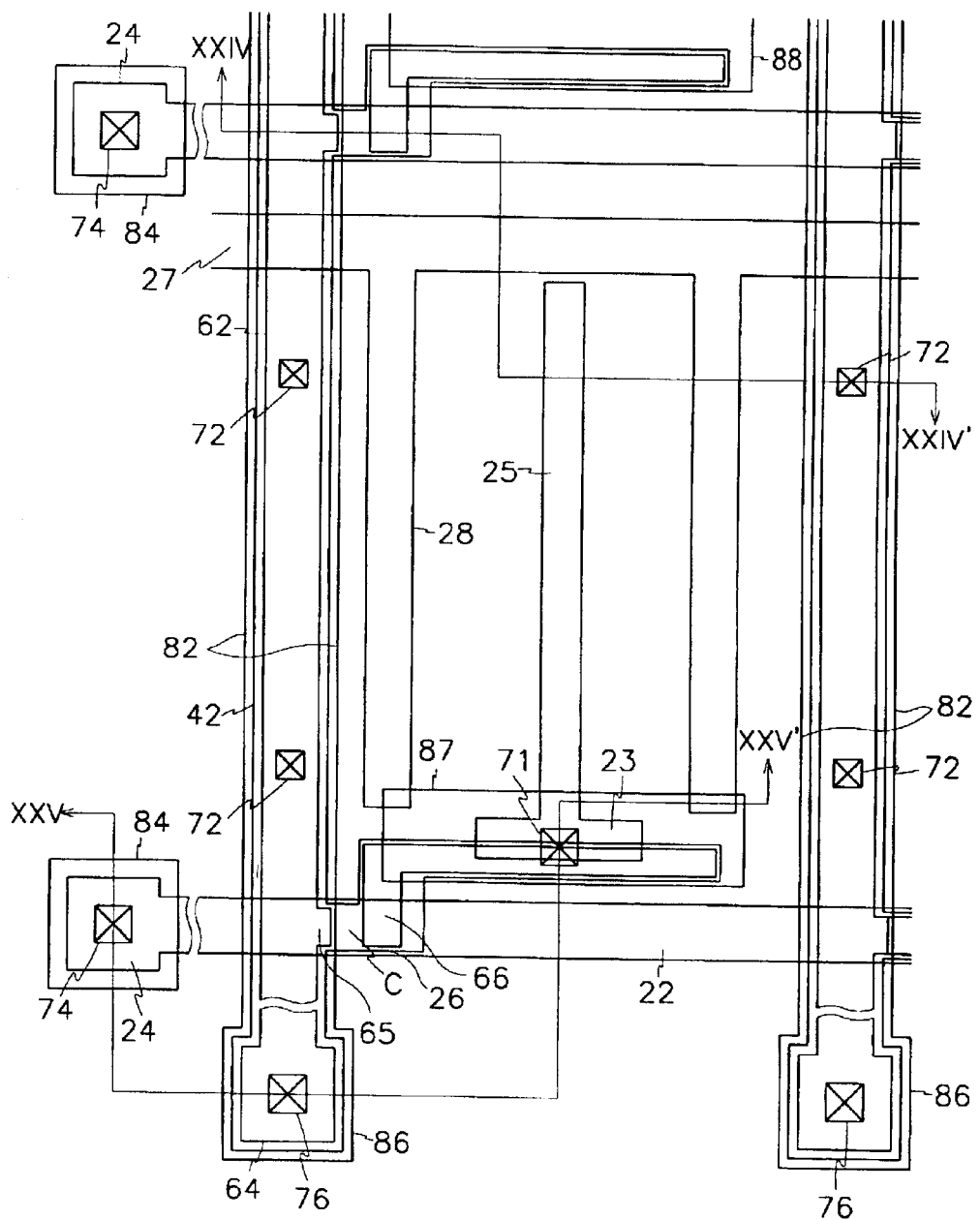
FIG. 23 is a layout view of a TFT array panel for an LCD according to a third embodiment of the present invention.
Figure 24:
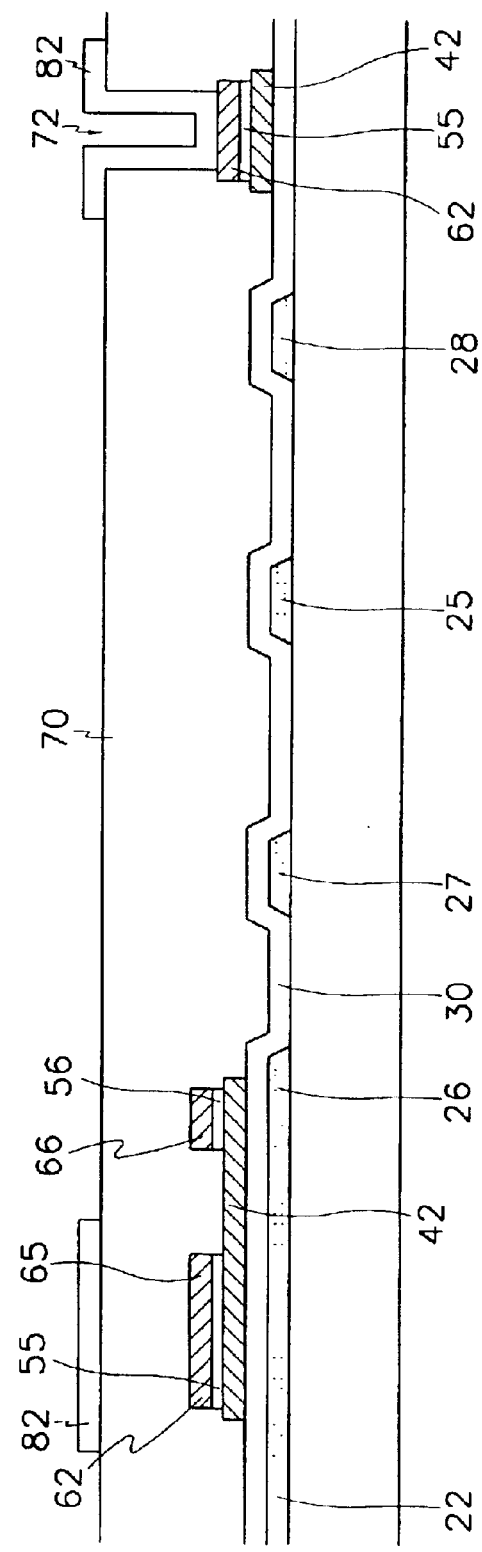
FIGS. 24 and 25 are cross-sectional views taken along the lines XXIV–XXIV' and XXV–XXV' in FIG. 23, respectively.
Figure 25:
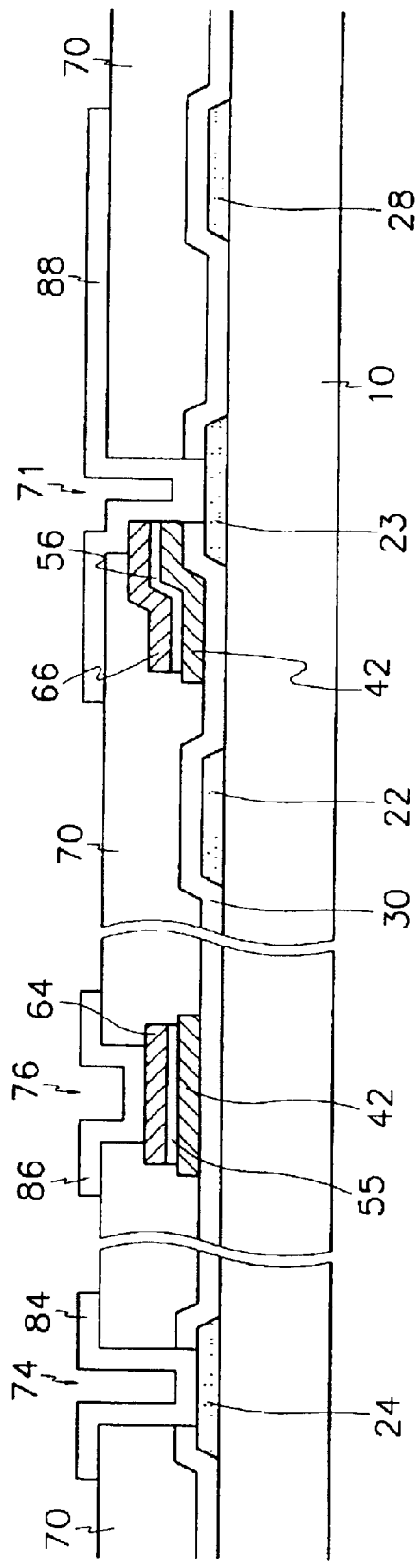

FIG. 23 is a layout view of a TFT array panel for an LCD according to a third embodiment of the present invention, and FIGS. 24 and 25 are cross-sectional views taken along the lines XXIV–XXIV' and XXV–XXV' in FIG. 23, respectively.

As shown in FIGS. 23 to 25, the structure of the third embodiment according to the present invention is similar to that of the second embodiment. However, the semiconductor pattern 42 is extended out the data wires 62, 64, 65, and 66.

Figure 26A:
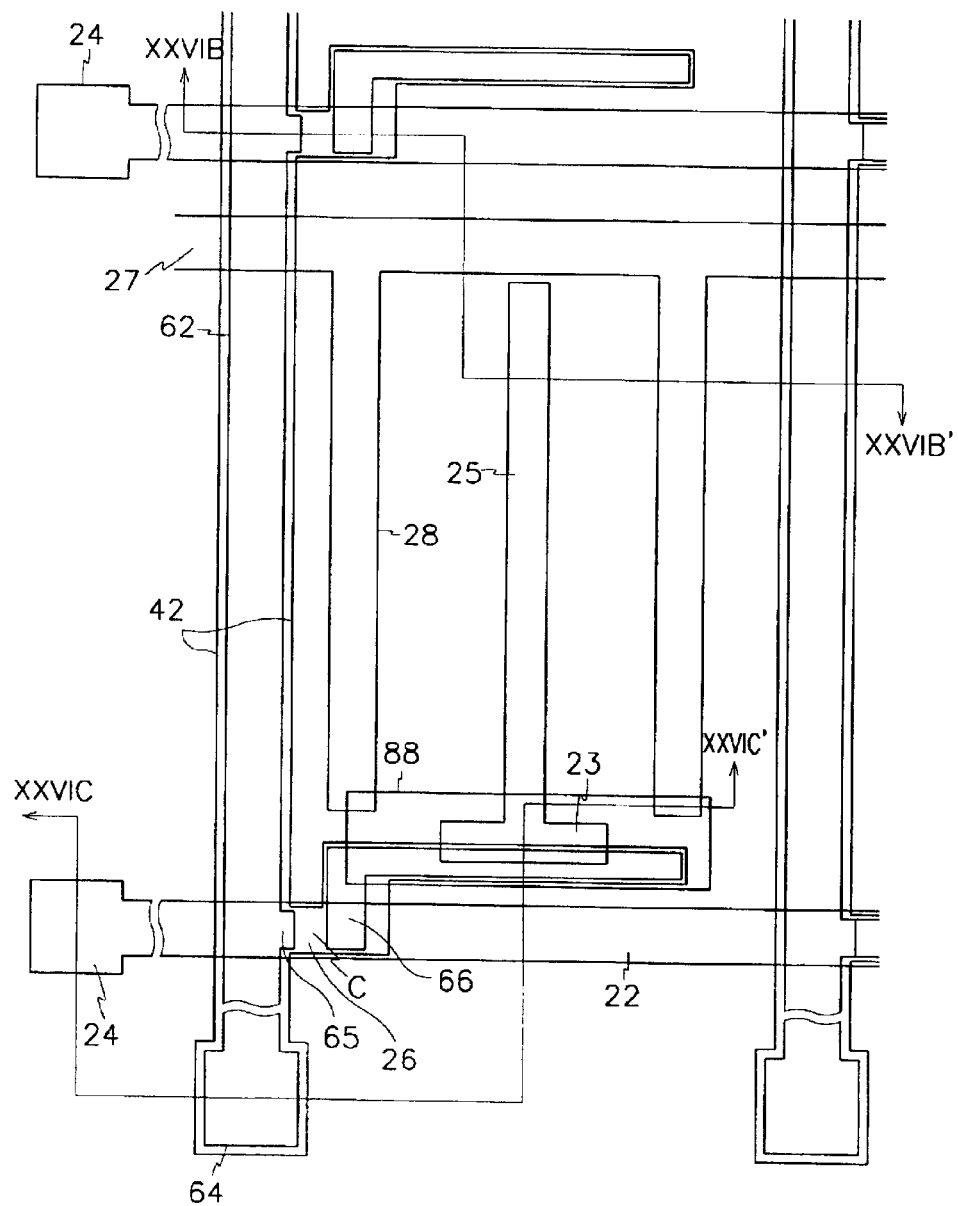
FIGS. 26A to 26C are layout views of a TFT array panel in a manufacturing step of a manufacturing method according to the third embodiment of the present invention and illustrate the next manufacturing steps following those which are represented in FIGS. 17B and 17C.
Figure 26B:
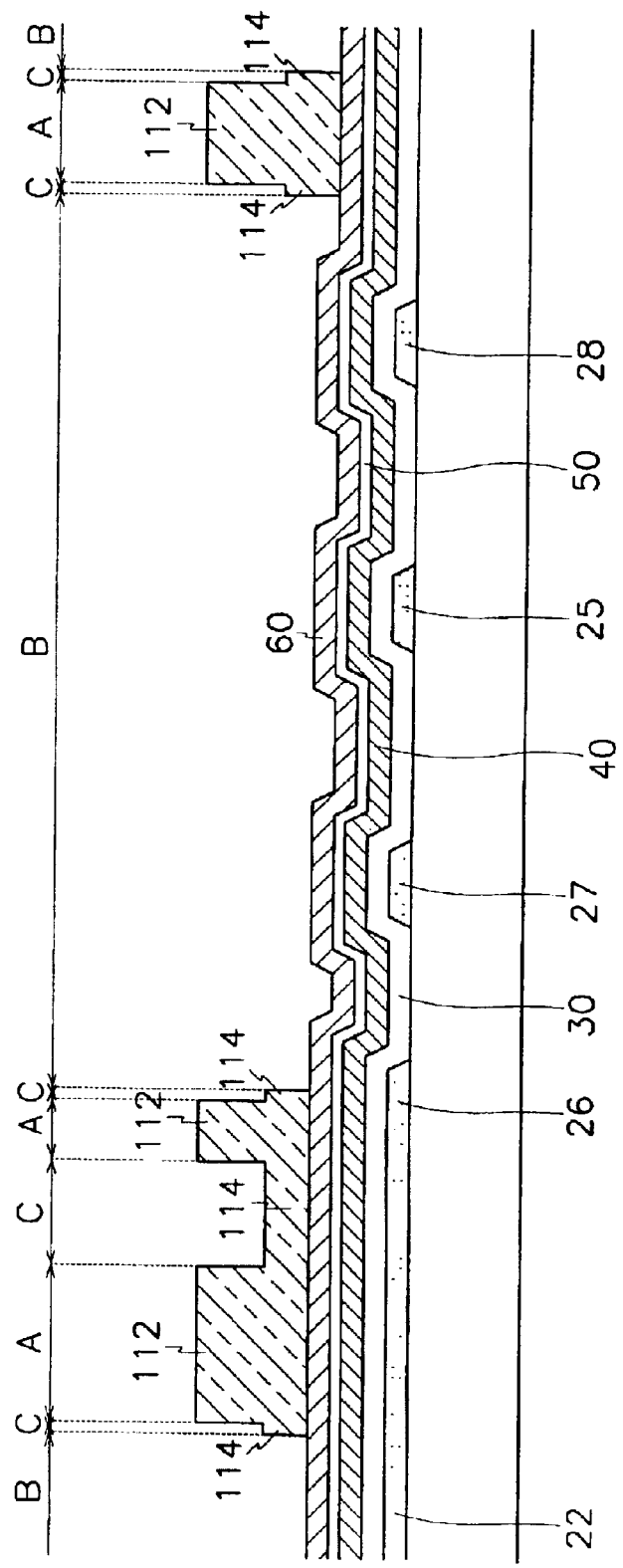
Figure 26C:
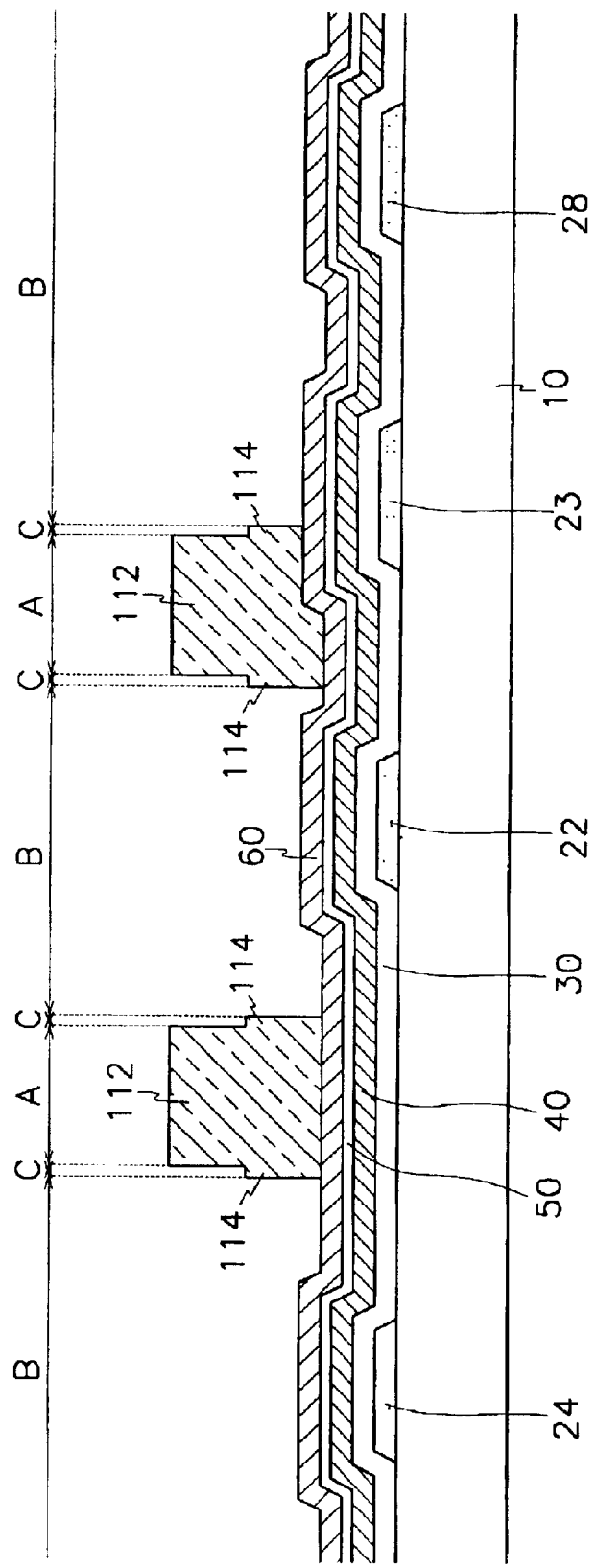
Figure 27A:
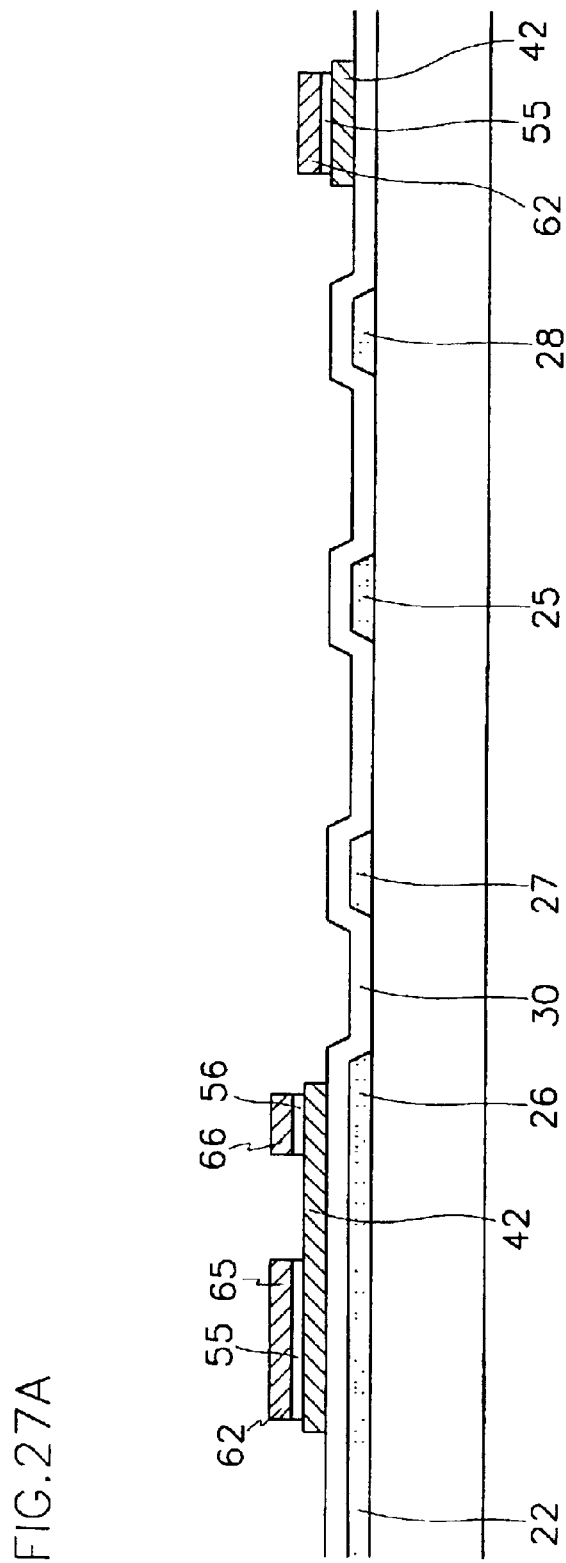

A manufacturing method of a TFT array panel according to the third embodiment of the present invention will be now described with reference to FIGS. 26A to 27B, as well as to FIGS. 23 to 25. FIGS. 26A to 26C are layout views of a TFT array panel in a manufacturing step of the manufacturing method according to the third embodiment of the present invention. These figures respectively represent the next manufacturing steps following those which are represented in of FIGS. 17B and 17C, and FIGS. 27A and 27B are cross-sectional views in the next manufacturing steps following those which are represented in of FIGS. 26B and 26C.

Most of the manufacturing method of a TFT array panel according to the third embodiment of the present invention is similar to that of the second embodiment.

However, a different feature, as shown in FIGS. 26A and 26B, is that a photoresist layer 110 is coated and developed to form photoresist patterns 112 and 114 by photolithography using a second mask. At this time, the photoresist pattern 114 is formed both on the channel portion C of TFTs and around the edge of a data wire part A.

Next, as shown in FIGS. 27B and 27B, a semiconductor pattern 42 is formed by using the photoresist patterns 112 and 114 as an etch mask, a data wires 62, 64, 65, and 66 are formed inside the semiconductor pattern 42 by using the photoresist pattern 112 as an etch mask, and an ohmic contact layer 50 is etched by using the data wires 62, 64, 65, and 66 or the photoresist pattern 112 as an etch mask to form ohmic contact patterns 55 and 56, as in the second embodiment. At this time, the semiconductor pattern part 42 of the channel portion C may also be etched.

Next, as shown in FIGS. 23 to 25, a passivation layer 70 and a redundant data wires 82, 84, and 87, and redundant gate pad 86 are formed by means such as the manufacturing method according to the second embodiment.

In the fourth embodiment according to the present invention, a pixel wire is formed with the same layer as a data wire, and a semiconductor pattern is formed so that it extends out from the data wire and the pixel wire.

Figure 28:
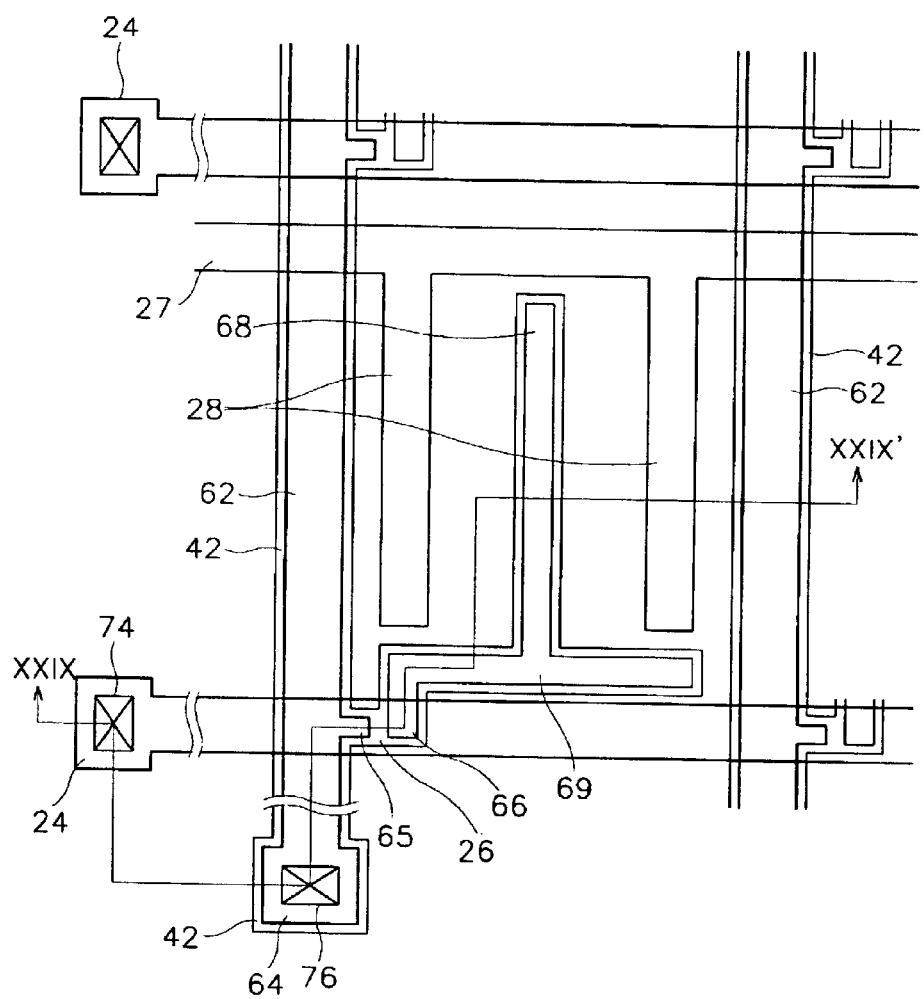
FIG. 28 is a layout view of a TFT array panel for an LCD according to a fourth embodiment of the present invention.
Figure 29:
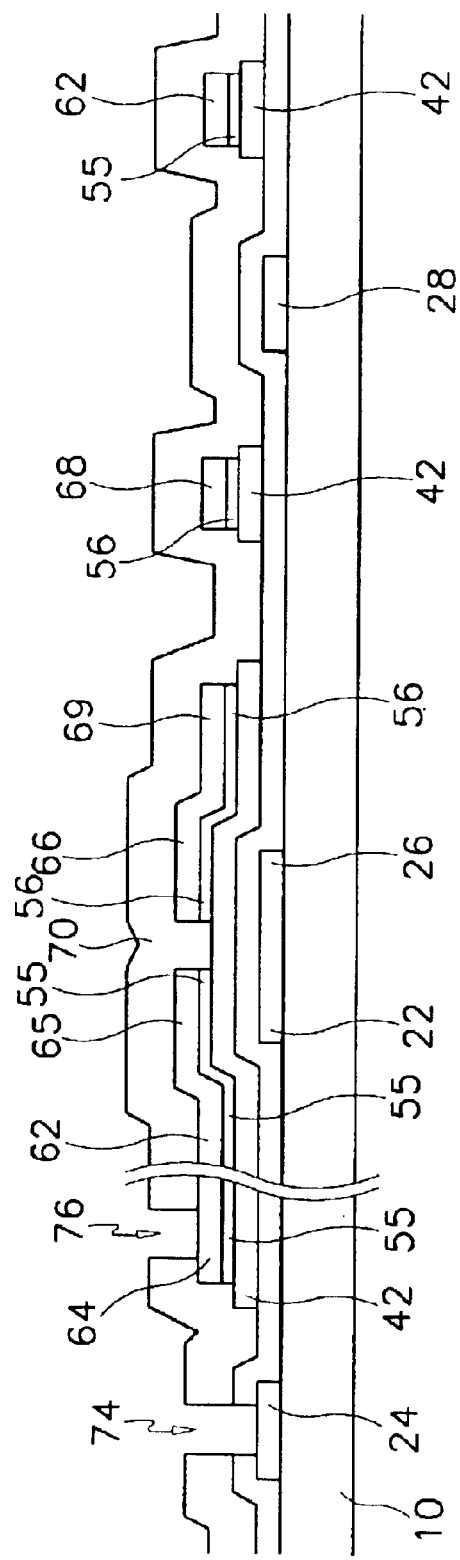
FIG. 29 is a cross-sectional view taken along the line XXIX–XXIX' including a pixel portion and a thin film transistor portion.

FIG. 28 is a layout view of a TFT array panel for an LCD according to a fourth embodiment of the present invention, and FIG. 29 is a cross-sectional view taken along the line XXIX–XXIX' including the pixel portion, thin film transistor portion, and pad portion.

A gate wires 22, 24, and 26, and common wires 27 and 28 are formed on an insulating substrate 10.

A semiconductor pattern 42 and ohmic contact layer patterns 55 and 56 are sequentially formed on a gate insulating layer 30 covering the gate wire parts 22, 24, and 26, and the common wires 27 and 28. A data wires 62, 64, 65, and 66, and pixel wires 68 and 69, which are made of metal, ITO, or IZO, are formed on the ohmic contact layer patterns 55 and 56.

The ohmic contact patterns 55 and 56 have the same layout as the corresponding data wire parts 62, 64, 65, and 66 and the corresponding pixel wire parts 68 and 69. At this time, as shown in FIGS. 28 and 29, the ohmic contact patterns 55 and 56, the data wire parts 62, 64, 65, and 66, and the pixel wire parts 68 and 69 are inside and have a similar shape with the semiconductor pattern 42. Accordingly, the data wires 62, 64, 65, and 66, and the pixel wire parts 68 and 69, and the semiconductor pattern 42 have a double-step structure, particularly since the steps of the pixel electrode 68 and the semiconductor pattern 42 are successively formed in the pixel portion. Therefore, the profiles of a passivation layer and an alignment layer thereon are gently formed and thus leakage light due to a rubbing defect may be minimized.

A passivation layer 70 covering the data wire parts 62, 64, 65, and 66, and the pixel wire 68 and 69 have contact holes 76 and 74 exposing the data pad 64, and the gate pad 24 along with the gate insulating layer 30, respectively. Because the steps of the data wires 62, 64, 65, and 66, the pixel electrode 68, and the semiconductor pattern 42 are of a double-step structure, the surface of the passivation layer 70 covering them is gently sloping, as shown in FIG. 29, and thus leakage light due to a rubbing defect of the alignment layer formed thereon may be minimized.

A manufacturing method of a thin film transistor array panel according to the fourth embodiment of the present invention will now be described with reference to the FIGS. 30A to 33 and FIGS. 28 and 29.

Figure 30A:
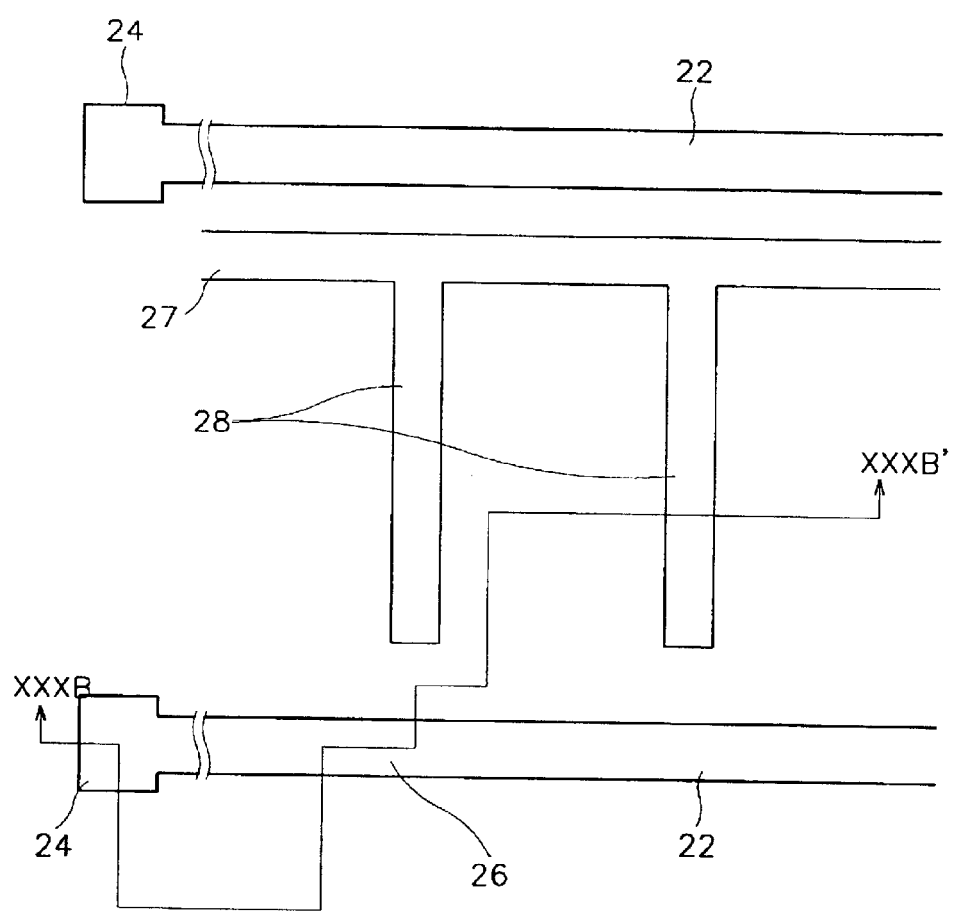
FIGS. 30A and 31A are layout views of a TFT array panel in the mid manufacturing steps of the manufacturing method according to the fourth embodiment of the present invention.
Figure 30B:
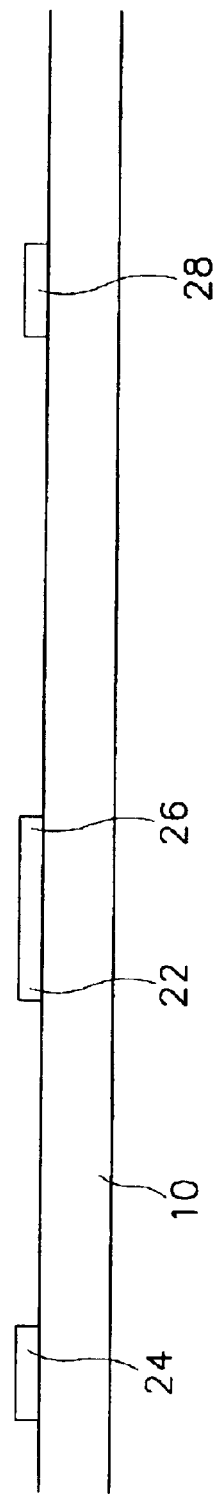
Figure 31A:
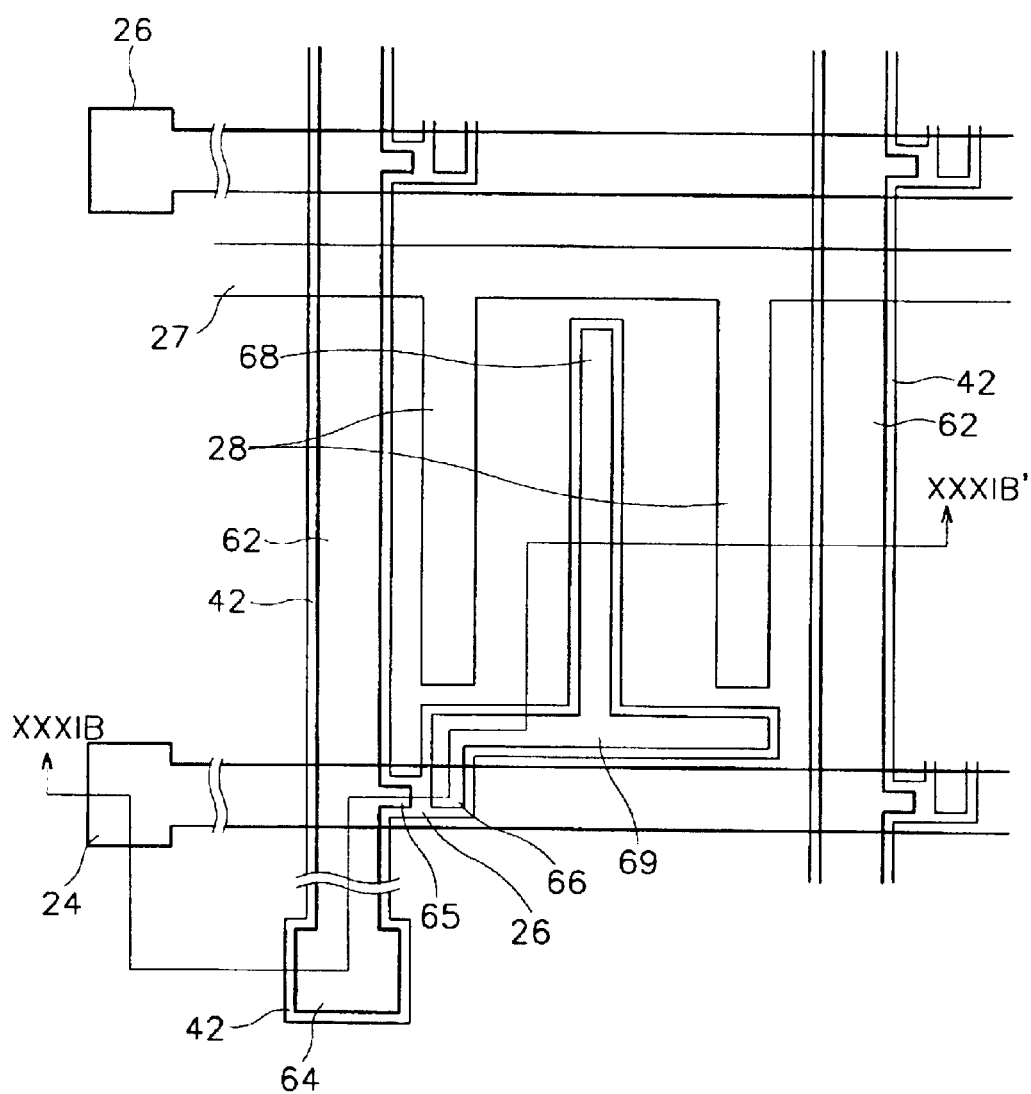
Figure 32:
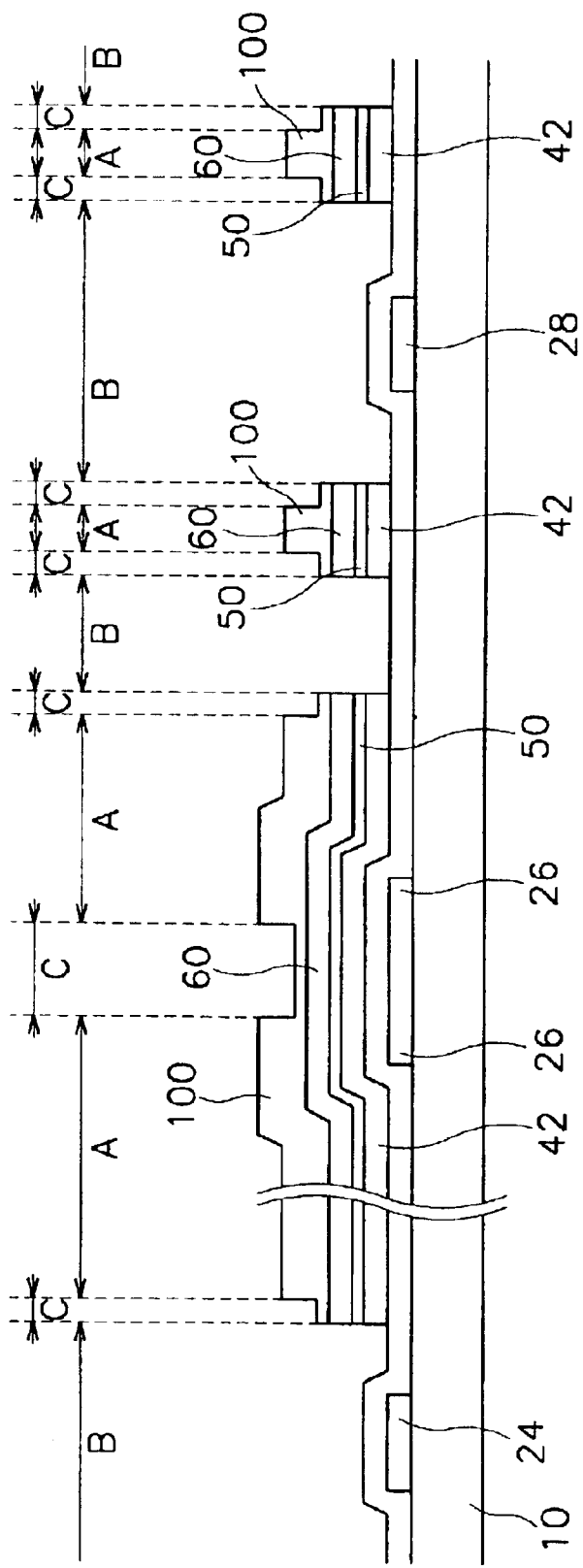
FIGS. 32 and 33 are cross-sectional views taken along the lines XXXIB–XXXIB' in FIG. 31A, respectively, in the next manufacturing steps of FIG. 31B.
Figure 33:
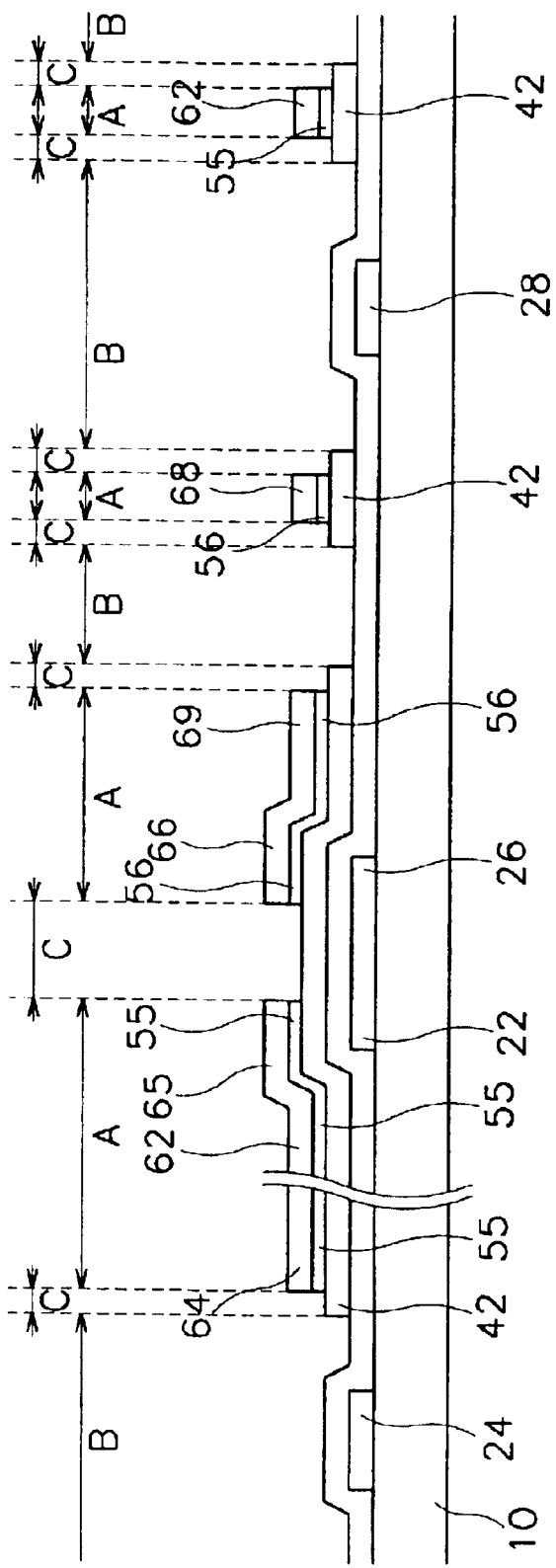

FIGS. 30A and 31A are layout views of a TFT array panel in mid manufacturing steps of the manufacturing method according to the fourth embodiment of the present invention, FIGS. 30B and 31B are the cross-sectional views taken along the lines XXXB–XXXB' and XXXIB–XXXIB' in FIGS. 30A and 31A, respectively, and FIGS. 32 and 33 are cross-sectional views taken along the lines XXXB–XXXB' and XXXIB–XXXIB' in FIG. 31A, respectively, in the next manufacturing steps of FIG. 31B.

At first, as shown in FIGS. 30A to 30B, gate wire parts, including a gate line 22, a gate pad 24, and a gate electrode 26, and a common wire including a common signal line 27 and common electrodes 28, are formed by dry or wet etching by a photolithography process using a first mask.

Next, as shown in FIGS. 31A and 31B, a gate insulating layer 30, a semiconductor layer 40, an ohmic contact layer 50, and a data conductor layer 60 made of conductive material such as a metal ITO, or IZO, are sequentially deposited and patterned by a photolithography process using a first mask for a semiconductor pattern 42, ohmic contact patterns 55 and 56, data wires 62, 64, 65, and 66, and pixel wires 68 and 69. Also, at this time, as shown in FIGS. 31A and 33, it is desirable that the semiconductor pattern 42 is extended out from the data wires 62, 64, 65, and 65 and the pixel wires 68 and 69 to form the semiconductor pattern and for the data wire to have successive steps so that the profile of a passivation layer, which will be formed thereon, may be gently sloped. To this object, as shown FIG. 31B, the photoresist pattern 100 having a different thickness at different positions is formed by using a mask 200 having different transmittance depending on position, such as in the first and the third embodiments. The under-layers 40, 50, and 60 under the photoresist pattern 100 are etched by using the photoresist pattern 100 as an etch mask. After developing a photoresist layer 150, a hard line is the boundary of the photoresist pattern 100.

At this time, a positive photoresist may be used. To obtain a uniform thickness of the photoresist pattern 100 respectively corresponding to portions B and C, the photoresist layer may have double-layered structure made of upper and lower layers having different respective photosentivity.

Next, as shown in FIG. 32, the conductor layer 60, the ohmic contact layer 50, and the semiconductor layer 40 are etched by using the photoresist pattern 100 as an etch mask to complete the semiconductor 42. When dry etching is used, the photoresist layer 100 corresponding to portions A and C is also etched to a certain thickness. At this time, it is preferable to make the photoresist pattern 100 thick enough so as the photoresist pattern 100 corresponding portion C in FIG. 31B is not completely etched.

Next, the remaining thin photoresist pattern 100 on the edge of the semiconductor pattern 42 is removed by ashing. Then, the data conductor layer 60 is etched by using the photoresist pattern 100 corresponding to portion A as an etch mask to complete the data wires 62, 64, 65, and 66, and the pixel wires 68 and 69, as shown in FIGS. 31A and 33. Here, the width of the extended semiconductor pattern 42 out from the data wires 62, 64, 65, and 66, and the pixel wires 68 and 69 is more than 0.5 μm.

Next, the exposed ohmic contact layer 50 is etched by using the data and pixel wires 62, 64, 65, 68, and 69, or the remaining photoresist pattern thereon to complete the ohmic contact patterns 56 and 56, then the remaining photoresist pattern is completely removed.

After forming the data wires 62, 64, 65, and 66, and the pixel wires 68 and 69 by the above steps, a passivation layer 70 is formed and patterned along with the gate insulating layer 30 to form contact holes 74 and 76 respectively exposing the gate pad 24 and the data pad 64.

Though, in the present embodiments, the pixel electrode and the common electrode are formed in a linear shape, but an opaque-conductive material may also be used for a reflective type liquid crystal display.

According to the present invention, the manufacturing method may be simplified by reducing the manufacturing steps, thereby reducing the manufacturing cost and enhancing the yield. Furthermore, it is possible to etch a wide area of a layer to a variety of thicknesses depending on location at the same time and to achieve a uniform thickness at those locations where a layer should has a certain thickness. Also, it is possible to prevent open wires by forming wires having a double-layered structure, and to minimize the leakage light due to a rubbing defect by forming the data wire, the pixel wire, and the semiconductor pattern having a double-step structure in order to provide a gently sloping profile of the passivation layer thereon.

In the fifth embodiment according to the present invention, a data wire and a semiconductor pattern are formed together by using as an etch mask a photoresist pattern having different thicknesses depending on position, and a pixel wire is formed on a passivation layer. First, the structure of a TFT array panel for an LCD according to the fifth embodiment of the present invention will be described with reference to FIGS. 34 and 35.

Figure 34:
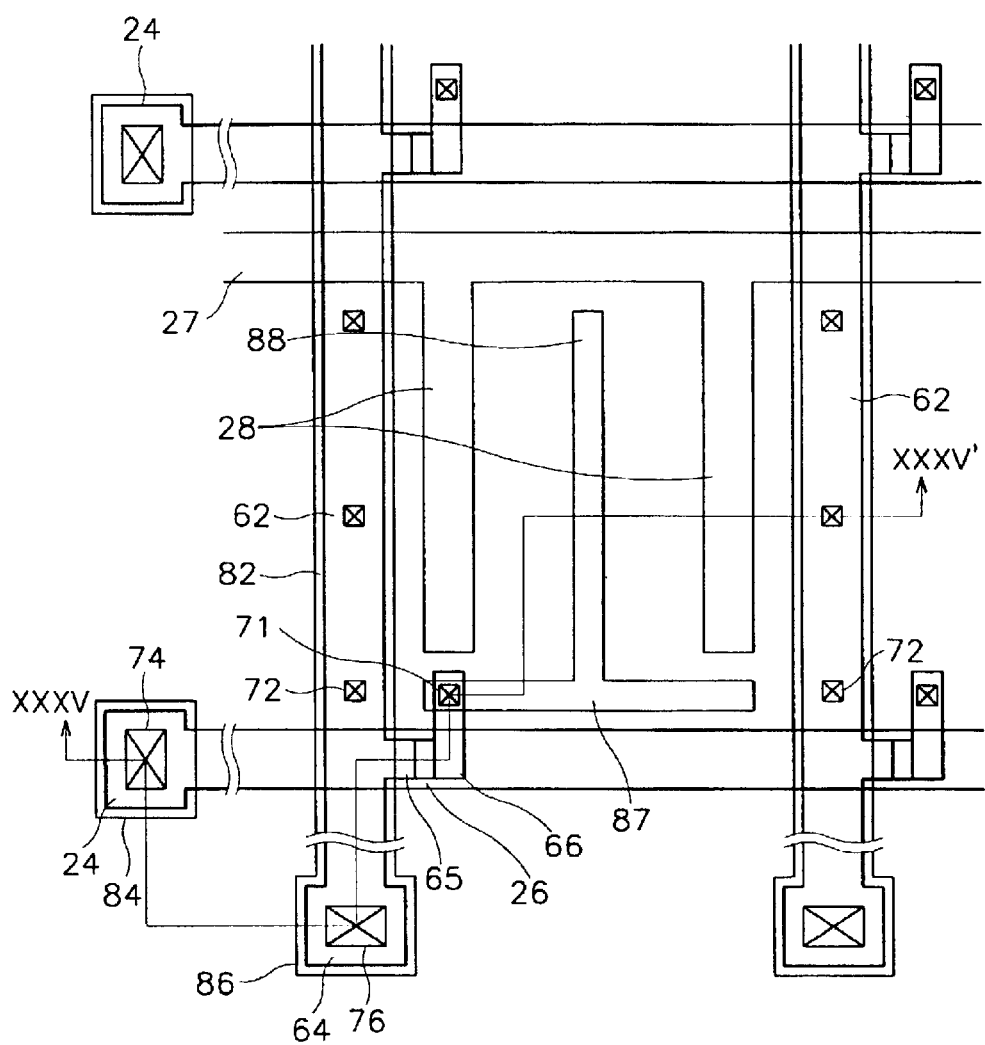
FIG. 34 is a layout view of a TFT array panel for an LCD according to a fifth embodiment of the present invention.
Figure 35:
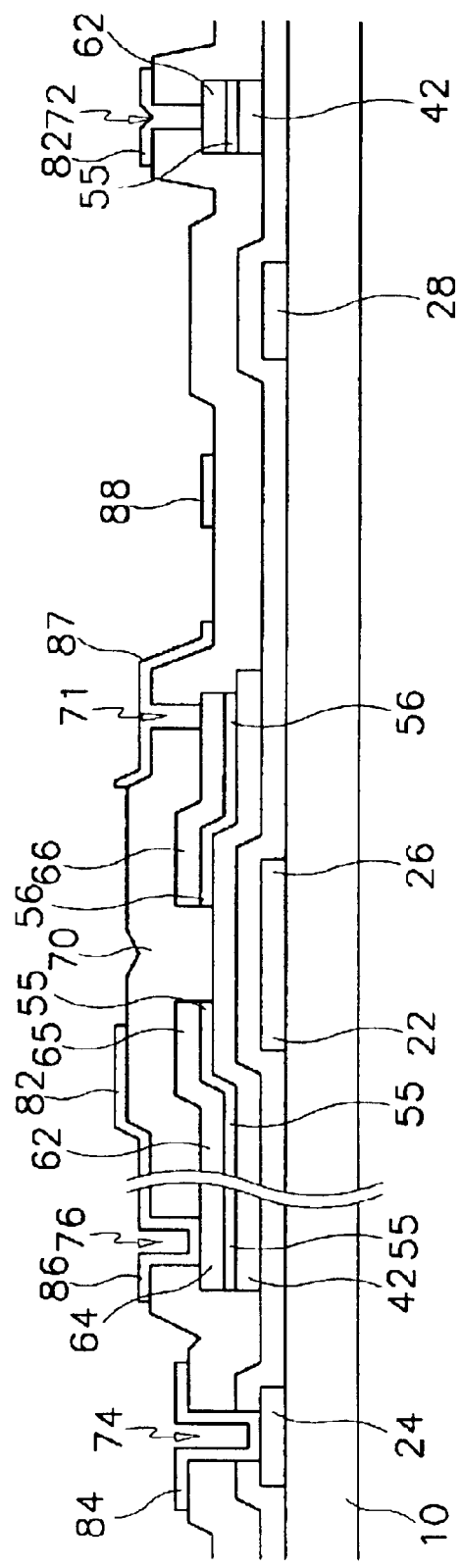
FIG. 35 is a cross-sectional view taken along the line XXXV–XXXV' including a pixel portion and a thin film transistor portion in FIG. 34.

FIG. 34 is a layout view of a TFT array panel for an LCD according to a fifth embodiment of the present invention, and FIG. 35 is a cross-sectional view taken along the line XXXV–XXXV' including the pixel portion, thin film transistor portion, and pad portion.

A gate wires 22, 24, and 26, and a common wires 27 and 28 are formed on an insulating substrate 10.

A semiconductor pattern 42 and ohmic contact layer patterns 55 and 56 are sequentially formed on a gate insulating layer 30 covering the gate wire parts 22, 24, and 26, and the common wires 27 and 28. Data wires 62, 64, 65, and 66 are formed on the ohmic contact layer patterns 55 and 56.

The ohmic contact patterns 55 and 56 have the same, layout as the corresponding data wires 62, 64, 65, and 66. At this time, as in the second embodiment, the semiconductor pattern 42 except for the channel portion of the thin film transistor has the same layout as the corresponding data wires 62, 64, 65, and 66, and the contact patterns 55 and 56. Of course, the semiconductor pattern 42 to be extended out from the data wires 62, 64, 65, and 66 will be formed to have a double-step structure, such as in the third and the fourth embodiments.

A passivation layer 70 covering the data wire parts 62, 64, 65, and 66, and the semiconductor pattern 42, which is not covered by the data wires 62, 64, 65, and 66, has contact holes 71, 72, and 76 exposing the drain electrode 66, the data line 62, and the data pad 64, and a contact hole 74 exposing the gate pad 24 along with the gate insulating layer 30, respectively.

A pixel wire including a pixel signal line 87 connected to the drain electrode through the contact hole 71 and parallel the common signal line 27, and a pixel electrode 88 parallel the common electrodes 28 are formed on the passivation layer 70 of the region enclosing the gate lines 22 and the data lines 62.

Here, the pixel wire 87 and 88, and the common wires 27 and 28 may overlap each other to make a storage capacitor having storage capacitance.

A redundant wire electrically connected to the data wire and the gate pad is formed on the passivation layer 70. The redundant wire includes a plurality of redundant data line parts 82 and 86 connected to the data lines 62 and 64 through the contact holes 72 and 76, and a redundant gate pad 84 connected to the gate pad 26 through the contact hole 74. Since these redundant pads 84 and 86 only protect the pads 24 and 64 and complement the contact between the external circuitry and the pads 24 and 64, they are optional.

A manufacturing method of a thin film transistor array panel according to the fifth embodiment of the present invention will now be described with reference to the FIGS. 36A to 40B and FIGS. 34 and 35.

Figure 36A:
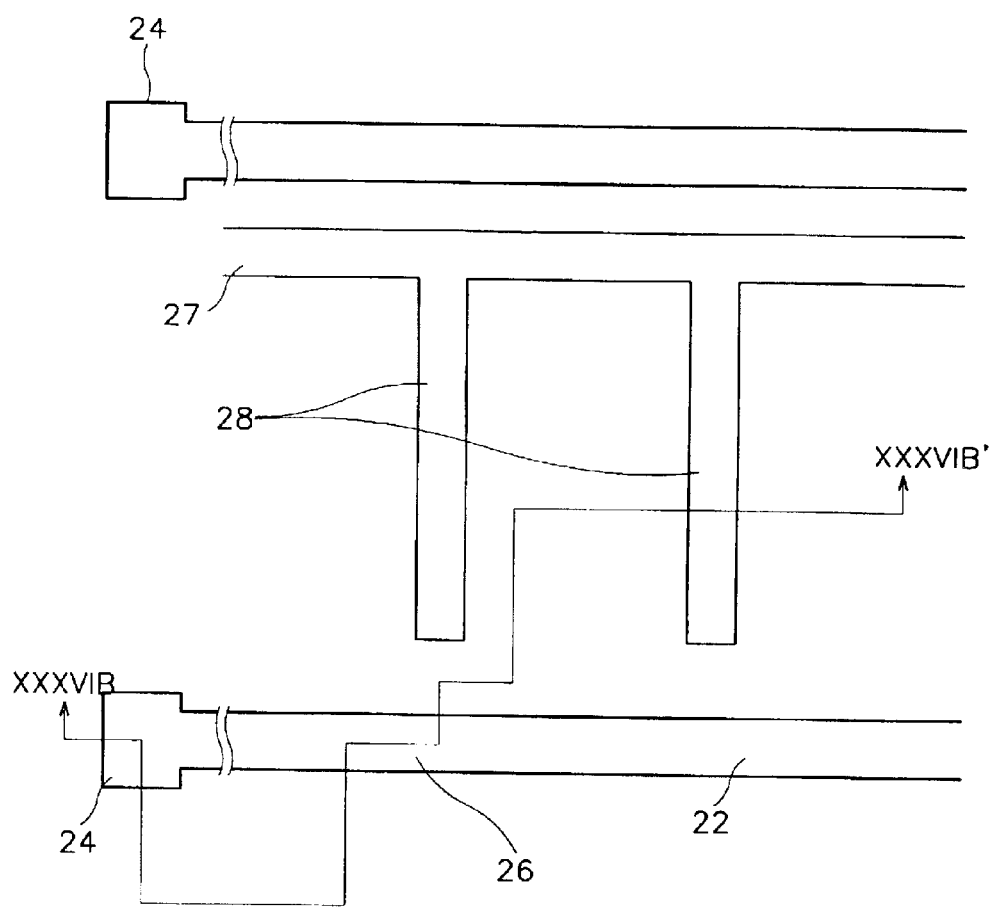
FIGS. 36A, 37A and 40A are layout views of a TFT array panel in the mid manufacturing steps of the manufacturing method according to the fifth embodiment of the present invention.
Figure 36B:
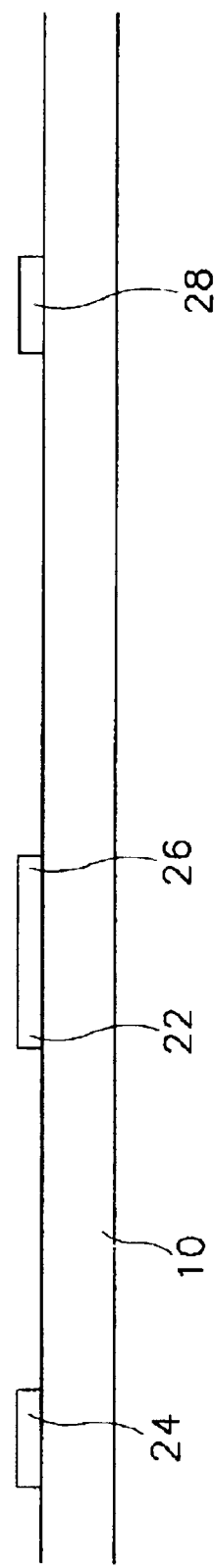
FIGS. 36B, 37B and 40B are the cross-sectional views taken along the lines XXXVIB–XXXVIB', XXXVIB–XXXVIIB' and XXXX–XXXX' in FIGS. 30A and 31A, respectively.
Figure 37A:
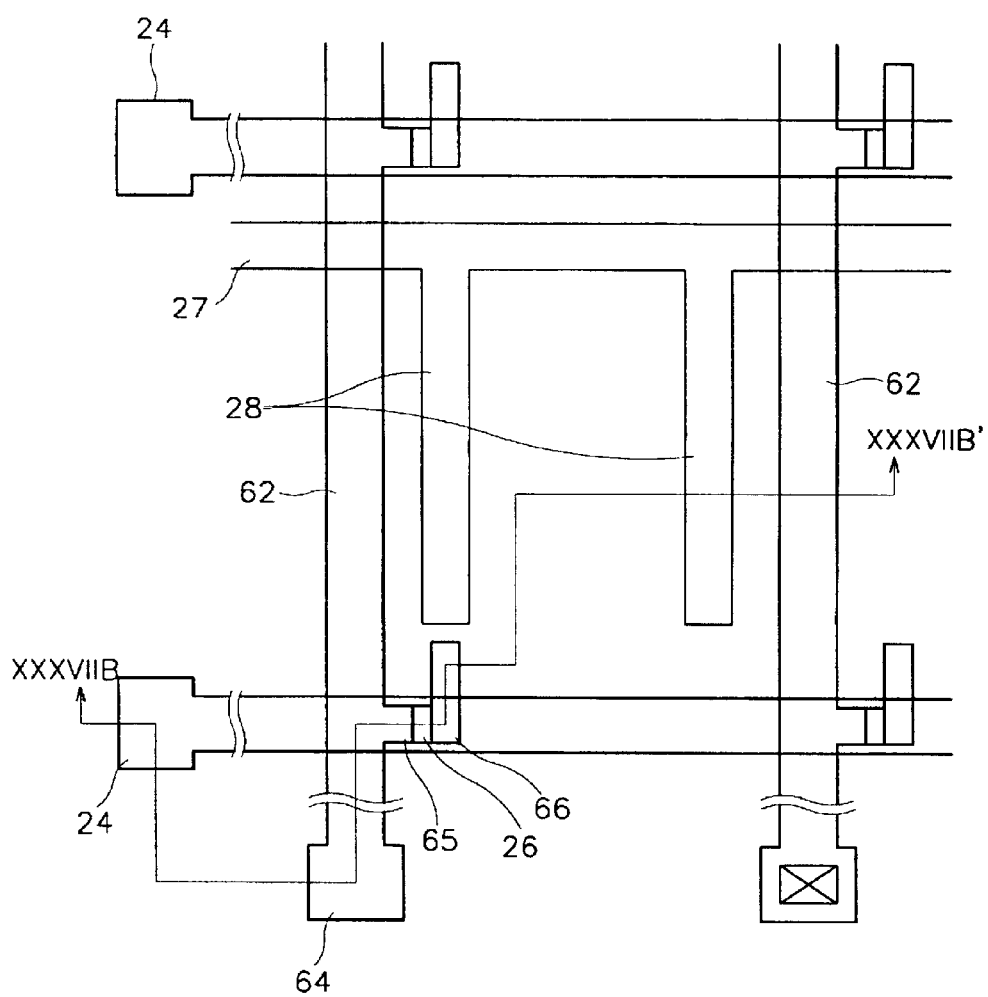
Figure 37B:
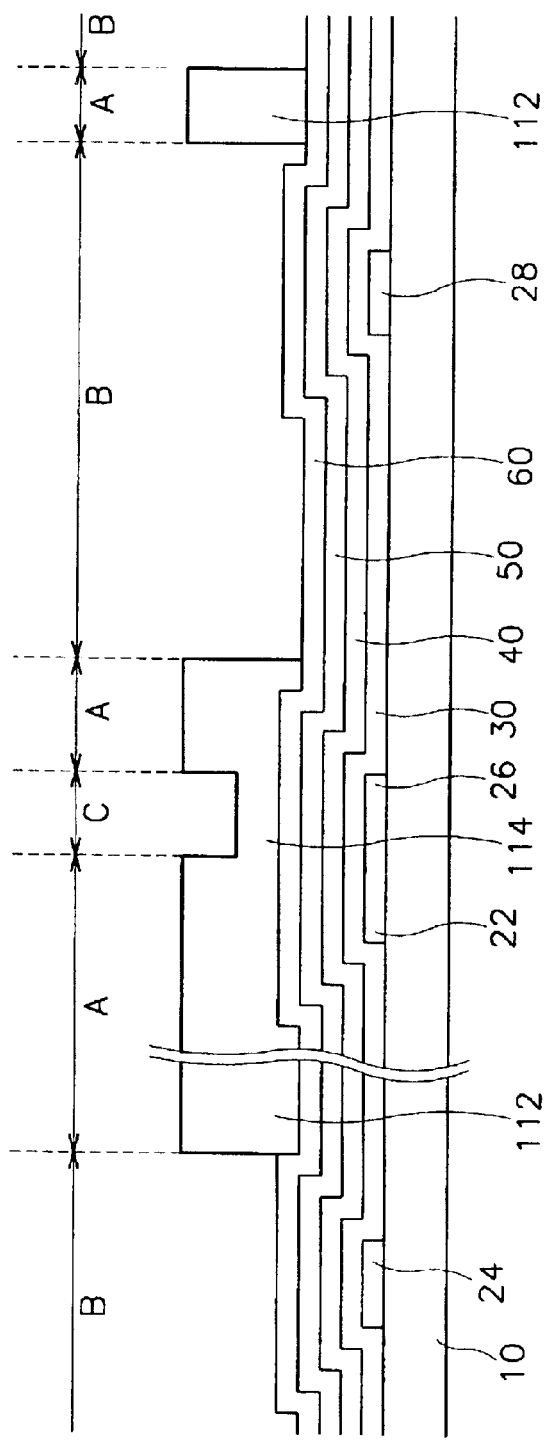
Figure 38:
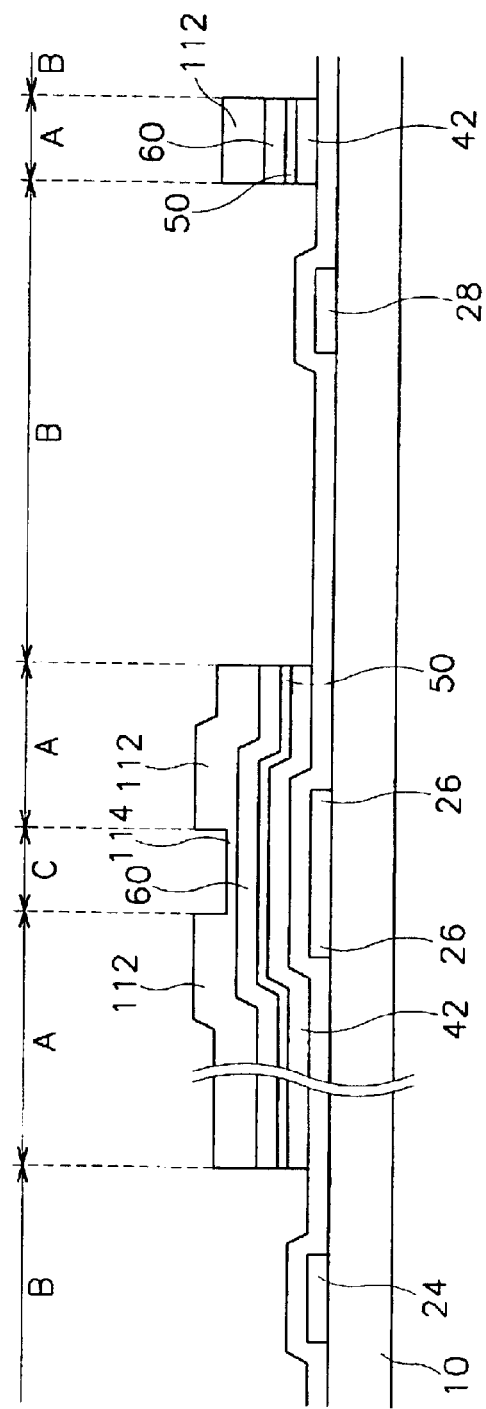
FIGS. 38 and 39 are cross-sectional views taken along the lines XXXVIIB–XXXVIIB' in FIG. 37A, respectively, in the next manufacturing steps of FIG. 37B.
Figure 39:
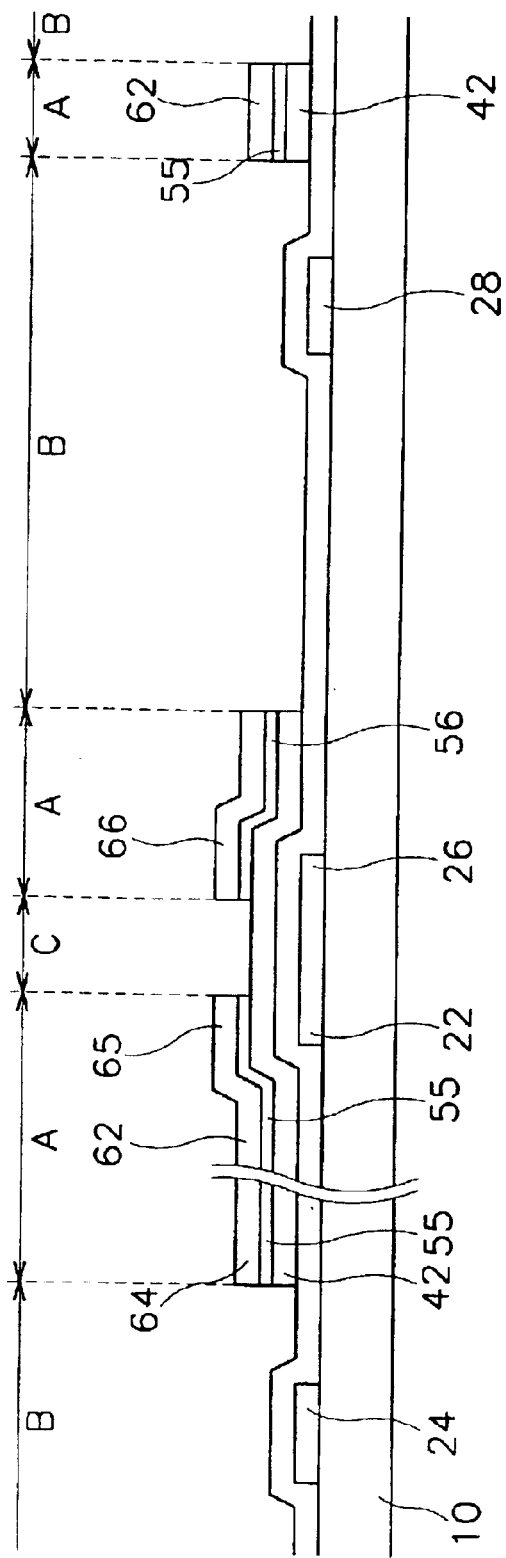
Figure 40A:
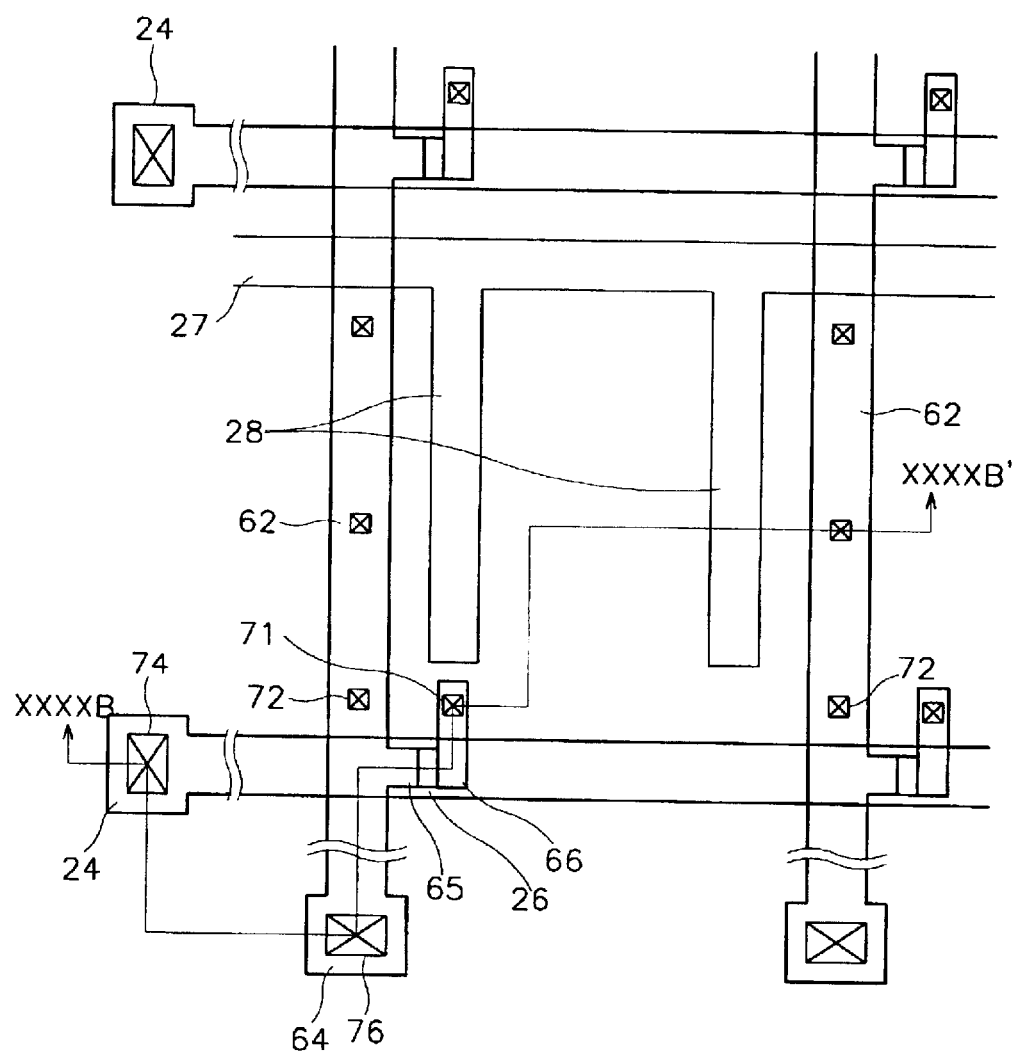
Figure 40B:
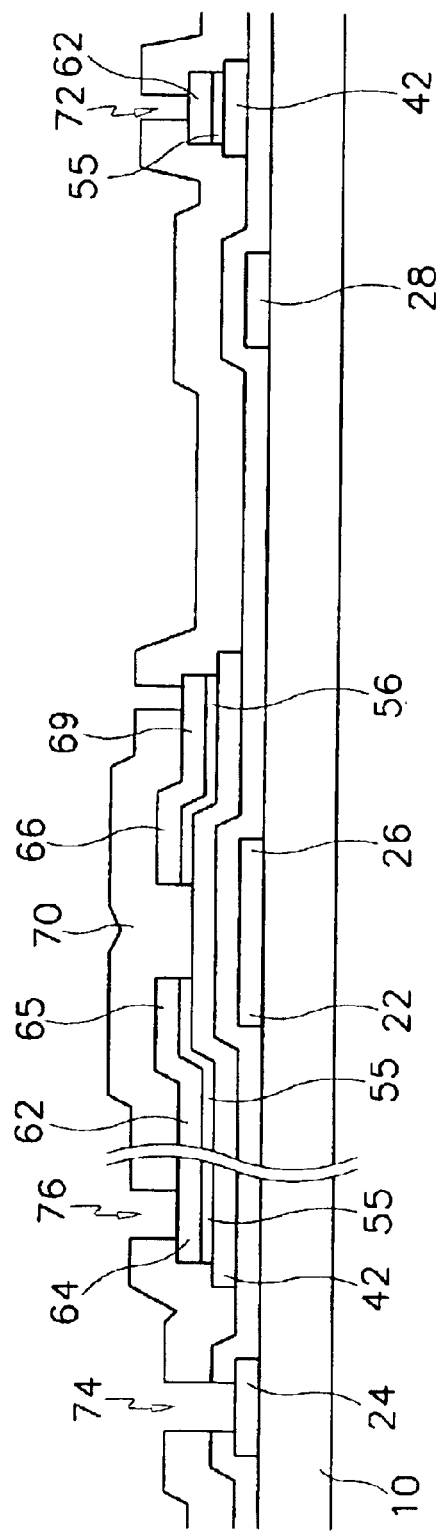

FIGS. 36A, 37A, and 40A are layout views of a TFT array panel in the mid manufacturing steps of the manufacturing method according to the fifth embodiment of the present invention, and FIGS. 36B, 37B, and 40B are the cross-sectional views taken along the lines XXXVIB–XXXVIB', XXXVIIB–XXXVIIB' and XXXXB–XXXXB' in FIGS. 36A, 37A, and 40A, respectively. Furthermore, FIGS. 38 and 39 are portions of the cross-sectional views taken along the line XXXVIIB–XXXVIIB' in FIG. 37A, and represent the next manufacturing steps following that which is represented in of FIG. 37B.

At first, as shown in FIGS. 36A to 36B, gate wire parts, including a gate line 22, a gate pad 24, and a gate electrode 26, and a common wire including a common signal line 27 and common electrode 28, are formed by dry or wet etching with a photolithography process using a first mask, such as in the fourth embodiment according to the present invention.

Next, as shown in FIGS. 37A and 39, a gate insulating layer 30, a semiconductor layer 40, an ohmic contact layer 50, and a data conductor layer 60 are sequentially deposited and patterned by photolithography process using a second mask to form a semiconductor pattern 42, ohmic contact patterns 55 and 56, and data wires 62, 64, 65, and 66. Also, at this time, as in the first to fourth embodiments, a photoresist pattern having different thickness depending on position must be used, and the under-layers 40, 50, and 60 under the photoresist pattern are etched by using the photoresist pattern as an etch mask to form semiconductor pattern 42, ohmic contact patterns 55 and 56, and data wires 62, 64, 65, and 66.

First, as shown in FIG. 37B, a photoresist layer is coated on the data conductor layer 60, exposed to light through a second mask and developed to form photoresist patterns 112 and 114. In the case of using positive photoresist, it is preferable that the second mask has light transmittance at the data wire portions A of less than 3%, at the channel portion C 20% to 60%, and at the remaining portion B more than 90%. Also, it is preferable that the thickness of the first portion 114 is in the range of 2,000 Å to 5,000 Å, more preferably 3,000 Å to 4,000 Å, and the thickness of the second portion 112 is preferably more than 1 μm.

At this time, to respectively obtain uniform thickness of the photoresist patterns 112 and 114 corresponding to portions A and C, the photoresist layer may have a double-layered structure made of upper and lower layers having respectively different photosentivity values.

Next, as shown in FIG. 38, the data conductor layer 60, the ohmic contact layer 50, and the semiconductor layer 40 are etched by using the photoresist patterns 112 and 114 as etch mask to complete the semiconductor 42. When dry etching is used, the photoresist layers 112 and 114 are also etched to a certain thickness while completing the semiconductor pattern 42 and exposing the gate insulating layer 30. At this time, it is preferable to make the photoresist pattern 114 thick enough so as the photoresist pattern 114 corresponding portion C in FIG. 37B is not to completely etch.

Next, the remaining thin photoresist pattern 114 is removed by ashing. Then, the data conductor layer 60 is etched by using the photoresist pattern 112 corresponding portion A as etch mask to complete the data wires 62, 64, 65, and 66, as shown in FIGS. 37A and 39.

Here, the semiconductor pattern 42 to be extended out the data wire 62, 64, 65 and 66 may be formed as the fourth embodiment.

Next, the exposed ohmic contact layer 50 is etched by using the data and pixel wires 62, 64, 65, 68, and 69, or the remaining photoresist pattern thereon to complete the ohmic contact patterns 56 and 56, then the remaining photoresist pattern is completely removed by ashing.

Next, as shown in FIGS. 40A and 40B, a passivation layer 70 is formed and patterned along with the gate insulating layer 30 to form contact holes 71, 72, 74, and 76 respectively exposing the drain electrode 66, the data line 62, the gate pad 24, and the data pad 64.

Finally, as shown in FIGS. 34 and 35, a transparent or opaque conductive material is deposited and etched to form a redundant wire including redundant data lines 82, redundant gate pad 84 and redundant data pad 86, and a pixel wire including a pixel signal line 87 and a pixel electrode 88 by using a fourth photolithography step.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor array panel for a liquid crystal display, comprising:

an insulating substrate;

a gate wire including a plurality of gate lines, and gate electrodes connected to the gate line;

a common wire including a plurality of common signal lines and a plurality of common electrodes connected to the common signal lines;

a pixel wire including a plurality of pixel electrodes parallel the common electrodes;

a gate insulating layer covering the gate wire;

a semiconductor layer formed on the gate insulating layer and made of semiconductor;

a data wire formed on the semiconductor layer and including a plurality of data lines crossing the gate line, source electrodes connected to the data lines, and drain electrode separated from the data line and located at an opposite side of the source electrode with respect to the gate electrode and connected to the pixel wire;

a passivation layer pattern covering the semiconductor layer exposed from the data wire and having a first contact hole; and a conductive layer formed on the passivation layer pattern and crossing the gate lines.

2. The thin film transistor array panel of claim 1, wherein the gate wire further includes a gate pad connected to and receiving a signal from an external circuit, the data wire further includes a data pad connected to and receiving a signal from a external circuit, the passivation layer pattern and the gate insulating layer have a second contact hole and a third contact hole, respectively, exposing the gate pad and the data pad, and the thin film transistor array panel further comprises a redundant gate pad and a redundant data pad made of the same layer as the conductive layer and connected to the gate pad and the data pad, respectively, through the second contact hole and the third contact hole.

3. The thin film transistor array panel of claim 1, wherein the common wire is made of the same layer as the gate wire.

4. The thin film transistor array panel of claim 1, wherein the pixel wire is made of the same layer as the data wire or the conductive layer.

5. The thin film transistor array panel of claim 1, wherein the conductive layer is made of a transparent material.

6. The thin film transistor array panel of claim 1, further comprising an ohmic contact layer pattern formed between the data wire and the semiconductor pattern and doped with impurity.

7. The thin film transistor array panel of claim 6, wherein the ohmic contact layer pattern has the same shape as the data wire.

8. The thin film transistor array panel of claim 7, wherein the semiconductor pattern, except for a channel portion of a thin film transistor, has the same shape as the data wire.

9. The thin film transistor array panel of claim 1, wherein the semiconductor pattern is extended out from the data wire.

10. The thin film transistor of claim 5, wherein the transparent material is indium-tin-oxide or indium-zinc-oxide.

11. The thin film transistor of claim 1, wherein the conductive layer is connected to the data line through the first contact hole.

* * * * *